US012622035B2

(12) United States Patent
Shin et al.

(10) Patent No.: US 12,622,035 B2
(45) Date of Patent: May 5, 2026

(54) SEMICONDUCTOR DEVICES

(71) Applicant: Samsung Electronics Co., Ltd.,
Suwon-si (KR)

(72) Inventors: Hongsik Shin, Suwon-si (KR);
Sungwoo Kang, Suwon-si (KR);
Dongkwon Kim, Suwon-si (KR);
Hyonwook Ra, Suwon-si (KR);
Jeongyeon Seo, Suwon-si (KR);
Kyungyub Jeon, Suwon-si (KR)

(73) Assignee: **SAMSUNG ELECTRONICS CO.,
LTD.**, Suwon-si (KR)

( * ) Notice: Subject to any disclaimer, the term of this
patent is extended or adjusted under 35
U.S.C. 154(b) by 584 days.

(21) Appl. No.: 18/107,793

(22) Filed: Feb. 9, 2023

(65) Prior Publication Data

US 2023/0352547 A1      Nov. 2, 2023

(30) Foreign Application Priority Data

Apr. 27, 2022      (KR) ........................ 10-2022-0051760

(51) Int. Cl.
| | |
|---|---|
| *H10D 64/23* | (2025.01) |
| *H10D 30/43* | (2025.01) |
| *H10D 30/67* | (2025.01) |
| *H10D 62/10* | (2025.01) |
| *H10D 84/83* | (2025.01) |

(52) U.S. Cl.
CPC ........... *H10D 64/258* (2025.01); *H10D 30/43*
(2025.01); *H10D 30/6735* (2025.01); *H10D*
*62/121* (2025.01); *H10D 84/83* (2025.01)

(58) Field of Classification Search
CPC ........... H10D 30/6219; H10D 84/0149; H10D
84/0142; H10D 64/517
See application file for complete search history.

(56) References Cited

U.S. PATENT DOCUMENTS

| | | | |
|---|---|---|---|
| 9,455,227 | B1 | 9/2016 | Hung et al. |
| 9,496,264 | B2 | 11/2016 | Lee et al. |
| 10,283,406 | B2 | 5/2019 | Basker et al. |
| 10,580,875 | B2 | 3/2020 | Zang et al. |
| | | (Continued) | |

FOREIGN PATENT DOCUMENTS

| | | |
|---|---|---|
| KR | 20200000720 A | 1/2020 |
| KR | 20200026404 A | 3/2020 |
| KR | 20210090768 A | 7/2021 |

*Primary Examiner* — Brian Turner
(74) *Attorney, Agent, or Firm* — Muir Patent Law, PLLC

(57) ABSTRACT

A semiconductor device includes first and second gate
structures, first and second contact plug structures and a first
wiring on a substrate. The first and second source/drain
layers are formed on portions of the substrate adjacent to the
first and second gate structures, respectively. The first and
second contact plug structures are formed on the first and
second source/drain layers, respectively. The first wiring
contacts an upper surface of the first gate structure. The first
gate structure includes a first gate electrode and a first gate
insulation pattern on a lower surface and a sidewall of the
first gate electrode. The second gate structure includes a
second gate electrode and a second gate insulation pattern on
a lower surface and a sidewall of the second gate electrode.
The upper surface of the second gate electrode is lower than
an upper surface of the first gate electrode.

20 Claims, 64 Drawing Sheets

(56)　　　　　References Cited

U.S. PATENT DOCUMENTS

| | | | |
|---|---|---|---|
| 10,763,335 | B2 | 9/2020 | Chung et al. |
| 10,923,475 | B2 | 2/2021 | Shin et al. |
| 11,195,927 | B2 | 12/2021 | Chung et al. |
| 11,264,386 | B2 | 3/2022 | Shin et al. |
| 2016/0190239 | A1* | 6/2016 | Suk ..................... H10D 64/665 |
| | | | 257/351 |
| 2019/0067444 | A1* | 2/2019 | Ching ................. H10D 84/017 |
| 2019/0148374 | A1* | 5/2019 | Bae ................... H10D 84/0135 |
| | | | 257/401 |
| 2020/0006065 | A1* | 1/2020 | Kao ................ H01L 21/02532 |
| 2020/0035605 | A1* | 1/2020 | Tsai .................. H01L 23/5384 |
| 2021/0193816 | A1* | 6/2021 | Chu ................. H10D 84/0193 |
| 2021/0217861 | A1 | 7/2021 | Song et al. |
| 2021/0257248 | A1 | 8/2021 | Chang et al. |
| 2022/0077295 | A1 | 3/2022 | Chung et al. |
| 2022/0238522 | A1* | 7/2022 | Lai ................... H10D 30/6219 |

* cited by examiner

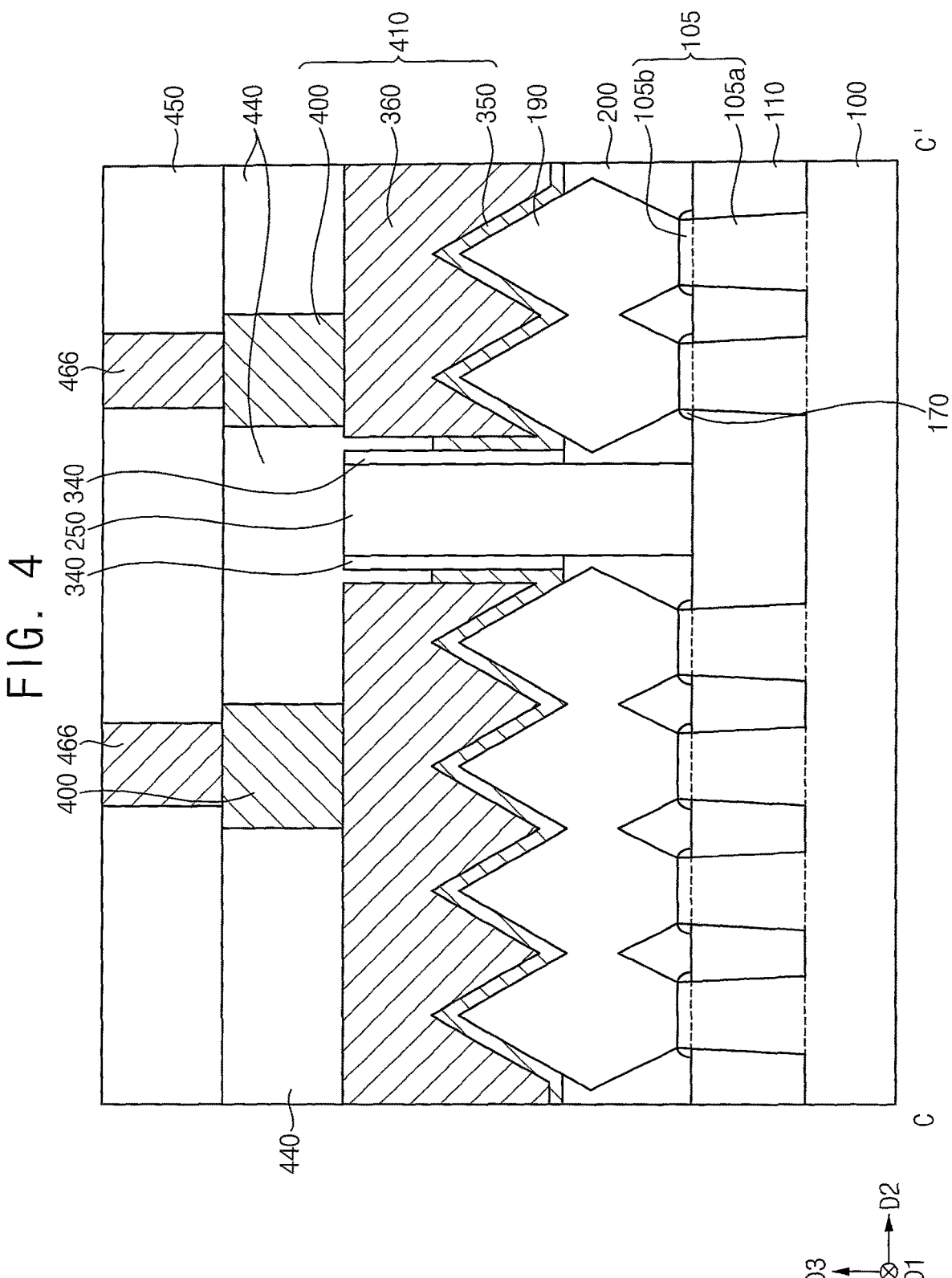
F I G. 4

Figure 29:
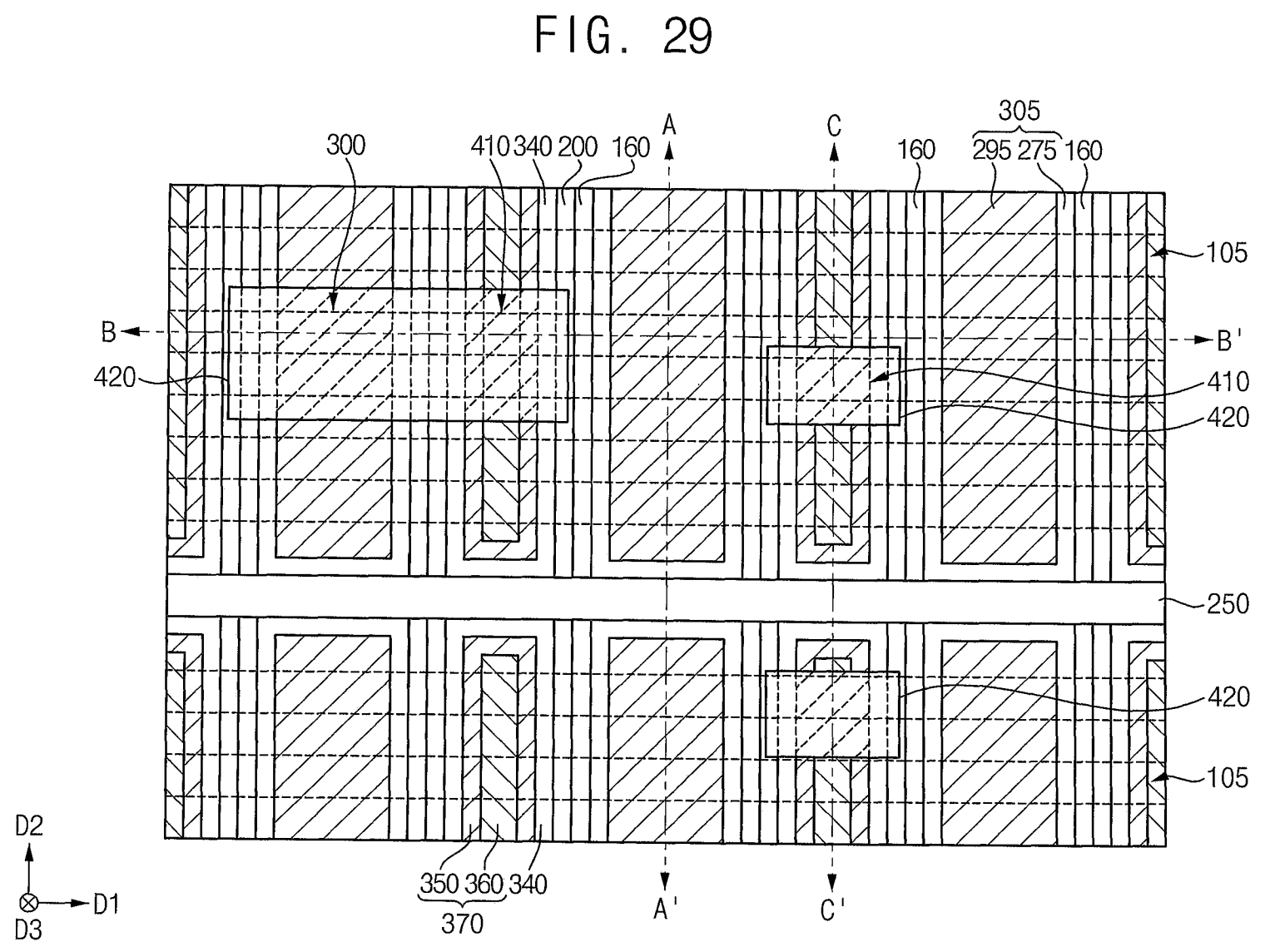

Figure 32:
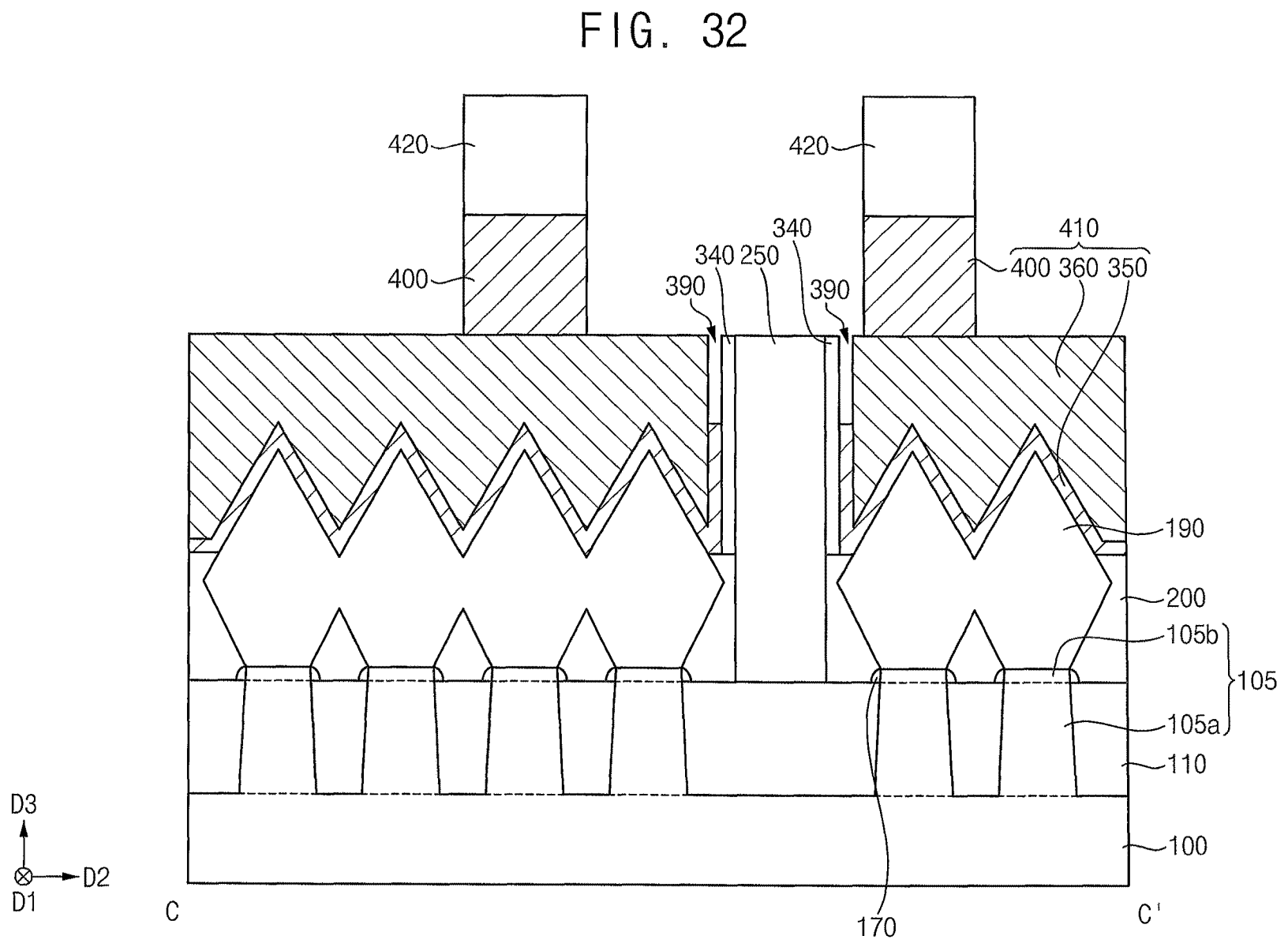

F I G. 50
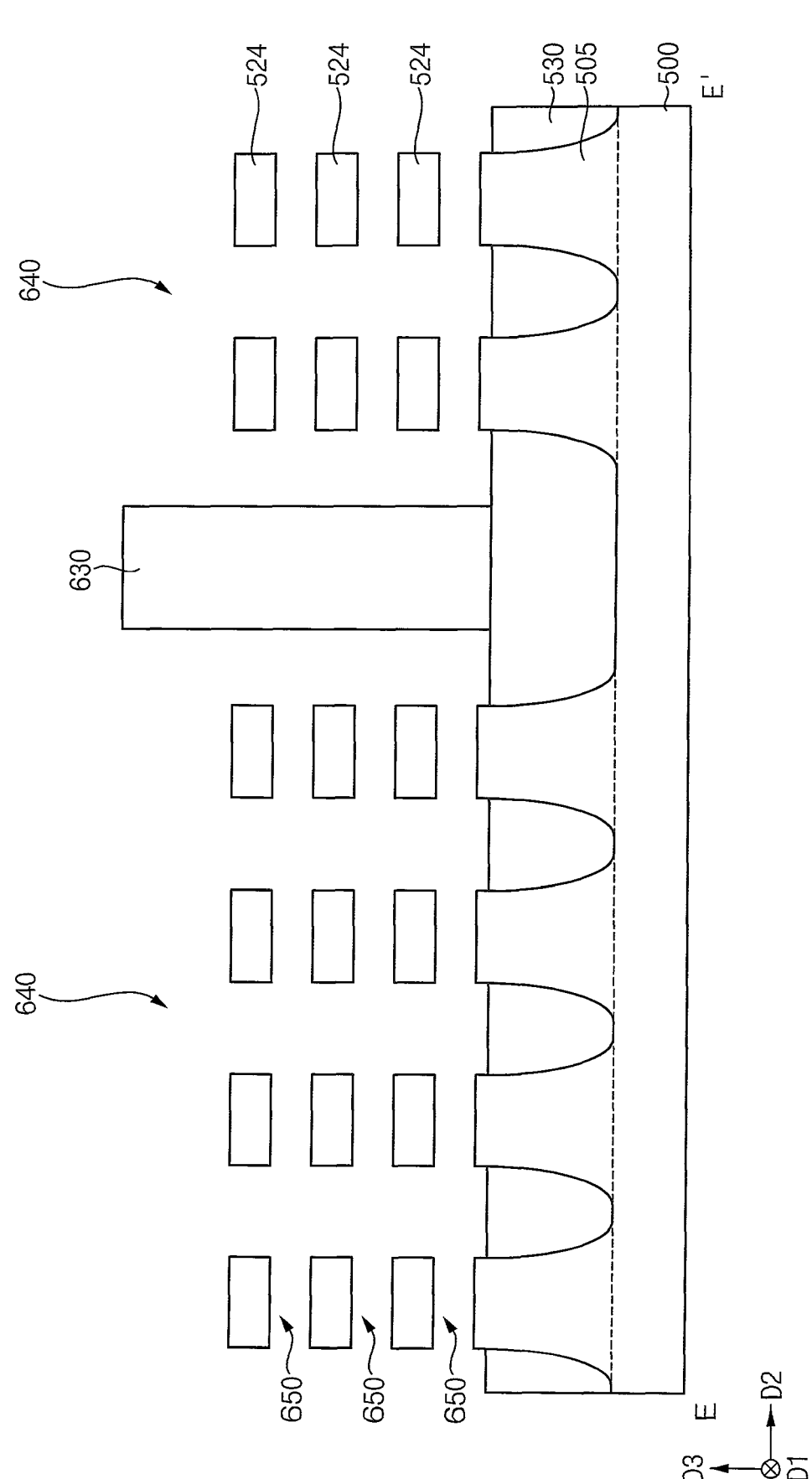

F I G. 61
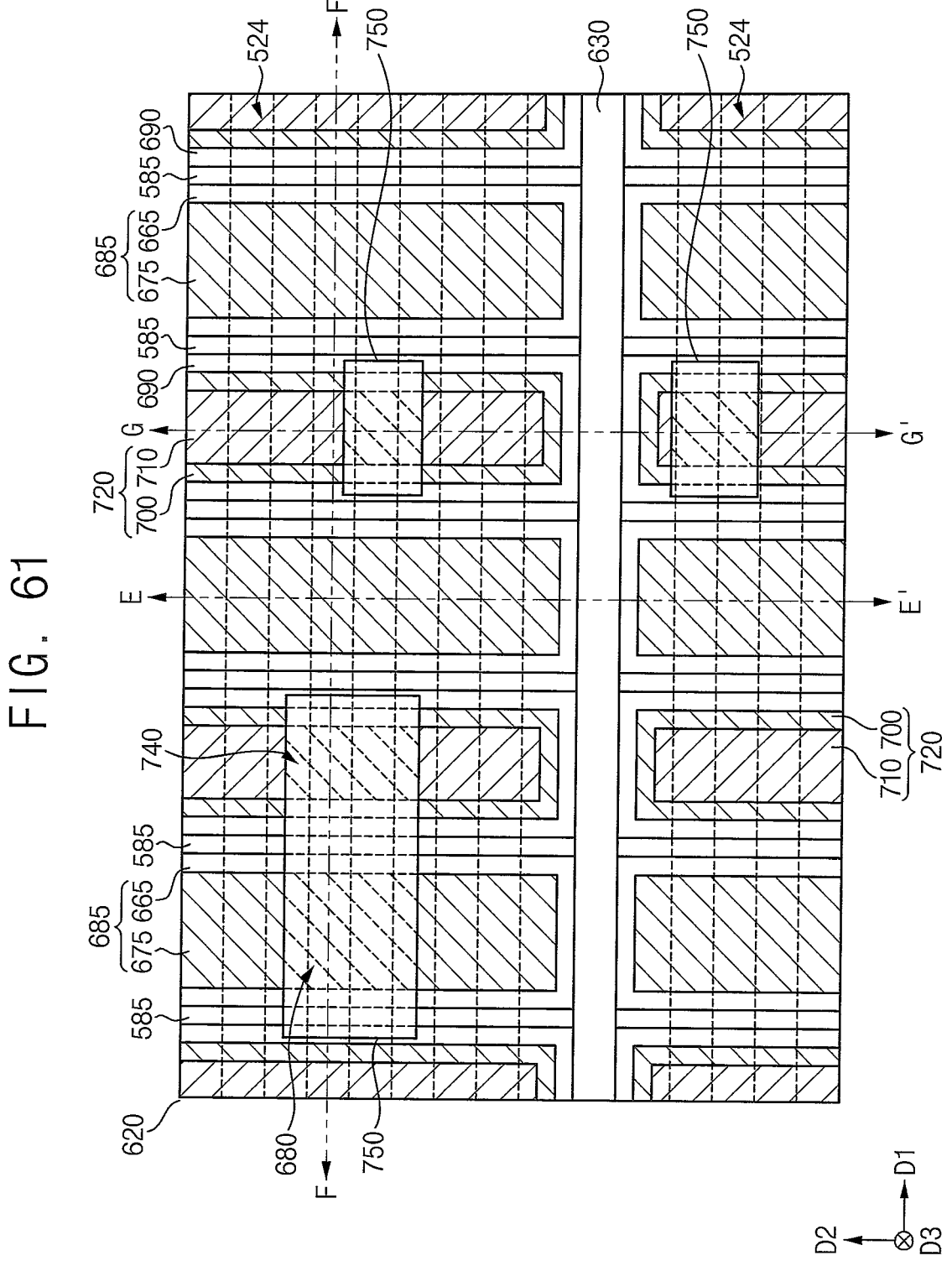

SEMICONDUCTOR DEVICES

CROSS-REFERENCE TO RELATED APPLICATION

This application claims priority under 35 USC § 119 to Korean Patent Application No. 10-2022-0051760, filed on Apr. 27, 2022 in the Korean Intellectual Property Office (KIPO), the contents of which are herein incorporated by reference in their entirety.

BACKGROUND

1. Field

Example embodiments relate to semiconductor devices. More particularly, example embodiments relate to semiconductor devices having contact plugs.

2. Description of the Related Art

In a logic device, a contact plug and a via structure may be formed to connect a gate structure and a source/drain layer to upper wirings for applying electrical signals thereto. However, a total resistance of the gate structure, the source/drain layer, the contact plug structure and the via structure increases due to a contact resistance between the gate structure and the contact plug structure or between the source/drain layer and the contact plug structure. Additionally, the gate structure and the contact plug structure may be electrically shorted with each other, or the contact plug structure and the via structure may be electrically shorted with each other.

SUMMARY

Example embodiments provide a semiconductor device having enhanced characteristics.

According to example embodiments, there is provided a semiconductor device. The semiconductor device may include first and second gate structures, first and second contact plug structures, and a first wiring. The first and second gate structures may be formed on a substrate. The first and second source/drain layers may be formed on portions of the substrate adjacent to the first and second gate structures, respectively. The first and second contact plug structures may be formed on the first and second source/drain layers, respectively. The first wiring may contact an upper surface of the first gate structure. The first gate structure may include a first gate electrode and a first gate insulation pattern on a lower surface and a sidewall of the first gate electrode. The second gate structure may include a second gate electrode and a second gate insulation pattern on a lower surface and a sidewall of the second gate electrode. The upper surface of the second gate electrode may be lower than an upper surface of the first gate electrode.

According to example embodiments, there is provided a semiconductor device. The semiconductor device may include a gate structure, first and second source/drain layers, first and second contact plug structures, a first wiring and an insulation pattern. The gate structure may be formed on a substrate. The first and second source/drain layers may be formed on portions of the substrate adjacent to the gate structure. The first and second contact plug structures may be formed on the first and second source/drain layers, respectively. The first wiring may contact an upper surface of the first contact plug structure. The insulation pattern may contact an upper surface of the second contact plug structure. An uppermost surface of the second contact plug structure may be lower than an upper surface of the first contact plug structure.

According to example embodiments, there is provided a semiconductor device. The semiconductor device may include first and second gate structures on a substrate, first and second source/drain layers on portions of the substrate adjacent to the first and second gate structures, respectively, first and second contact plug structures on the first and second source/drain layers, respectively, a first wiring contacting an upper surface of the first gate structure, a second wiring contacting an upper surface of the first contact plug structure, and an insulation pattern contacting an upper surface of the second gate structure and an upper surface of the second contact plug structure. An upper surface of the second gate structure may be lower than an upper surface of the first gate structure, and an upper surface of the second contact plug structure may be lower than an upper surface of the first contact plug structure.

In the semiconductor device in accordance with example embodiments, a total contact resistance between the gate structure or the contact plug structure and the upper wiring may decrease. Additionally, the electrical short between the contact plug structure and the gate structure may decrease.

BRIEF DESCRIPTION OF THE DRAWINGS

FIG. 4 is a cross-sectional view taken along line C-C' of FIG. 1.

FIGS. 5, 8, 11, 14, 18, 21, 26 and 29 are plan views illustrating a method of manufacturing a semiconductor device in accordance with example embodiments; FIGS. 6 and 7 are cross-sectional views taken along lines A-A' and B-B' of FIG. 5, respectively; FIGS. 30, 31, and 32 are cross-sectional views taken along lines A-A', B-B', and C-C' of FIG. 29, respectively.

FIGS. 37, 39, 42, 47, 52, 55, 58 and 61 are plan views illustrating a semiconductor device in accordance with example embodiments.

FIGS. 48 and 50 are cross-sectional views taken along line E-E' of FIG. 47, and FIGS. 49 and 51 are cross-sectional views taken along lines G-G' and F-F' of FIG. 47, respectively; FIGS. 56 and 57 are cross-sectional views taken along lines F-F' and G-G' of FIG. 55, respectively; FIGS. 59 and 60 are cross-sectional views taken along lines F-F' and G-G' of FIG. 58, respectively.

DESCRIPTION OF EMBODIMENTS

A semiconductor device and a method of manufacturing the same in accordance with example embodiments will be described more fully hereinafter with reference to the accompanying drawings. Hereinafter in the specifications (and not necessarily in the claims), two directions substantially parallel to an upper surface of a substrate and crossing each other may be referred to as first and second directions D1 and D2, respectively, and a direction substantially perpendicular to the upper surface of the substrate may be referred to as a third direction D3. In example embodiments, the first and second directions D1 and D2 may be substantially perpendicular to each other.

Figure 1:
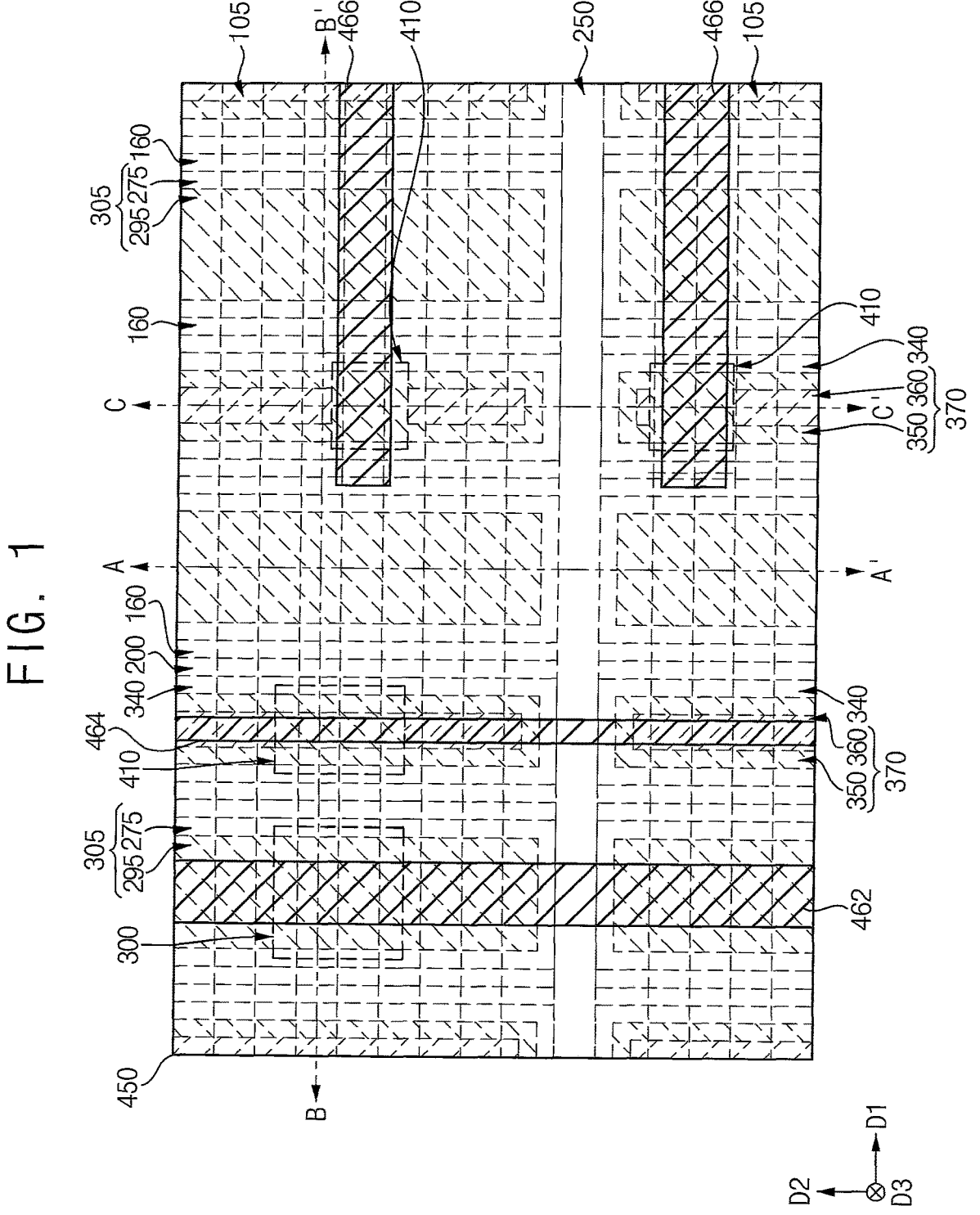
FIG. 1 is a plan view illustrating a semiconductor device in accordance with example embodiments.
Figure 2:
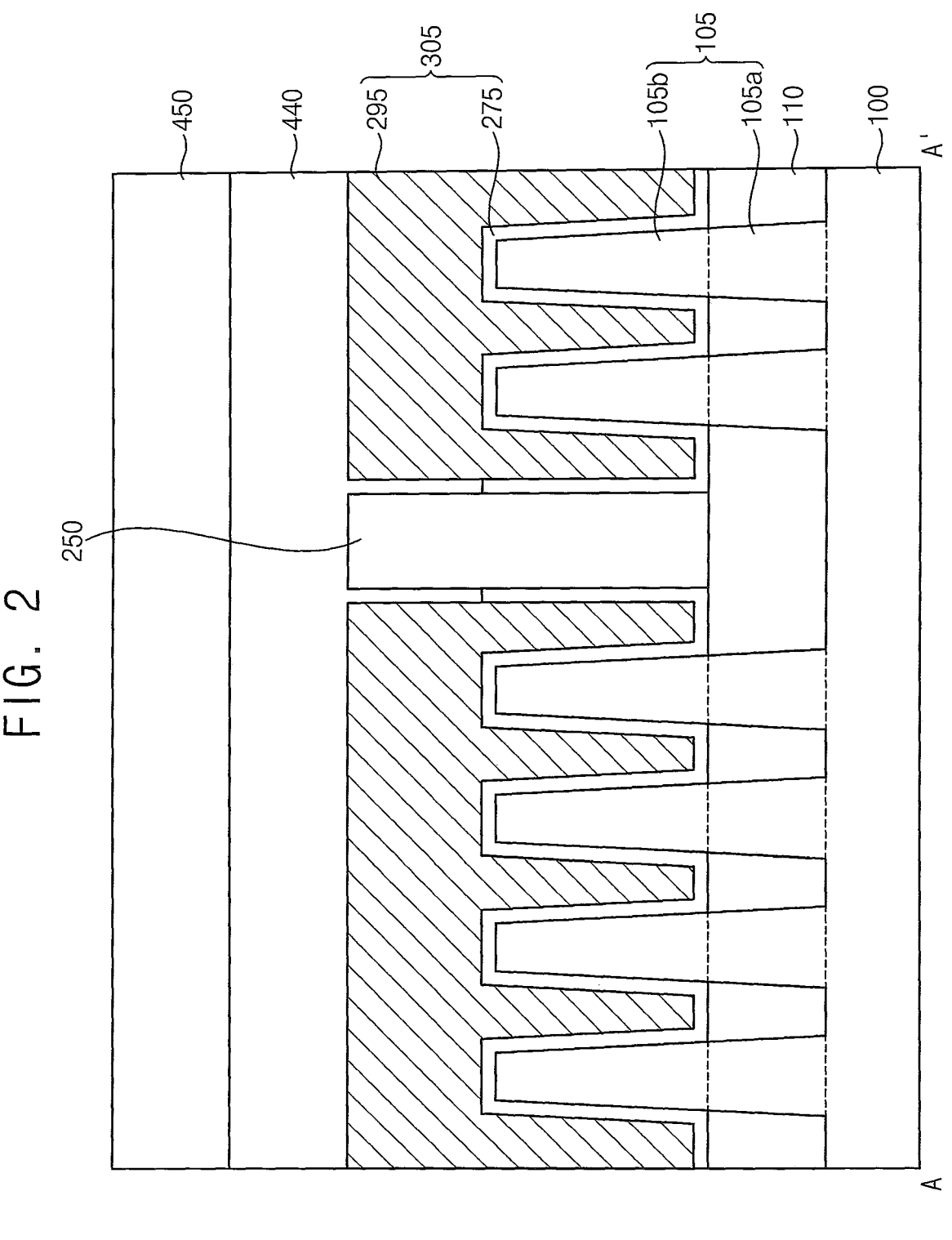
FIG. 2 is a cross-sectional view taken along line A-A' of FIG. 1.
Figure 3:
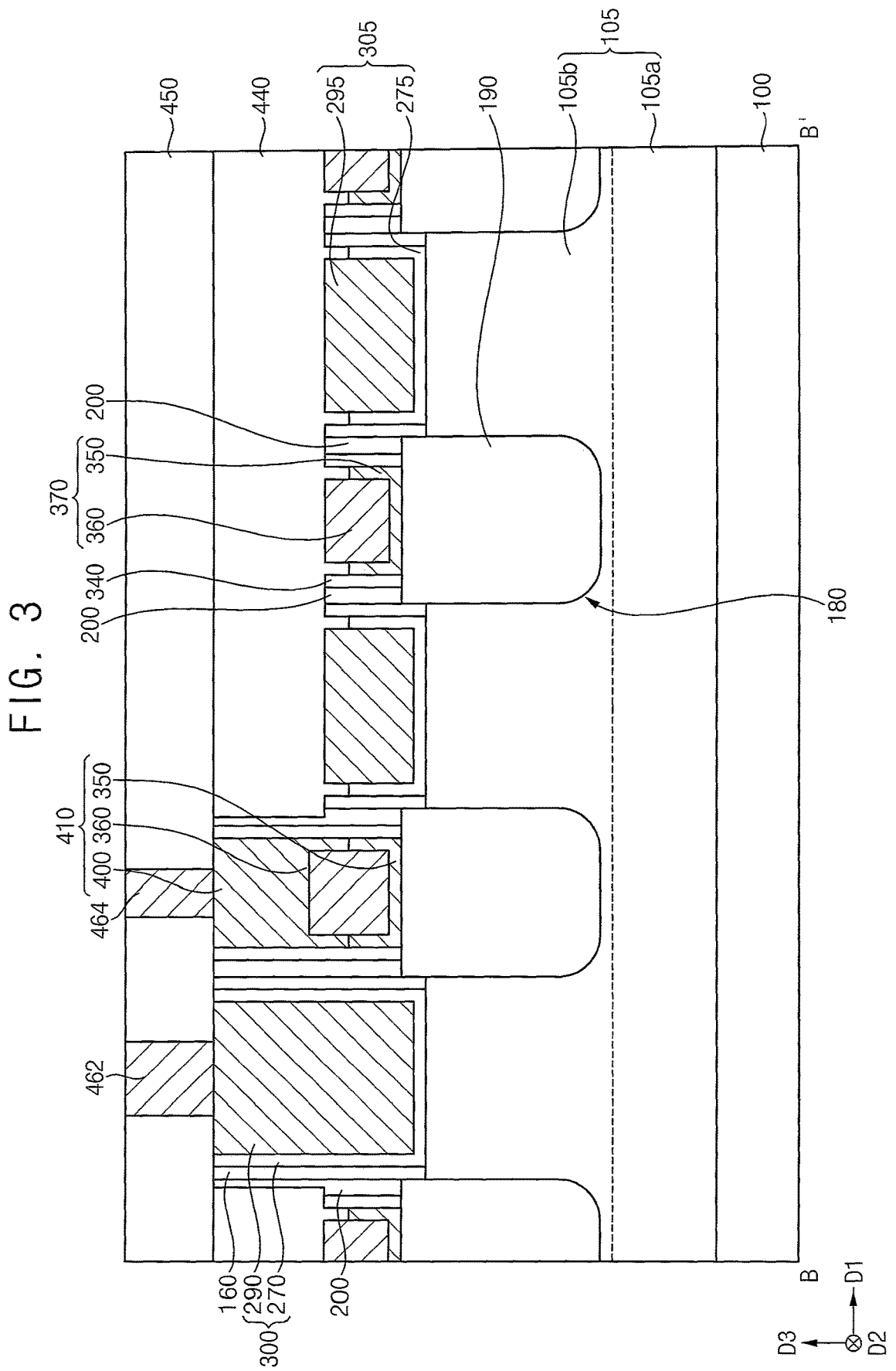
FIG. 3 is a cross-sectional view taken along line B-B' of FIG. 1.

FIGS. 1 to 4 are a plan view and cross-sectional views illustrating a semiconductor device in accordance with example embodiments. Particularly, FIG. 1 is the plan view, FIG. 2 is a cross-sectional view taken along line A-A' of FIG. 1, FIG. 3 is a cross-sectional view taken along line B-B' of FIG. 1, and FIG. 4 is a cross-sectional view taken along line C-C' of FIG. 1.

Referring to FIGS. 1 to 4, the semiconductor device may include a first active pattern 105, a first isolation pattern 110, first and second gate structures 300 and 305, a first source/drain layer 190, a first gate spacer 160, a fin spacer 170, first and second contact plug structures 370 and 410, a first plug spacer 340, a first division pattern 250, first, third and fourth insulating interlayers 200, 440 and 450, and first to third wirings 462, 464 and 466 on a substrate 100.

The substrate 100 may include or may be formed of a semiconductor material, e.g., silicon, germanium, silicon-germanium, etc., or III-V semiconductor compounds, e.g., GaP, GaAs, GaSb, etc. In some embodiments, the substrate 100 may include or may be a silicon-on-insulator (SOI) substrate or a germanium-on-insulator (GOI) substrate.

The first active pattern 105 may have a fin-like shape protruding from an upper surface of the substrate 100, and thus may also be referred to as a first active fin. A lower surface of the first active pattern 105 may be covered by the first isolation pattern 110. The substrate 100 may include a field region on which the first isolation pattern 110 is formed and an active region on which the first active pattern 105 is formed. The present invention is not limited thereto. In an embodiment, the first active pattern 105 may be epitaxially formed at the upper surface of the substrate 100.

The first active pattern 105 may include a first lower active pattern 105*a* of which a sidewall is covered by the first isolation pattern 110 and a first upper active pattern 105*b* of which a sidewall is not covered by the first isolation pattern 110. In example embodiments, the first active pattern 105 may extend in the first direction D1, and a plurality of first active patterns 105 may be spaced apart from each other in the second direction D2.

The first active pattern 105 may include or may be formed of a material substantially the same as that of the substrate

100, and the first isolation pattern 110 may include or may be formed of oxide, e.g., silicon oxide. Terms such as "same," "equal," "planar," or "coplanar," as used herein encompass near identicality including variations that may occur, for example, due to manufacturing processes. The term "substantially" may be used herein to emphasize this meaning, unless the context or other statements indicate otherwise.

In example embodiments, the second gate structure 305 may extend in the second direction D2 on the first active pattern 105 and the first isolation pattern 110, and a plurality of second gate structures 305 may be spaced apart from each other in the first direction D1. FIGS. 1 to 4 show three second gate structures 305 spaced apart from each other in the first direction D1, however, the inventive concept may not be limited thereto.

In example embodiments, the second gate structure 305 may include a second gate insulation pattern 275 on the first active pattern 105 and the first isolation pattern 110 and a second gate electrode 295 on the second gate insulation pattern 275. The second gate insulation pattern 275 may cover a lower surface and at least a lower sidewall of the second gate electrode 295.

In some embodiments, the second gate structure 305 may further include an interface pattern between the second gate insulation pattern 275 and the first active pattern 105 and/or the first isolation pattern 110, which may include or may be formed of oxide, e.g., silicon oxide.

The second gate insulation pattern 275 may include or may be formed of a metal oxide having a high dielectric constant material, e.g., hafnium oxide, tantalum oxide, zirconium oxide, etc.

In an example embodiment, the second gate electrode 295 may include a first barrier pattern, a first conductive pattern and a second conductive pattern sequentially stacked. The first barrier pattern may include or may be formed of a metal nitride, e.g., titanium nitride, titanium aluminum nitride, tantalum nitride, tantalum aluminum nitride, etc. The first conductive pattern may include or may be formed of, a metal alloy, e.g., titanium aluminum, titanium aluminum carbide, titanium aluminum oxynitride, titanium aluminum carbonitride, titanium aluminum oxycarbonitride, etc., a metal carbide, a metal oxynitride, a metal carbonitride or a metal oxycarbonitride, and the second conductive pattern may include or may be formed of a low resistance metal, e.g., tungsten, aluminum, copper, tantalum, etc.

In example embodiments, an uppermost surface of the second gate insulation pattern 275 may be lower than an upper surface of the second gate electrode 295. Thus, an upper portion of each of opposite sidewalls in the first direction D1 of the second gate electrode 295 may not be covered by the second gate insulation pattern 275, and the second gate insulation pattern 275 may cover a lower portion of each of opposite sidewalls in the first direction D1 of the second gate electrode 295. In this case, the second gate insulation pattern 275 may be disposed between a lower portion of the first gate spacer 160 and a lower portion of the second gate electrode 295, and the third insulating interlayer 440 may be disposed between an upper portion of the first gate spacer 160 and an upper portion of the second gate electrode 295.

In example embodiments, the second gate structure 305 extending in the second direction D2 may be divided, in the second direction D2, into individualized second gate structures by the first division pattern 250. An upper portion of a sidewall in the second direction D2 of the second gate electrode 295 at a portion of the second gate structure 305 contacting the first division pattern 250, that is, an end portion of the second gate structure 305 in the second direction D2 may not be covered by the second gate insulation pattern 275, and the second gate insulation pattern 275 may cover a lower portion of the sidewall in the second direction D2 of the second gate electrode 295. In this case, the second gate insulation pattern 275 may be disposed between a lower portion of the second gate electrode 295 and a lower portion of the first division pattern 250, and the third insulating interlayer 440 may be disposed between an upper portion of the second gate electrode 295 and an upper portion of the first division pattern 250.

In example embodiments, the first division pattern 250 may extend in the first direction D1, and may include or may be formed of an insulating nitride, e.g., silicon nitride, silicon oxynitride, silicon oxycarbonitride, etc.

The first gate spacer 160 may be formed on each of opposite sidewalls in the first direction D1 of the second gate structure 305. In example embodiments, an upper surface of the first gate spacer 160 may be substantially coplanar with the upper surface of the second gate electrode 295, and thus may be higher than the uppermost surface of the second gate insulation pattern 275.

The fin spacer 170 may be formed on each of opposite sidewalls in the second direction D2 of the first active pattern 105.

The first gate spacer 160 and the fin spacer 170 may include or may be formed of an insulating nitride, e.g., silicon nitride, silicon oxynitride, silicon oxycarbonitride, etc.

In example embodiments, a first gate electrode 290 and a first gate insulation pattern 270, instead of the second gate electrode 295 and the second gate insulation pattern 275, may be formed at a portion of the second gate structure 305 extending in the second direction D2, and may form a first gate structure 300.

The first gate electrode 290 and the first gate insulation pattern 270 may include or may be formed of materials substantially the same as those of the second gate electrode 295 and the second gate insulation pattern 275, respectively, however, the shapes of the first gate electrode 290 and the first gate insulation pattern 270 may be different from those of the second gate electrode 295 and the second gate insulation pattern 275, respectively.

In example embodiments, an upper surface of the first gate structure 300 may be higher than an upper surface of the second gate structure 305. That is, an upper surface of the first gate electrode 290 may be higher than the upper surface of the second gate electrode 295, and an uppermost surface of the first gate insulation pattern 270 may be higher than the uppermost surface of the second gate insulation pattern 275. In example embodiments, the uppermost surface of the first gate insulation pattern 270 may be substantially coplanar with an uppermost surface of the first gate electrode 290.

FIG. 3 shows that an uppermost surface of a portion of the first gate spacer 160 on each of opposite sidewalls in the first direction D1 of the first gate structure 300 is substantially coplanar with the upper surface of the first gate structure 300, however, the inventive concept may not be limited thereto, and in some embodiments, the uppermost surface of a portion of the first gate spacer 160 on each of opposite sidewalls in the first direction D1 of the first gate structure 300 may be substantially coplanar with the upper surface of the second gate structure 305, like a portion of the first gate spacer 160 on each of opposite sidewalls in the first direction D1 of the second gate structure 305.

FIG. 1 shows that the first gate structure 300 is formed at a portion of the second gate structure 305 extending in the second direction D2, however, the inventive concept may not be limited thereto. For example, the first gate structure 300 may be formed to be spaced apart from the second gate structure 305 in the first direction D1, and may extend in the second direction D2.

The first source/drain layer 190 may be formed in a first recess 180 on a portion of the first active pattern 105 at each of opposite sides in the first direction D1 of the second gate structure 305 or the first gate structure 300, and may contact a lower sidewall of the first gate spacer 160. In example embodiments, the first source/drain layer 190 may have a cross-section taken along the second direction D2, which may have a pentagon-like shape. The term "contact," as used herein, refers to a direct connection (i.e., touching) unless the context indicates otherwise.

In example embodiments, if a distance between ones of the first active patterns 105 neighboring in the second direction D2 is small, the first source/drain layers 190 on the neighboring ones of the first active patterns 105, respectively, may be partially merged with each other. FIG. 4 shows that four first source/drain layers 190 neighboring in the second direction D2 are merged with each other, and two first source/drain layers 190 neighboring in the second direction D2 are merged with each other, however, the inventive concept may not be limited thereto.

In an example embodiment, the first source/drain layer 190 may include or may be formed of single crystalline silicon-germanium doped with p-type impurities, and may serve as a source/drain of a p-type metal oxide semiconductor (PMOS) transistor. In an embodiment, the first source/drain layer 190 may include or may be formed of single crystalline silicon carbide doped with n-type impurities or single crystalline silicon doped with n-type impurities, and may serve as a source/drain of an n-type metal oxide semiconductor (NMOS) transistor.

The first source/drain layer 190 may be covered by the first insulating interlayer 200. The first insulating interlayer 200 may include or may be formed of oxide, e.g., silicon oxide, or a nitride, e.g., silicon nitride.

The first contact plug structure 370 may extend through the first insulating interlayer 200 to contact an upper surface of the first source/drain layer 190, and the first plug spacer 340 may be formed on a sidewall of the first contact plug structure 370.

In an example embodiment, the first plug spacer 340 may extend through the first insulating interlayer 200 to contact an outer sidewall of the first gate spacer 160. In an embodiment, the first plug spacer 340 may extend through the first insulating interlayer 200, however, may not contact the outer sidewall of the first gate spacer 160. Thus, the first insulating interlayer 200 may be interposed between the first gate spacer 160 and the first plug spacer 340. FIG. 4 shows that the first plug spacer 340 does not contact the outer sidewall of the first gate spacer 160, however, the inventive concept may not be limited thereto.

The first plug spacer 340 may include or may be formed of a nitride, e.g., silicon nitride, silicon oxynitride, silicon oxycarbonitride, etc.

In example embodiments, the first contact plug structure 370 may include a third conductive pattern 360 on the first source/drain layer 190 and the first insulating interlayer 200, and a second barrier pattern 350 covering a lower surface and at least a lower portion of a sidewall of the third conductive pattern 360.

In example embodiments, the third conductive pattern 360 may include or may be formed of metal, e.g., molybdenum, cobalt, tungsten, etc., and the second barrier pattern 350 may include or may be formed of a metal nitride, e.g., titanium nitride, tantalum nitride, tungsten nitride, etc.

In example embodiments, an uppermost surface of the second barrier pattern 350 may be lower than an upper surface of the third conductive pattern 360. Thus, an upper portion of each of opposite sidewalls in the first direction D1 of the third conductive pattern 360 may not be covered by the second barrier pattern 350, and the second barrier pattern 350 may cover a lower portion of each of the opposite sidewalls in the first direction D1 of the third conductive pattern 360. In this case, the second barrier pattern 350 may be interposed between a lower portion of the first plug spacer 340 and a lower portion of the third conductive pattern 360, and the third insulating interlayer 440 may be interposed between an upper portion of the first plug spacer 340 and an upper portion of the third conductive pattern 360.

In example embodiments, the first division pattern 250 may extend in the first direction D1 between the first contact plug structures 370 each of which may extend in the second direction D2. A portion of the first contact plug structure 370 adjacent to the first division pattern 250, that is, an upper portion of a sidewall in the second direction D2 of the third conductive pattern 360 at an end portion of the first contact plug structure 370 in the second direction D2 may not be covered by the second barrier pattern 350, and the second barrier pattern 350 may cover a lower portion of the sidewall in the second direction D2 of the third conductive pattern 360. In this case, the second barrier pattern 350 may be interposed between the lower portion of the first plug spacer 340 and the lower portion of the third conductive pattern 360, and the third insulating interlayer 440 may be interposed between the upper portion of the first plug spacer 340 and the upper portion of the third conductive pattern 360.

In example embodiments, an upper surface of the first plug spacer 340 may be substantially coplanar with an upper surface of the third conductive pattern 360, and may be higher than an uppermost surface of the second barrier pattern 350.

In example embodiments, a fourth conductive pattern 400 may be further formed on the third conductive pattern 360 and the second barrier pattern 350 on a portion of the first contact plug structure 370 extending in the second direction D2, and the third conductive pattern 360, the second barrier pattern 350 and the fourth conductive pattern 400 may form a second contact plug structure 410.

The fourth conductive pattern 400 may include or may be formed of metal, e.g., tungsten, copper, aluminum, etc. In example embodiments, the fourth conductive pattern 400 may include or may be formed of metal different from metal of the fourth conductive pattern 400. The uppermost surface of the second barrier pattern 350 is lower than the upper surface of the third conductive pattern 360, and thus the fourth conductive pattern 400 on the third conductive pattern 360 and the second barrier pattern 350 may cover an upper sidewall of the third conductive pattern 360 as well as the upper surface of the third conductive pattern 360.

In example embodiments, the second contact plug structure 410 may further include the fourth conductive pattern 400, and thus an upper surface of the second contact plug structure 410 may be higher than an upper surface of the first contact plug structure 370. An upper surface of the third conductive pattern 360 included in the second contact plug structure 410 may be slightly higher than an upper surface of the third conductive pattern 360 included in the first contact plug structure 370.

FIG. 3 shows that an uppermost surface of a portion of the first plug spacer 340 on each of opposite sidewalls in the first direction D1 of the second contact plug structure 410 is substantially coplanar with the upper surface of the second contact plug structure 410, however, the inventive concept may not be limited thereto. Like the uppermost surface of the portion of the first plug spacer 340 on each of opposite sidewalls in the first direction D1 of the first contact plug structure 370, the uppermost surface of the portion of the first plug spacer 340 on each of opposite sidewalls in the first direction D1 of the second contact plug structure 410 may be substantially coplanar with the upper surface of the first contact plug structure 370.

FIG. 3 shows that the fourth conductive pattern 400 is formed on a portion of the first contact plug structure 370 extending in the second direction D2 to form the second contact plug structure 410, however, the inventive concept may not be limited thereto. Thus, the second contact plug structure 410 may be spaced apart from the first contact plug structure 370 in the first direction D1, and extend in the second direction D2.

The third insulating interlayer 440 may be formed on the first insulating interlayer 200 to contact upper surfaces of the second gate structure 305, the first contact plug structure 370, the first gate spacer 160 and the first plug spacer 340.

The fourth insulating interlayer 450 may be formed on the third insulating interlayer 440, the first gate structure 300, the second contact plug structure 410, the first gate spacer 160 and the first plug spacer 340. The third and fourth insulating interlayers 440 and 450 may include or may be formed of an insulating material, e.g., silicon oxycarbide, silicon oxide, silicon nitride, silicon oxynitride, silicon carbonitride, silicon oxycarbonitride, etc.

Each of the first to third wirings 462, 464 and 466 may extend through the fourth insulating interlayer 450. The first wiring 462 may contact the upper surface of the first gate structure 300, and each of the second and third wirings 464 and 466 may contact the upper surface of the second contact plug structure 410.

In an example embodiment, each of the first and second wirings 462 and 464 may extend in the second direction D2, and the third wiring 466 may extend in the first direction D1. However, the inventive concept may not be limited thereto, and the first to third wirings 462, 464 and 466 may have various layouts.

Each of the first to third wirings 462, 464 and 466 may include or may be formed of, e.g., metal, a metal nitride, a metal silicide, etc.

The semiconductor device may be a fin-type field effect transistor (finFET) including the first and second gate structures 300 and 305 on the first active pattern 105, and the first source/drain layers 190 on portions of the first active patterns 105 adjacent to the first and second gate structures 300 and 305, respectively. The semiconductor device may include the first and second contact plug structures 370 and 410 on the first source/drain layers 190. The first gate structure 300 and the second contact plug structure 410, which may contact the first to third wirings 462, 464 and 466, may have upper surfaces higher than those of the second gate structure 305 and the first contact plug structure 370, respectively, which may not be connected to the first to third wirings 462, 464 and 466.

Thus, for example, no contact plug or no via may be formed between the first gate structure 300 and the first wiring 462, and no via may be formed between the second contact plug structure 410 and each of the second and third wirings 464 and 466. Thus, a total contact resistance between the first wiring 462 and the first gate structure 300, and a total contact resistance between each of the second and third wirings 464 and 466 and the second contact plug structure 410 may decrease. For example, an upper surface of the first gate structure 300 may be elevated above an upper surface of the second gate structure 305, such that the first wiring 462 contacts the upper surface of the first gate structure 300 without using a contact plug or a via therebetween. For example, an upper surface of the second contact plug 410 may be elevated above an upper surface of the first contact plug 370, such that the first second wiring 464 contacts the upper surface of the second contact plug 410 without using a via therebetween. In an embodiment, the upper surface of the first gate structure 300 may be coplanar with the upper surface of the second contact plug 410. In an embodiment, the semiconductor device may include a plurality of first source/drain layers 190 connected to contact plugs having upper surfaces at different heights. For example, one of the plurality of first source/drain layers 190 may be connected to (or may contact) the second contact plug 410, and another of the plurality of first source/drain layers 190 may be connected to (or may contact) the first contact plug 370 of which an upper surface is lower than an upper surface of the second contact plug 410.

The second barrier pattern 350 included in the first contact plug structure 370 may not cover an upper sidewall of the third conductive pattern 360, and the second gate insulation pattern 275 included in the second gate structure 305 may not cover an upper sidewall of the second gate electrode 295. Thus, electrical short between the first contact plug structure 370 and the second gate structure 305, between the first contact plug structure 370 and the first gate structure 300, or between the second contact plug structure 410 and the second gate structure 305 may be prevented or reduced.

FIGS. 5 to 32 are plan views and cross-sectional views illustrating a method of manufacturing a semiconductor device in accordance with example embodiments. Particularly, FIGS. 5, 8, 11, 14, 18, 21, 26 and 29 are the plan views, and FIGS. 6-7, 9-10, 12-13, 15-17, 19-20, 22-25, 27-28 and 30-32 are the cross-sectional views.

FIGS. 6, 12, 15 and 30 are cross-sectional views taken along lines A-A' of corresponding plan views, respectively, FIGS. 7, 9, 16-17, 19, 22, 24, 27 and 31 are cross-sectional views taken along lines B-B' of corresponding plan views, respectively, FIGS. 10, 13, 20, 23, 25, 28 and 32 are cross-sectional views taken along lines C-C' of corresponding plan views, respectively.

Figure 5:
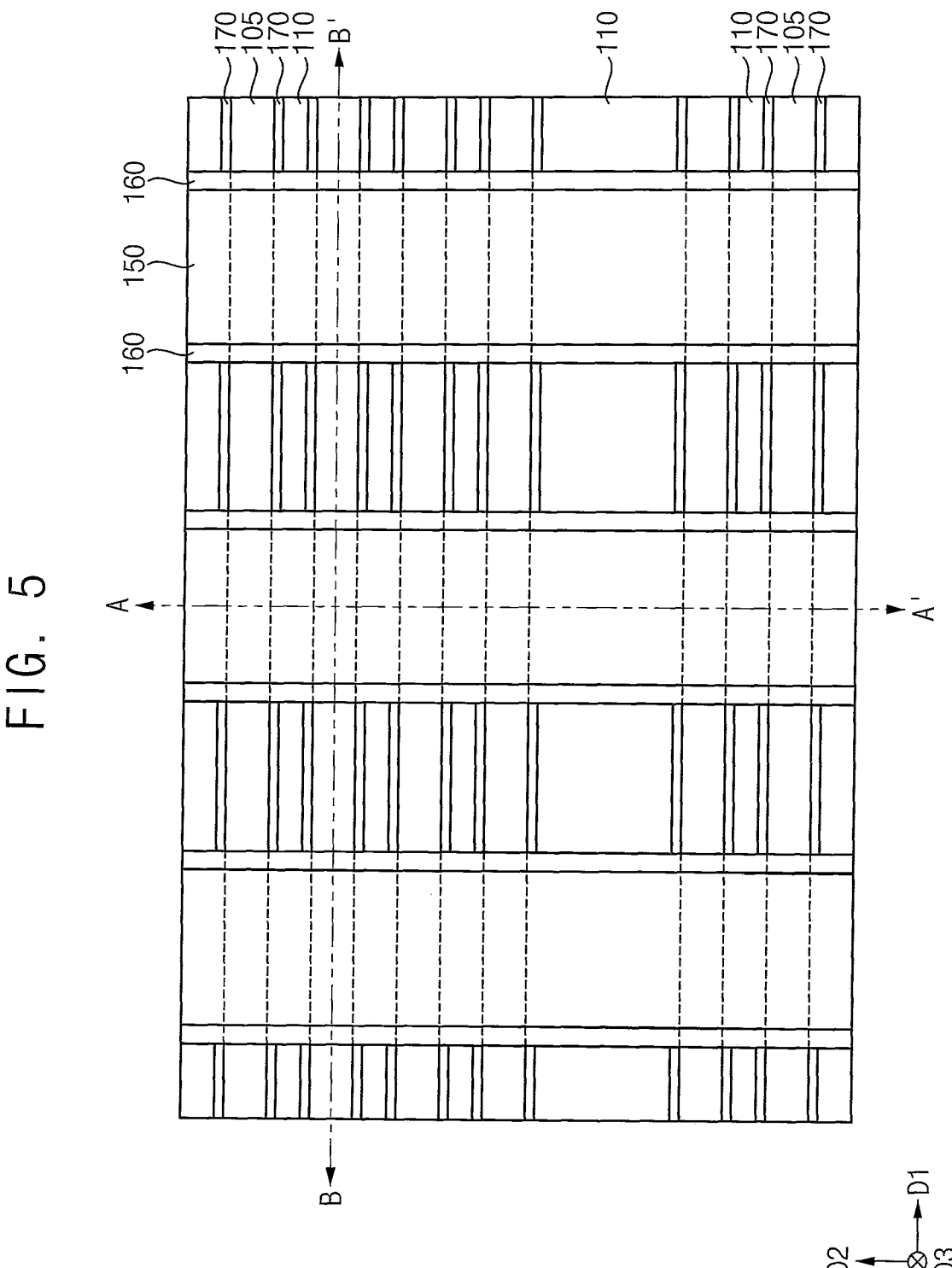
Figure 6:
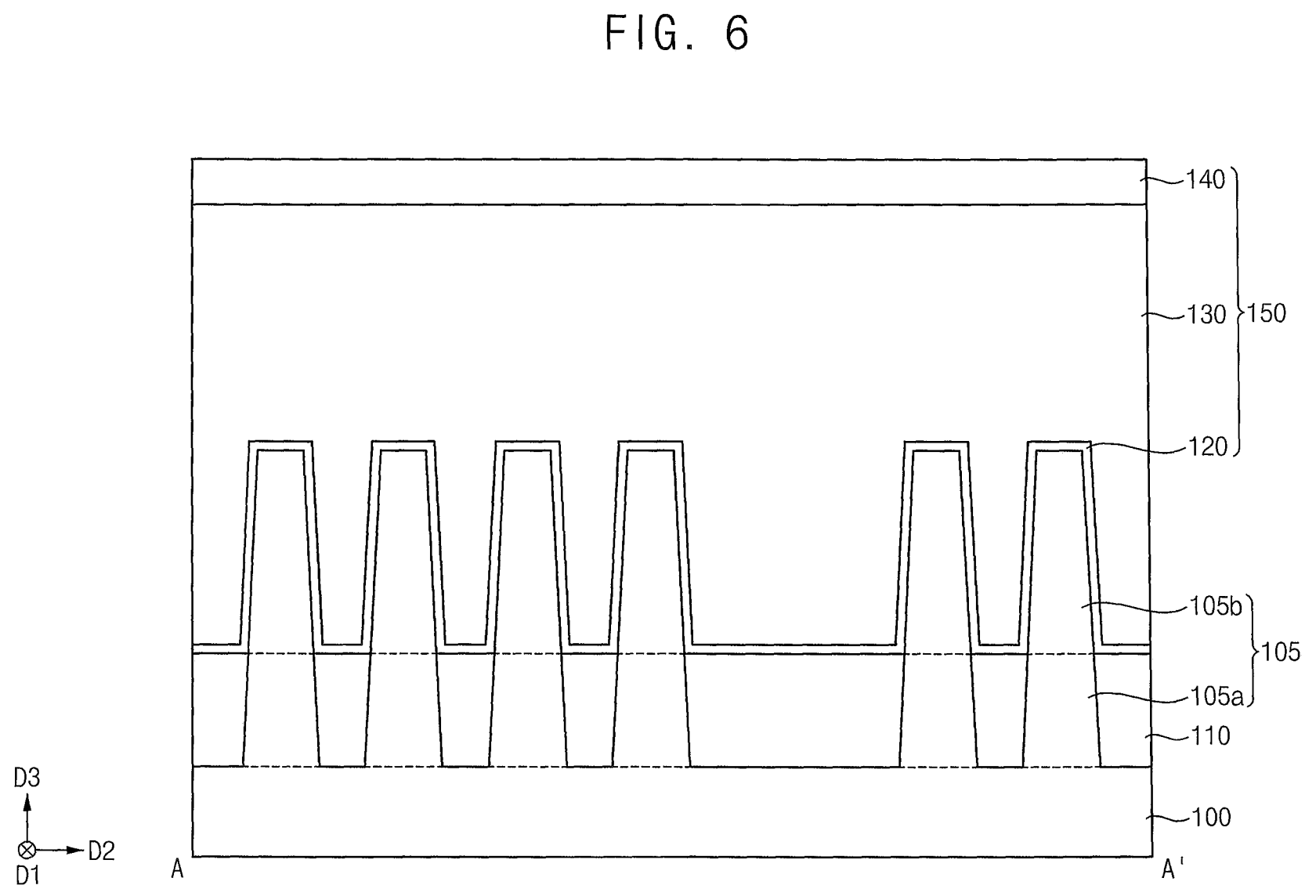
Figure 7:
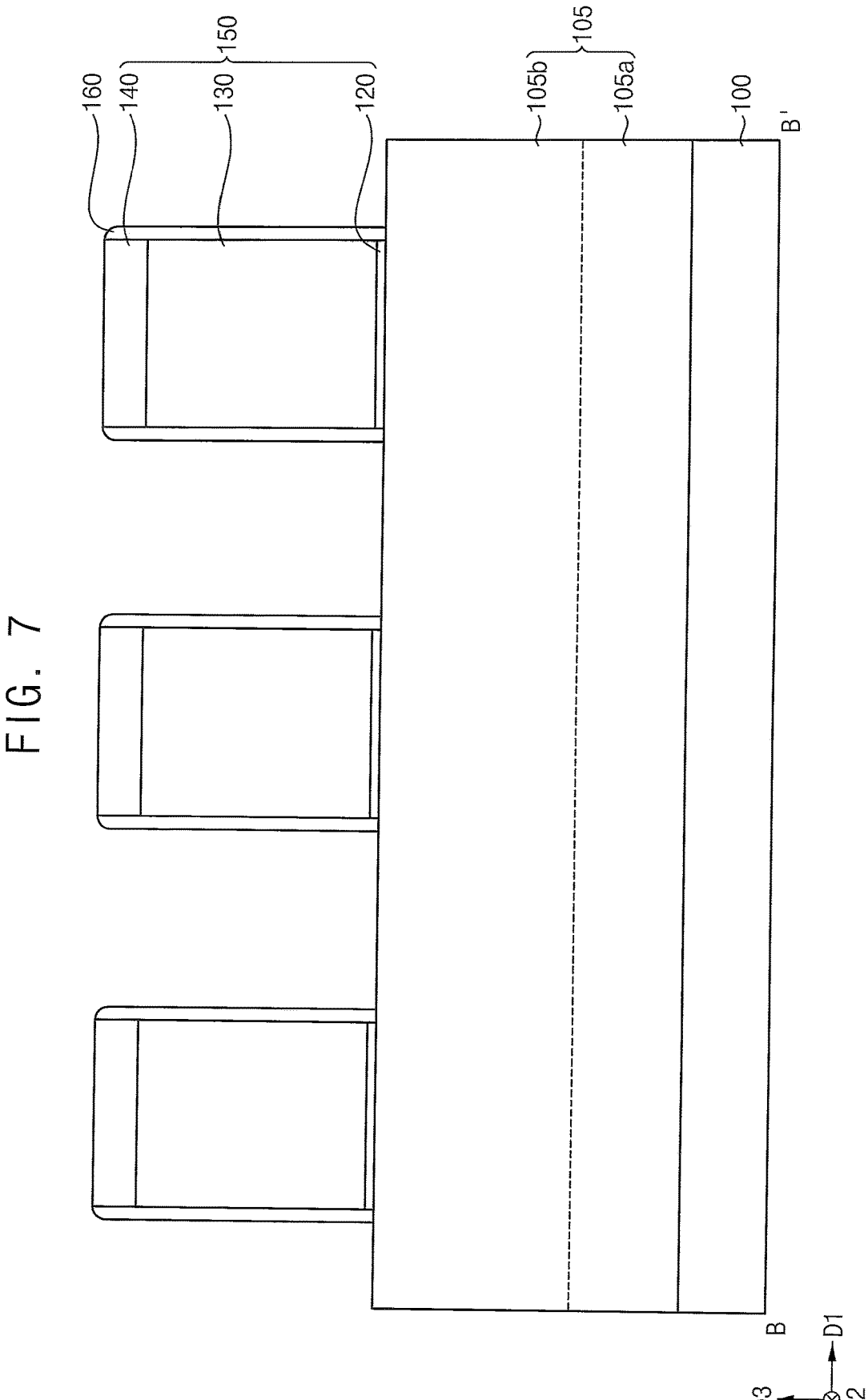

Referring to FIGS. 5 to 7, an upper portion of a substrate 100 may be removed to form a first trench, and a first isolation pattern 110 may be formed in a lower portion of the first trench.

In example embodiments, the first isolation pattern 110 may be formed by forming a first isolation layer on the substrate 100 to fill the first trench, planarizing the first isolation layer until an upper surface of the substrate 100 is exposed, and removing an upper portion of the first isolation layer to expose an upper portion of the first trench. As the first isolation pattern 110 is formed on the substrate 100, a first active pattern 105 may be defined on the substrate 100.

A first dummy gate structure 150 may be formed on the substrate 100 having the first active pattern 105 and the first isolation pattern 110 thereon. The first dummy gate structure 150 may include a first dummy gate insulation pattern 120, a first dummy gate electrode 130 and a first dummy gate mask 140 sequentially stacked. As used herein, the term "dummy" is used to refer to a component that has the same or similar structure and shape as other components but does not have a substantial function and exists only as a pattern in the device.

The first dummy gate insulation pattern 120 may include or may be formed of oxide, e.g., silicon oxide, the first dummy gate electrode 130 may include or may be formed of, e.g., polysilicon, and the first dummy gate mask 140 may include or may be formed of an insulating nitride, e.g., silicon nitride.

In example embodiments, the first dummy gate structure 150 may extend in the second direction D2, and a plurality of first dummy gate structures 150 may be spaced apart from each other in the first direction D1.

A first gate spacer 160 may be formed on each of opposite sidewalls in the first direction D1 of the first dummy gate structure 150, and a fin spacer 170 may be formed on each of opposite sidewalls in the second direction D2 of the first active pattern 105.

The first gate spacer 160 and the fin spacer 170 may be formed by forming a first spacer layer on the substrate 100 having the first active pattern 105, the first isolation pattern 110 and the first dummy gate structure 150 thereon, and anisotropically etching the first spacer layer.

Figure 8:
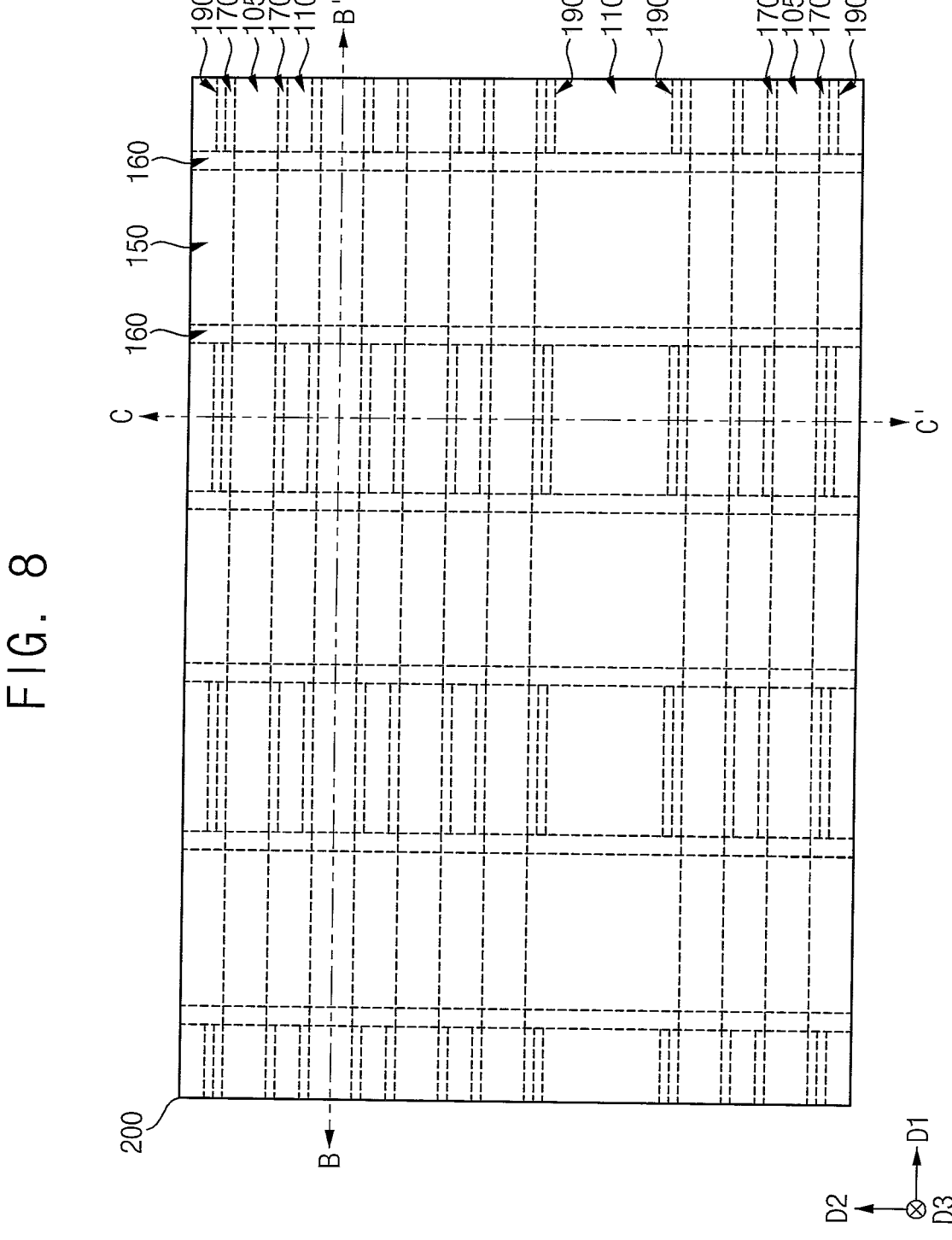
Figure 9:
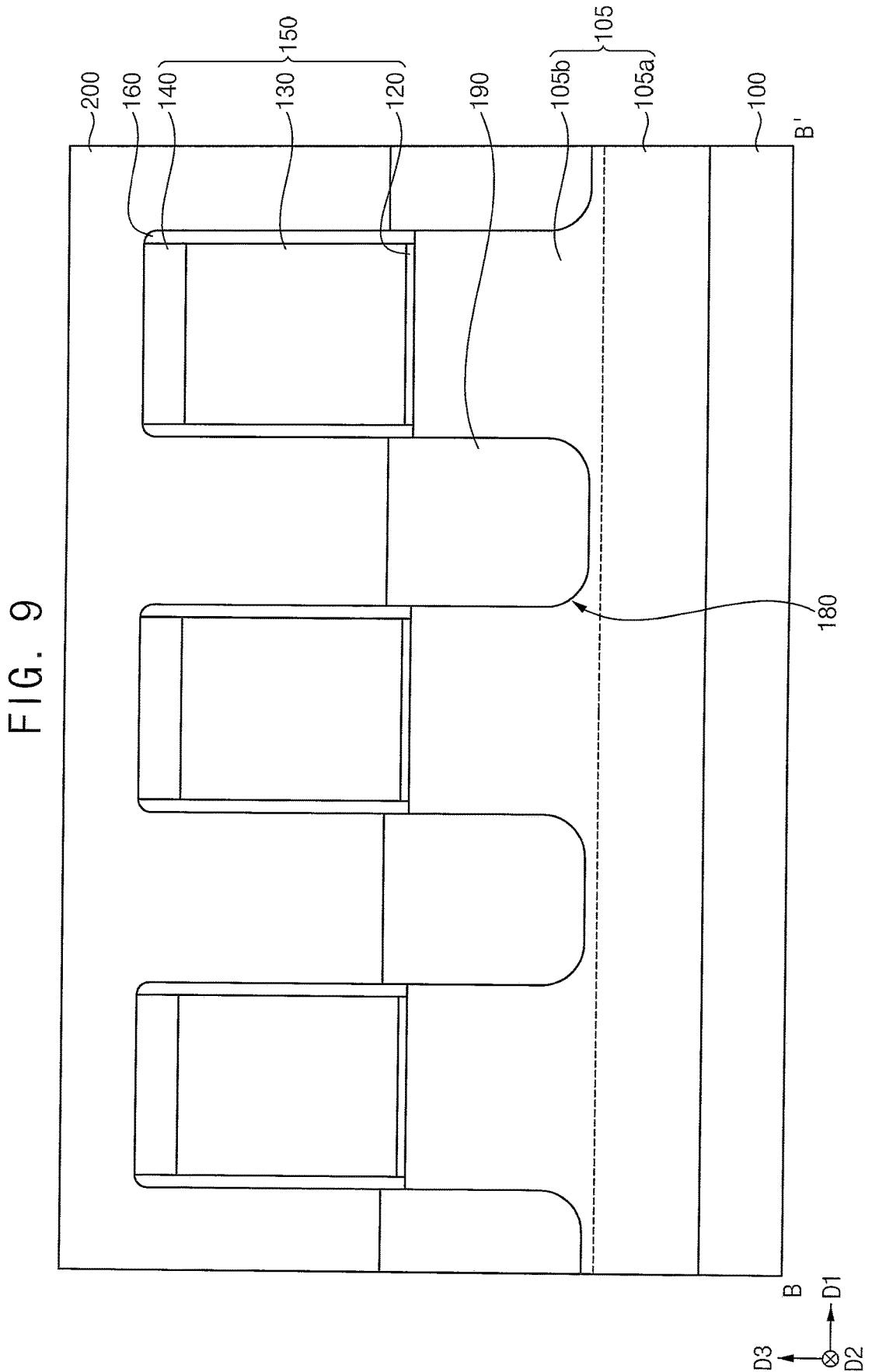
FIGS. 9 and 10 are cross-sectional views taken along lines B-B' and C-C' of FIG. 8, respectively.
Figure 10:
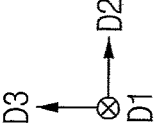

Referring to FIGS. 8 to 10, an upper portion of the first active pattern 105 may be etched using the first dummy gate structure 150 and the first gate spacer 160 as an etching mask to form a first recess 180.

FIG. 9 shows that the first recess 180 is formed by partially removing the first upper active pattern 105$b$, however, the inventive concept may not be limited thereto, and the first recess 180 may be formed by partially removing the first lower active pattern 105$a$ as well as the first upper active pattern 105$b$.

The anisotropic etching process of the first spacer layer and the partial etching process for forming the first recess 180 may be performed in-situ.

A selective epitaxial growth (SEG) process may be performed using an upper surface of the first active pattern 105 exposed by the first recess 180 as a seed layer to form a first source/drain layer 190 on the first active pattern 105.

The SEG process may be performed using a silicon source gas, e.g., dichlorosilane ($SiH_2Cl_2$) gas, a germanium source gas, e.g., germane ($GeH_4$) gas, and a p-type impurity source gas, e.g., diborane ($B_2H_6$) gas, so that a single crystalline silicon-germanium layer doped with p-type impurities may be formed as the first source/drain layer 190.

In an embodiment, the SEG process may be performed using a silicon source gas, e.g., disilane ($Si_2H_6$) gas and an n-type impurity source gas, e.g., $PH_3$, $POCl_3$, $P_2O_5$, etc., so that a single crystalline silicon layer doped with n-type impurities or a single crystalline silicon carbide layer doped with n-type impurities may be formed as the first source/drain layer 190.

The first source/drain layer 190 may fill the first recess 180, and may further grow to contact a lower sidewall of the first gate spacer 160. The first source/drain layer 190 may grow in a horizontal direction as well as a vertical direction, so as to have a cross-section taken along the second direction D2 having a pentagon-like shape. If a distance between ones of the first active patterns 105 neighboring in the second direction D2 is small, ones of the first source/drain layers 190 grown from upper surfaces of the neighboring ones of the first active patterns 105 may be merged with each other.

A first insulating interlayer 200 may be formed on the substrate 100 having the first dummy gate structure 150, the first gate spacer 160, the fin spacer 170, the first source/drain layer 190 and the first isolation pattern 110 thereon to have an upper surface higher than upper surfaces of the first dummy gate structure 150 and the first gate spacer 160.

Figure 11:
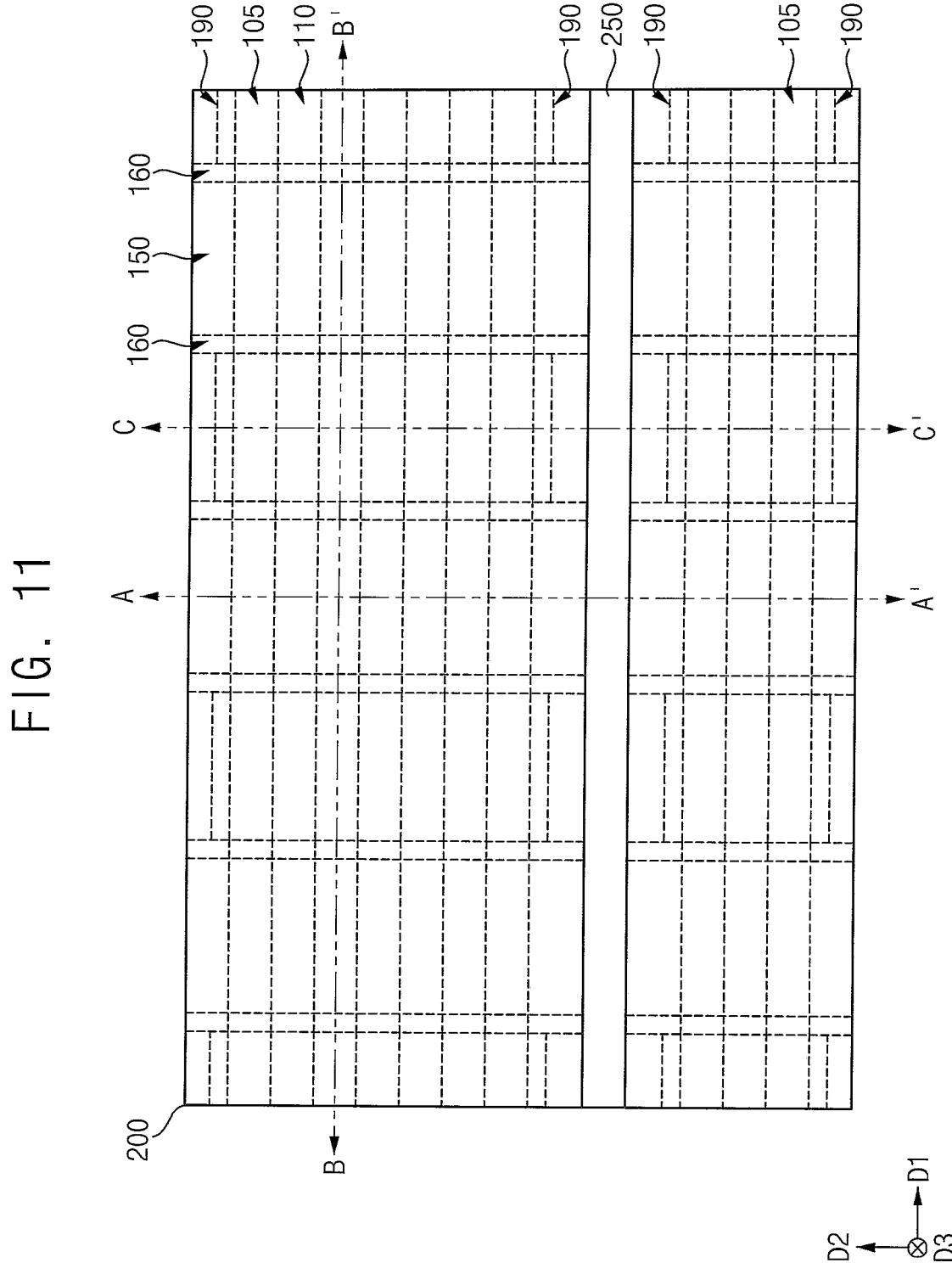
Figure 12:
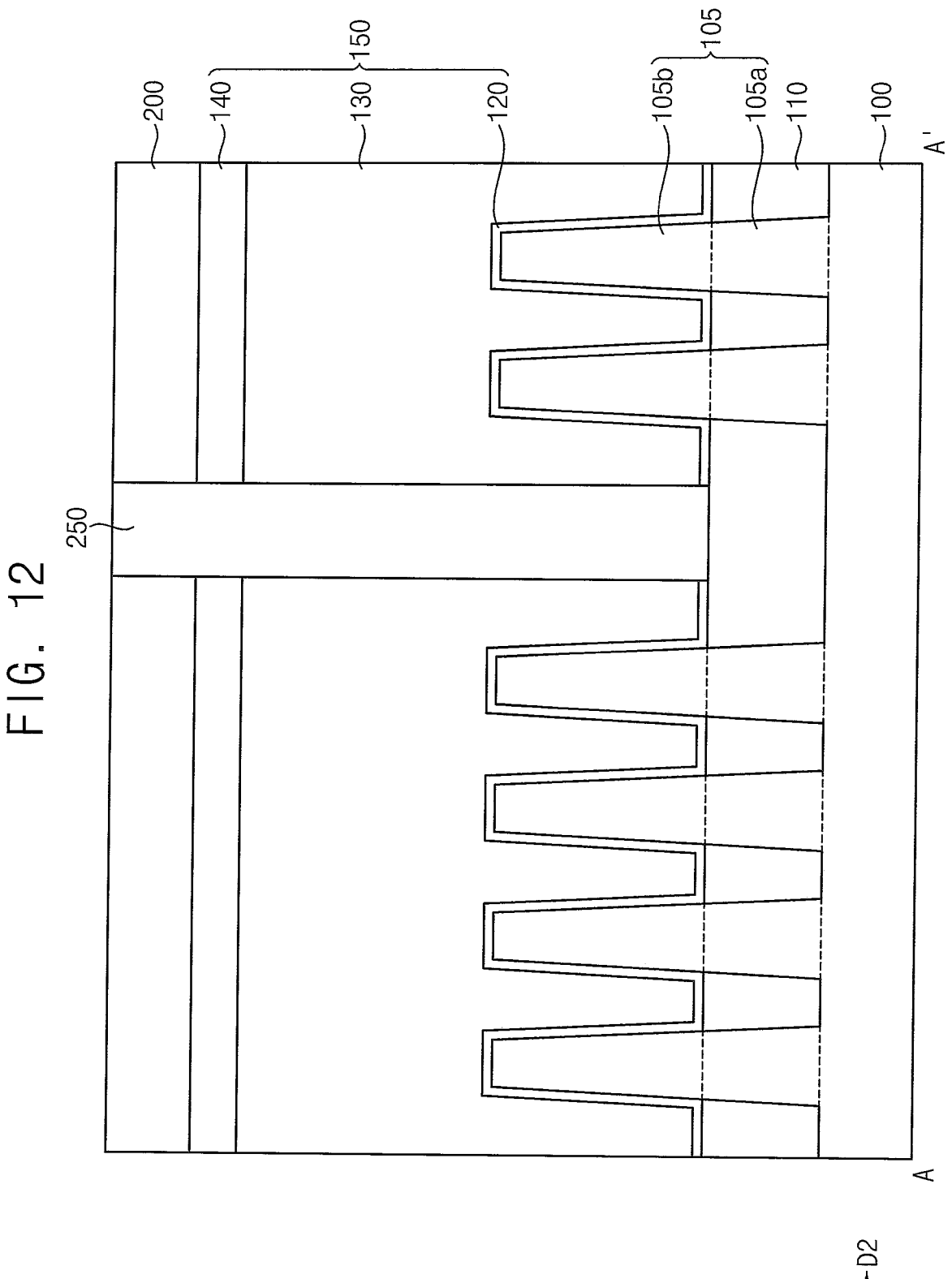
FIGS. 12 and 13 are cross-sectional views taken along lines A-A' and C-C' of FIG. 11, respectively.
Figure 13:
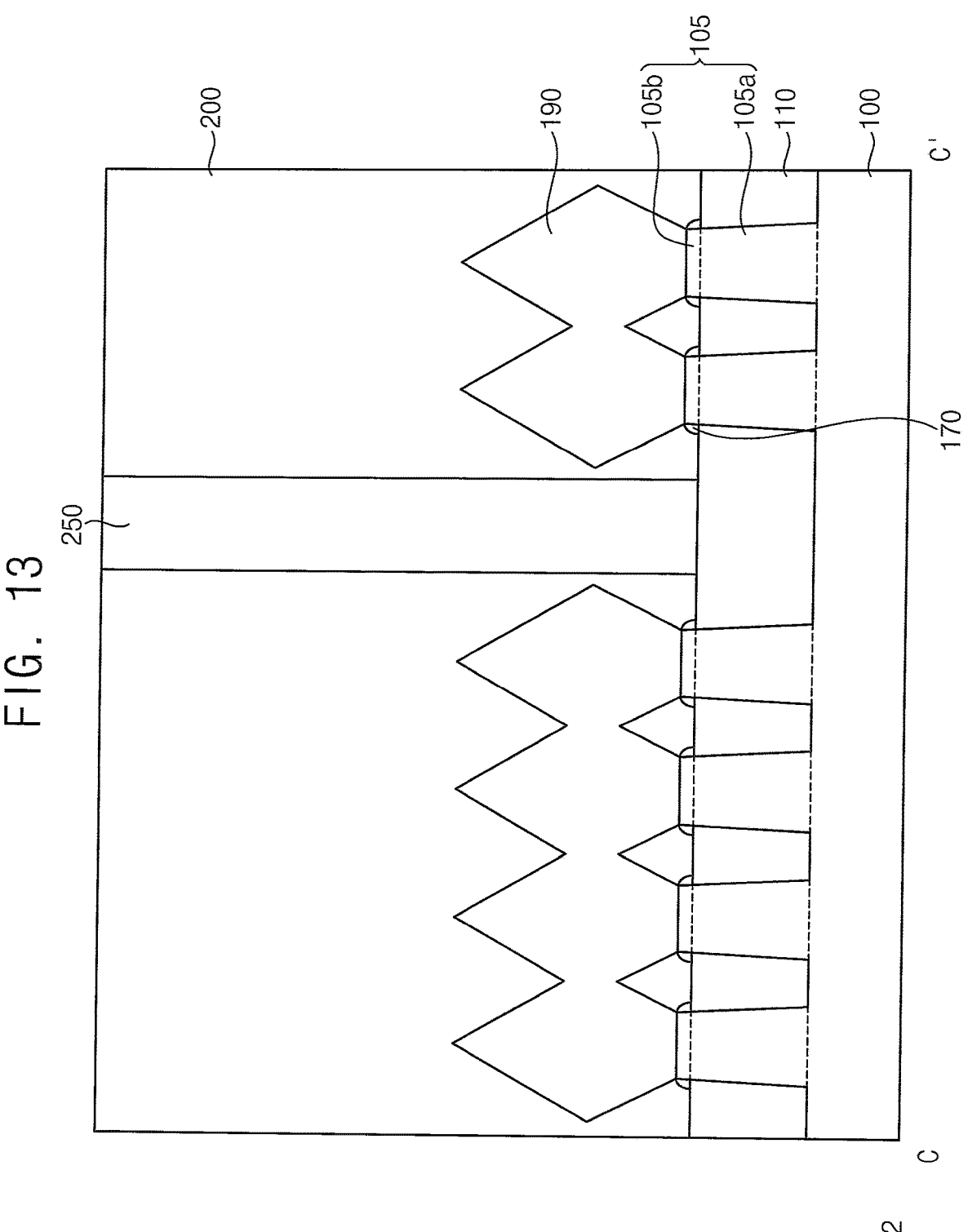

Referring to FIGS. 11 to 13, the first insulating interlayer 200 and the first dummy gate structure 150 may be partially etched by a dry etching process to form a first opening, and a first division pattern 250 may be formed to fill the first opening. Thus, the first dummy gate structure 150 extending in the second direction D2 may be divided, in the second direction D2, into individualized first dummy gate structures.

Figure 14:
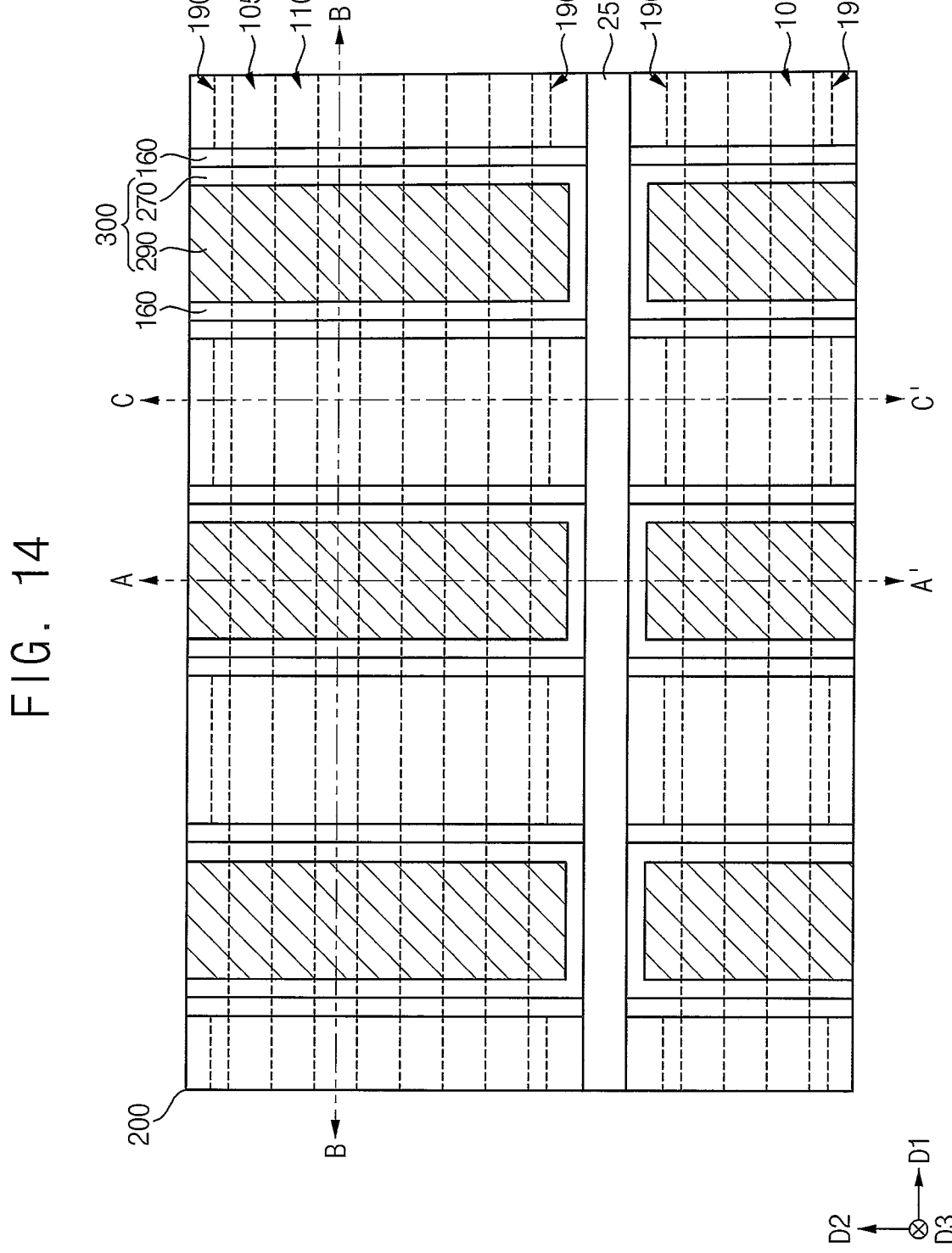
Figure 15:
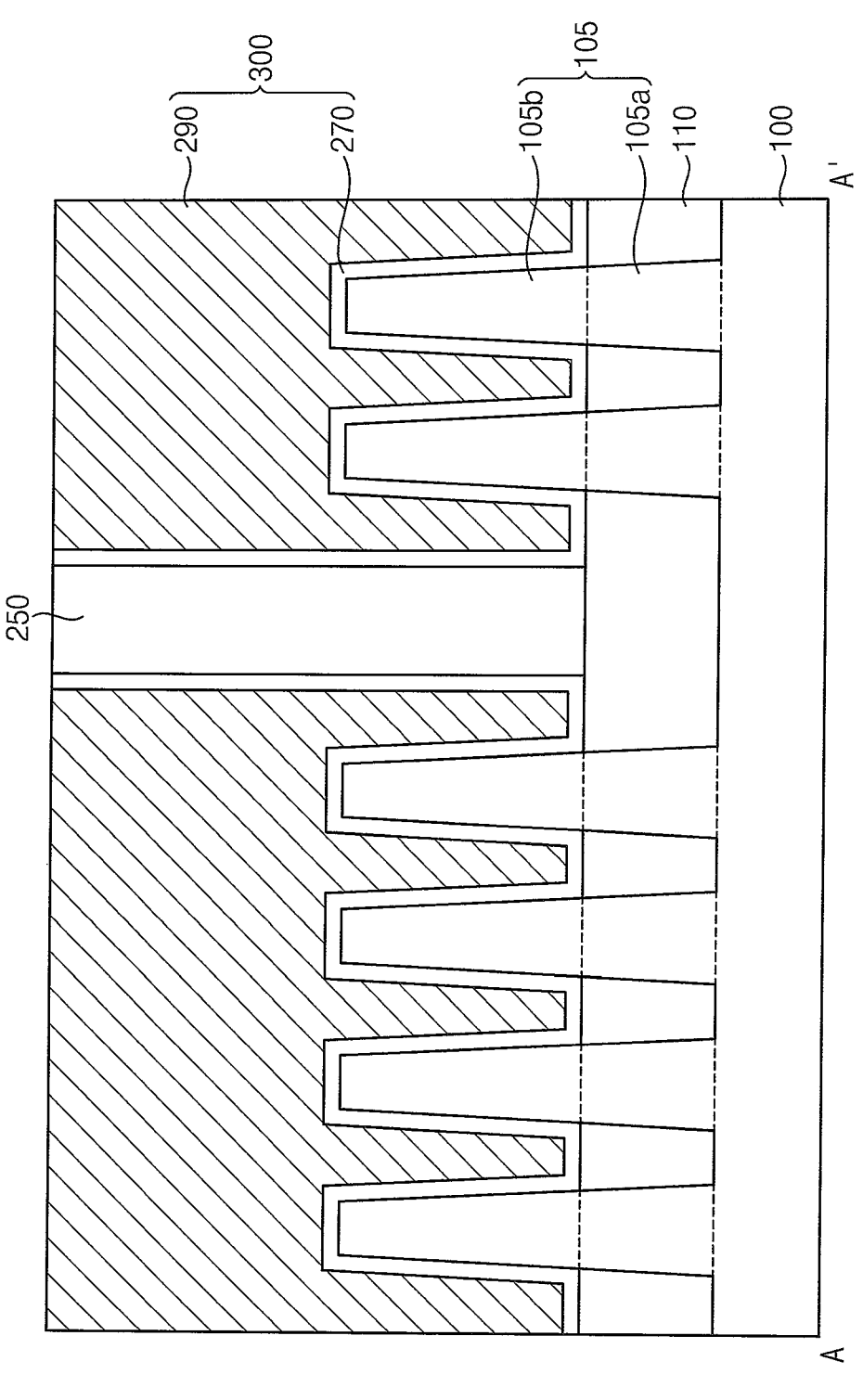
FIG. 15 is a cross-sectional view taken along line A-A' of FIG. 14, and FIGS. 16 and 17 are cross-sectional views taken along line B-B' of FIG. 14.
Figure 16:
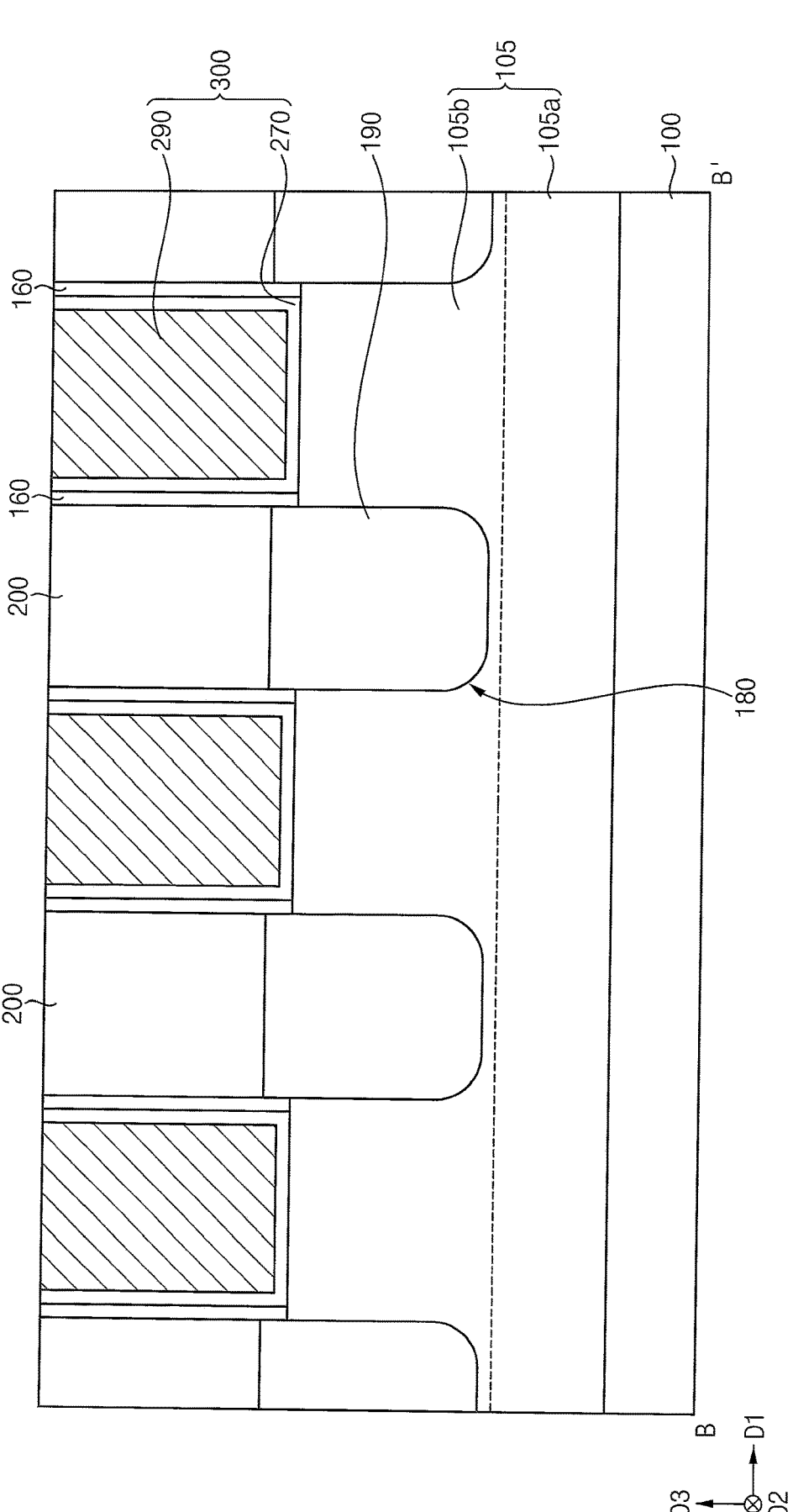

Referring to FIGS. 14 to 16, a planarization process may be performed to expose an upper surface of the first dummy gate electrode 130 included in the first dummy gate structure 150 by removing an upper portion of the first insulating interlayer 200 and the first dummy gate mask 140 included in the first dummy gate structure 150. In the planarization process, upper portions of the first division pattern 250 and the first gate spacer 160 may also be removed.

The first dummy gate electrode 130 and the first dummy gate insulation pattern 120 may be removed to form a second opening exposing upper surfaces of the first active pattern 105 and the first isolation pattern 110.

In example embodiments, the first dummy gate electrode 130 and the first dummy gate insulation pattern 120 may be removed by sequentially performing a dry etching process and a wet etching process. The wet etching process may be performed using, e.g., hydrofluoric acid (HF) as an etching solution.

A first gate structure 300 may be formed to fill the second opening. The first gate structure 300 may be formed by forming a first gate insulation layer on the upper surfaces of the first active pattern 105 and the first isolation pattern 110 exposed by the second opening, a sidewall of the second opening, a sidewall and an upper surface of the first division pattern 250, an inner sidewall and an upper surface of the first gate spacer 160, and an upper surface of the first insulating interlayer 200, forming a gate electrode layer on the first gate insulation layer to fill the second opening, and planarizing the first gate electrode layer and the first gate insulation layer until the upper surface of the first insulating interlayer 200 is exposed. Thus, the first gate structure 300 may include a first gate electrode 290 and a first gate insulation pattern 270 covering a lower surface and a sidewall of the first gate electrode 290.

In an example embodiment, before forming the first gate insulation layer, the upper surface of the first active pattern 105 exposed by the second opening may be thermally oxidated to form an interface pattern including silicon oxide.

Figure 17:
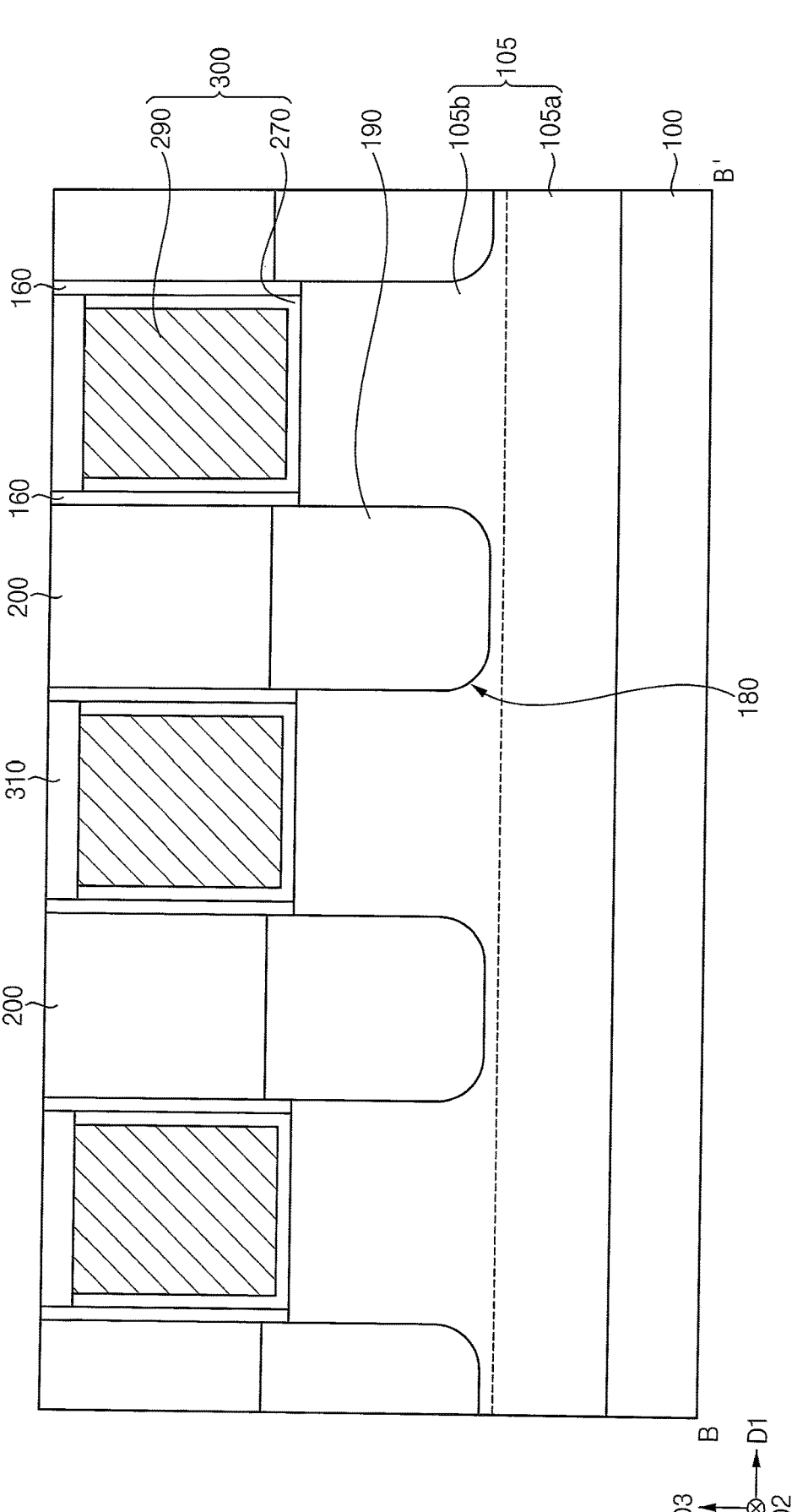

Referring to FIG. 17, an upper portion of the first gate structure 300 may be removed to form a second recess, a capping layer may be formed on the first insulating interlayer 200, the first gate spacer 160 and the first division pattern 250 to fill the second recess, and the capping layer may be planarized until the upper surface of the first insulating interlayer 200 is exposed.

Thus, a capping pattern 310 may be formed on the first gate structure 300. The capping pattern 310 may include or may be formed of an insulating nitride, e.g., silicon nitride.

Figure 18:
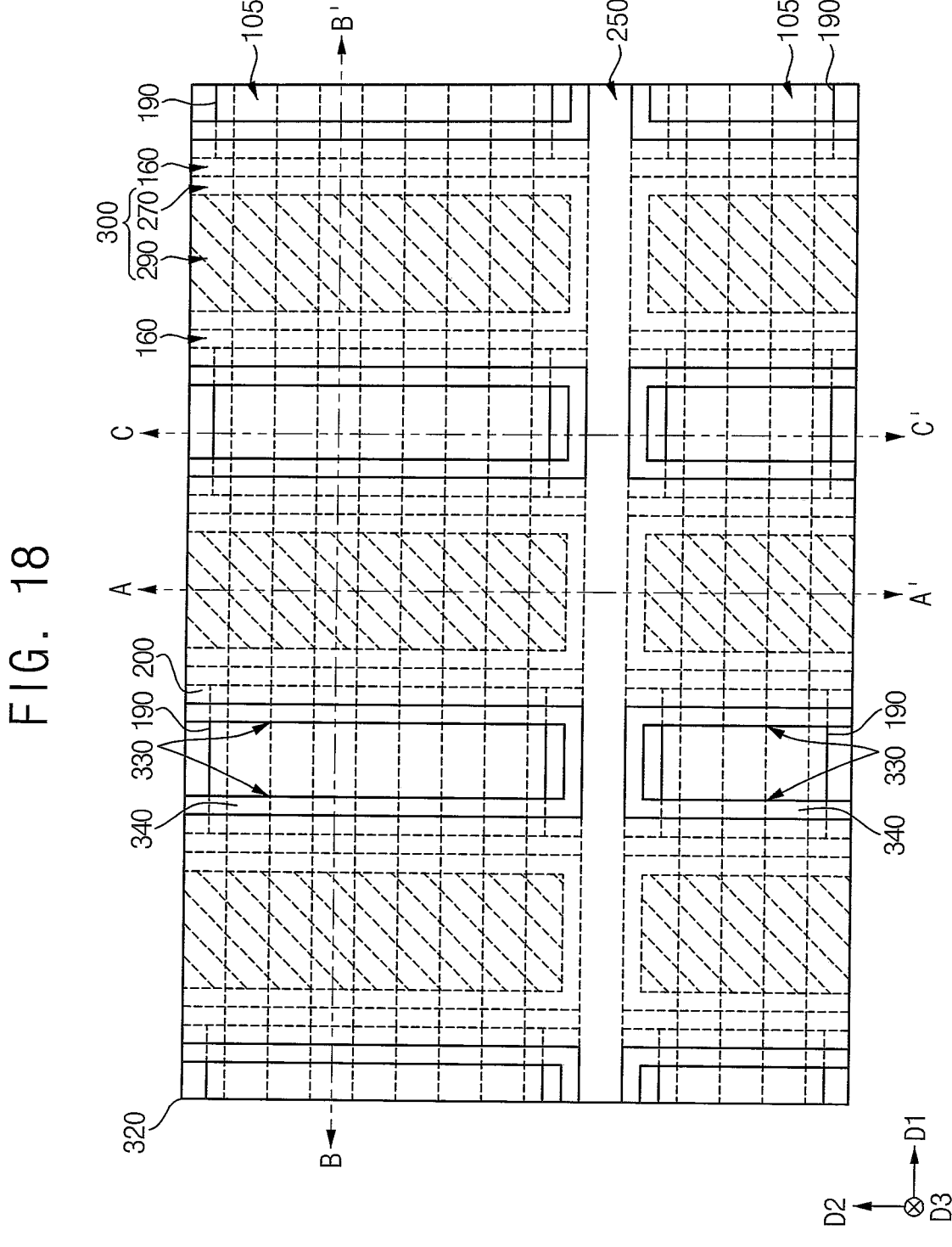
Figure 19:
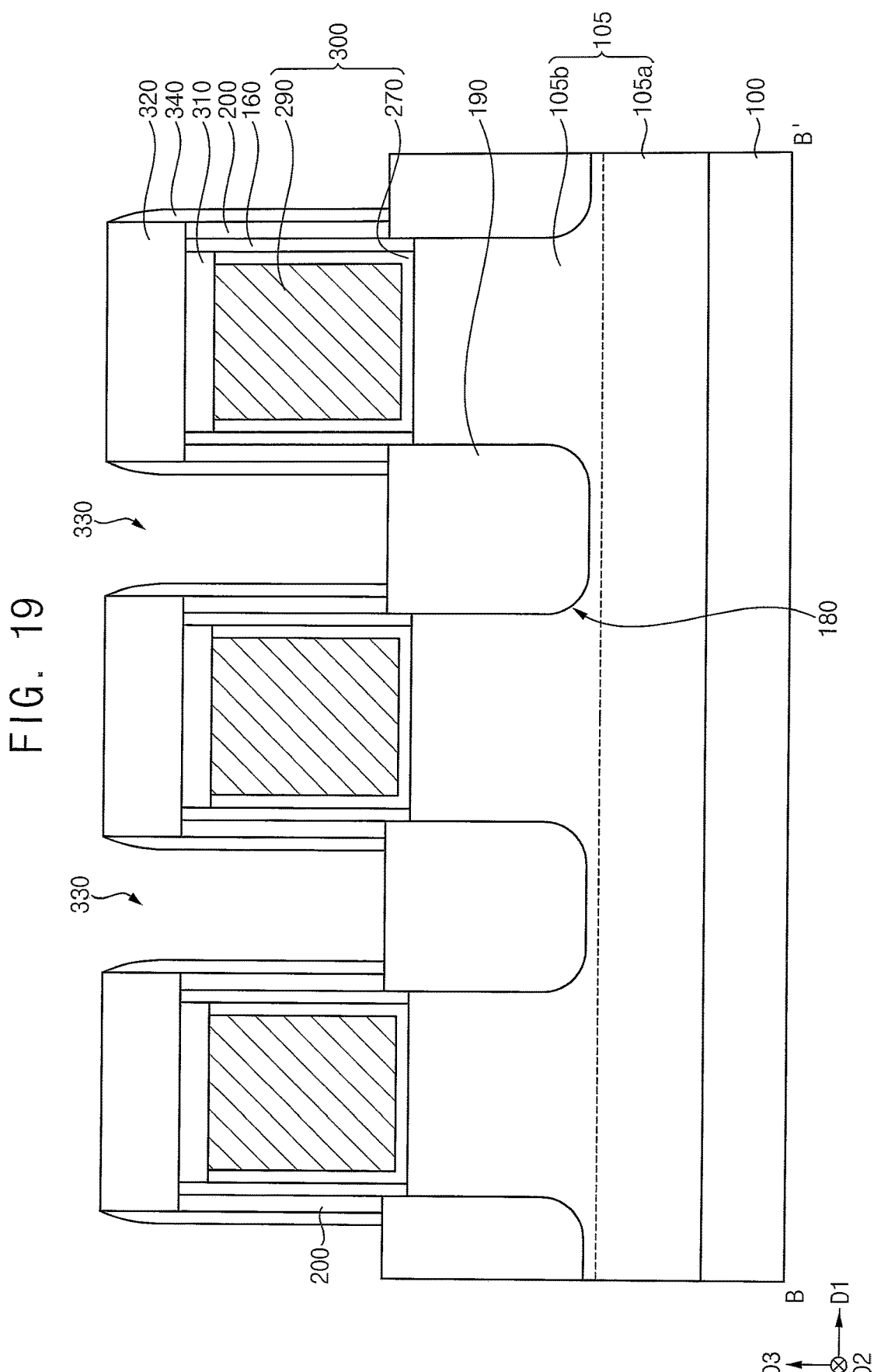
FIGS. 19 and 20 are cross-sectional views taken along lines B-B' and C-C' of FIG. 18, respectively.
Figure 20:
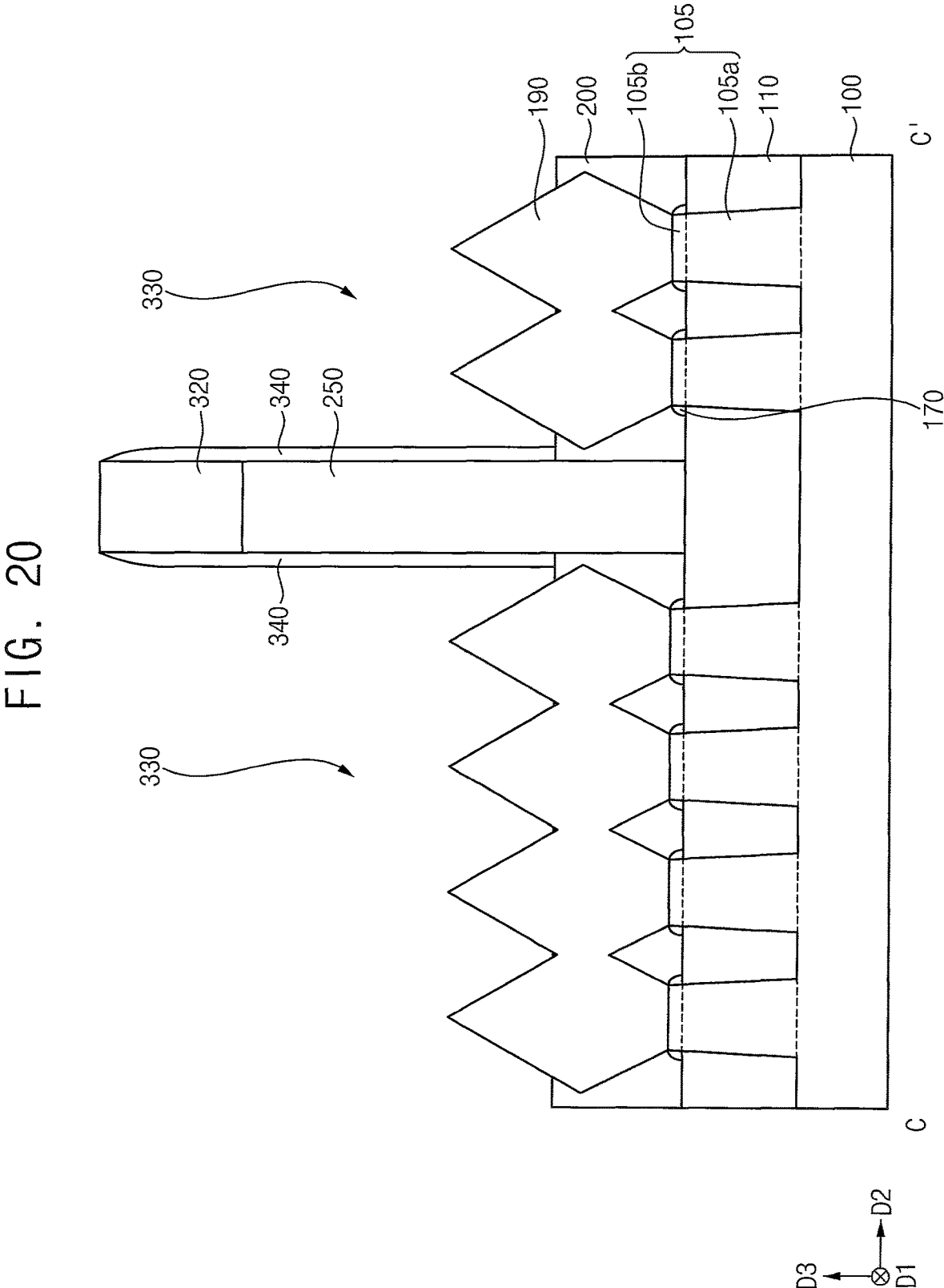

Referring to FIGS. 18 to 20, a second insulating interlayer 320 may be formed on the capping pattern 310, the first gate spacer 160, the first insulating interlayer 200 and the first division pattern 250, the second insulating interlayer 320 may be partially etched to form a third opening 330 exposing an upper surface of the first source/drain layer 190, and a first plug spacer 340 may be formed on a sidewall of the third opening 330.

The first plug spacer 340 may be formed on sidewalls of the first and second insulating interlayers 200 and 320 and a sidewall of the first division pattern 250.

FIG. 19 shows that the third opening 330 does not expose an outer sidewall of the first gate spacer 160 on the sidewall of the first gate structure 300 in the first insulating interlayer 200, however, the inventive concept may not be limited thereto. Thus, in some embodiments, the third opening 330 may expose the outer sidewall of the first gate spacer 160, and thus the first plug spacer 340 may contact the first gate spacer 160.

Figure 21:
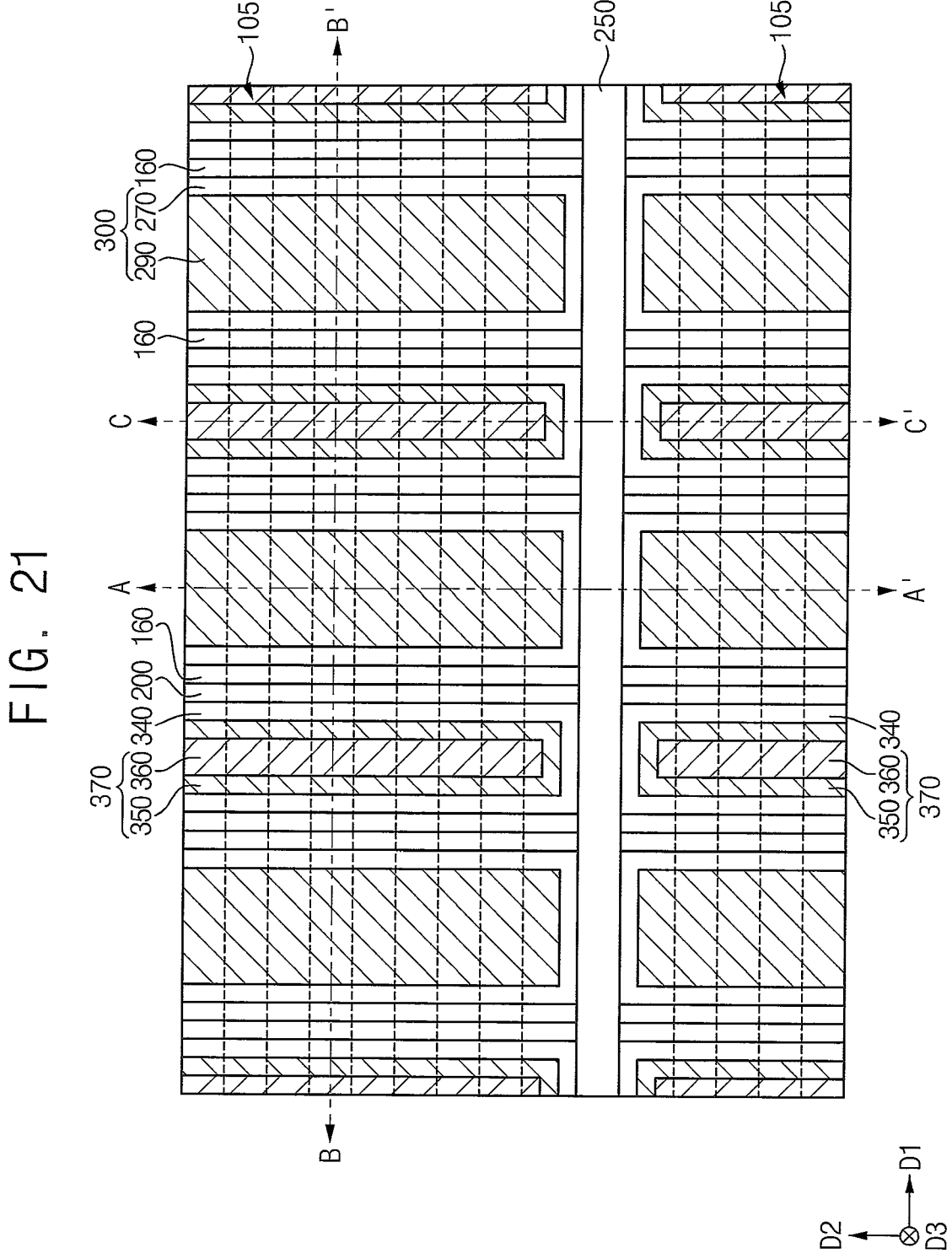
Figure 22:
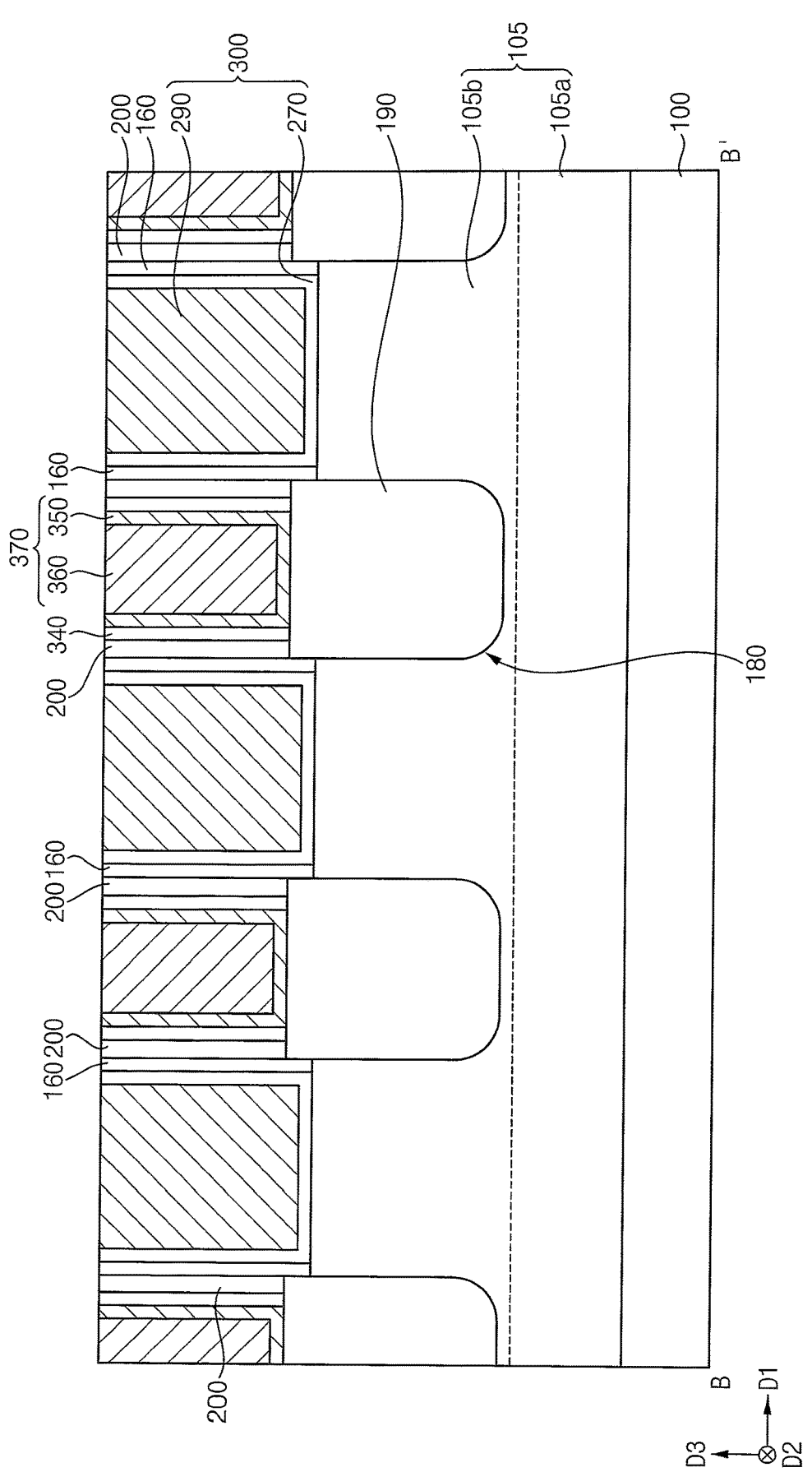
FIGS. 22 and 24 are cross-sectional views taken along line B-B' of FIG. 21, and FIGS. 23 and 25 are cross-sectional views taken along line C-C' of FIG. 21.
Figure 23:
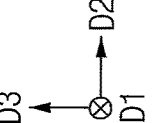

Referring to FIGS. 21 to 23, a first contact plug structure 370 may be formed in the third opening 330.

The first contact plug structure 370 may be formed by forming a second barrier layer on the upper surface of the first source/drain layer 190 exposed by the third opening 330, an inner sidewall of the first plug spacer 340, and the upper surfaces of the first and second insulating interlayers 200 and 320, forming a third conductive layer on the second barrier layer to fill the third opening 330, and planarizing the third conductive layer and the second barrier layer until an upper surface of the first gate electrode 290 is exposed.

During the planarization process, the second insulating interlayer 320 and the capping pattern 310 may be removed, and upper portions of the first division pattern 250, the first plug spacer 340, the first insulating interlayer 200 and the first gate spacer 160 may also be removed.

Thus, the first contact plug structure 370 may include a third conductive pattern 360 and a second barrier pattern 350 covering a lower surface and a sidewall of the third conductive pattern 360.

Figure 24:
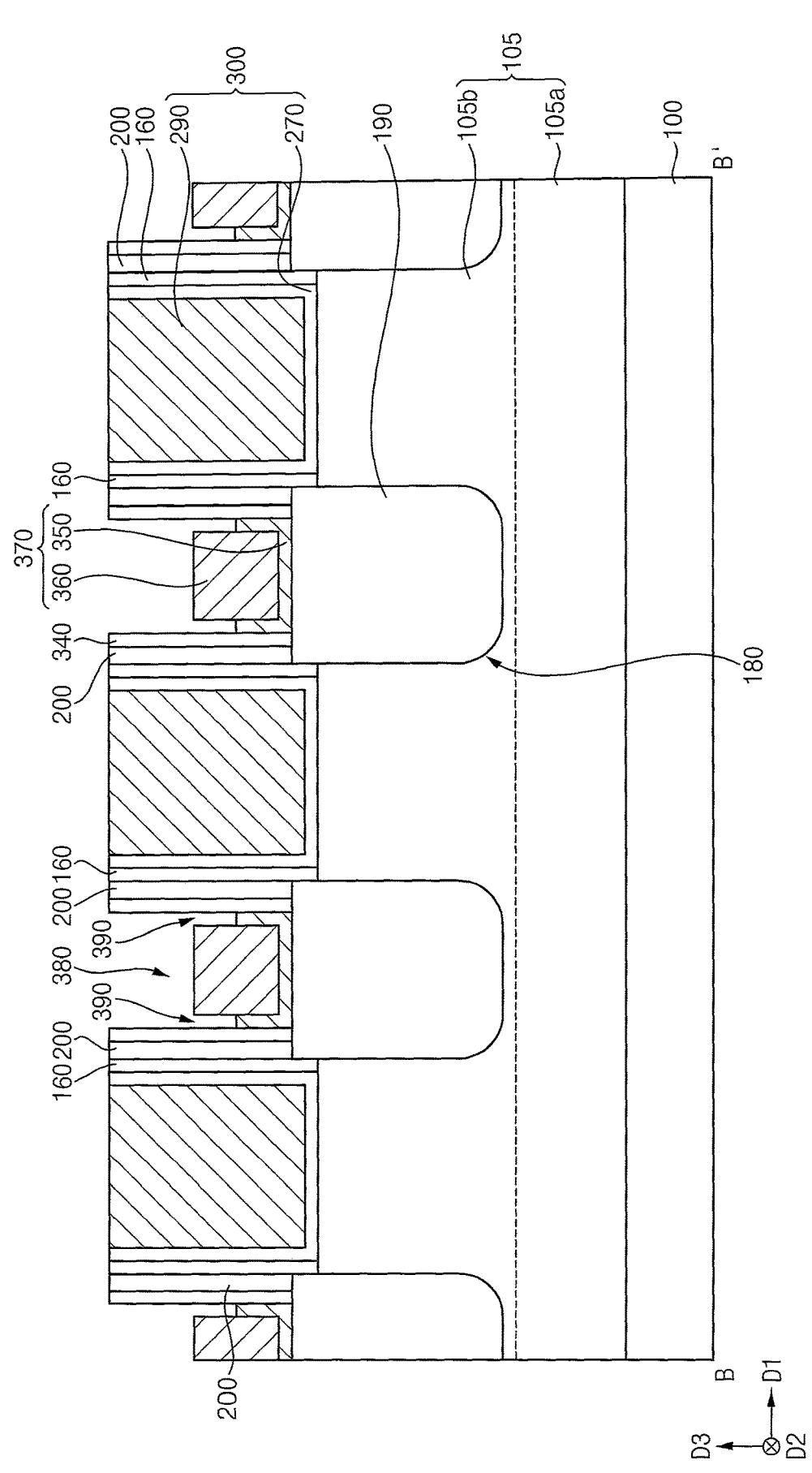
Figure 25:
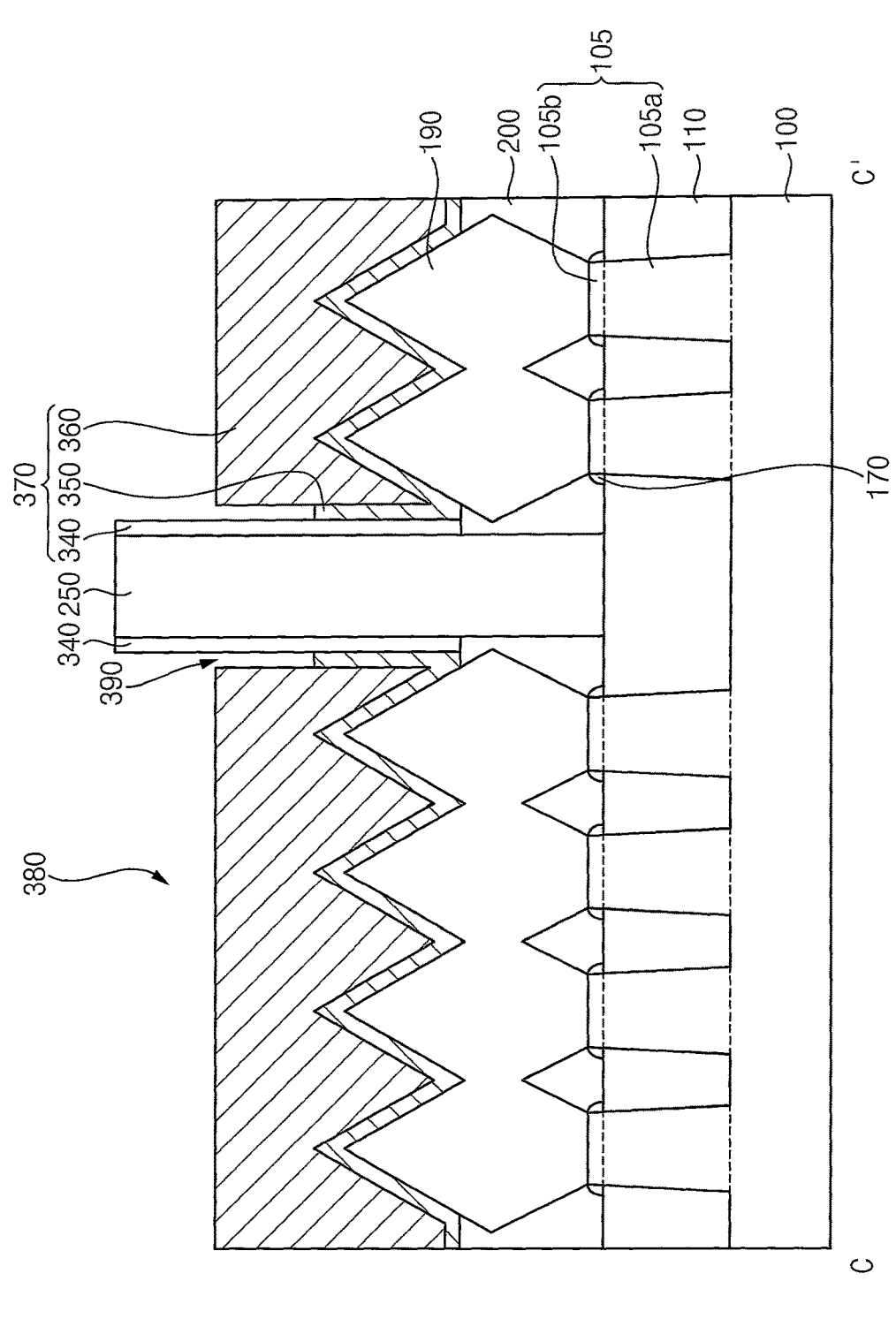

Referring to FIGS. 24 and 25, an upper portion of the third conductive pattern 360 may be removed to form a third recess 380, and an upper portion of the second barrier pattern 350 may be removed to form a fourth recess 390.

The third and fourth recesses 380 and 390 may be formed by forming a first etching mask to cover all structures except for the first contact plug structure 370, and performing a dry etching process using the first etching mask.

In example embodiments, a lower surface of the fourth recess 390 may be lower than a lower surface of the third recess 380, and thus an upper surface of the third conductive pattern 360 may be higher than an upper surface of the second barrier pattern 350.

Figure 26:
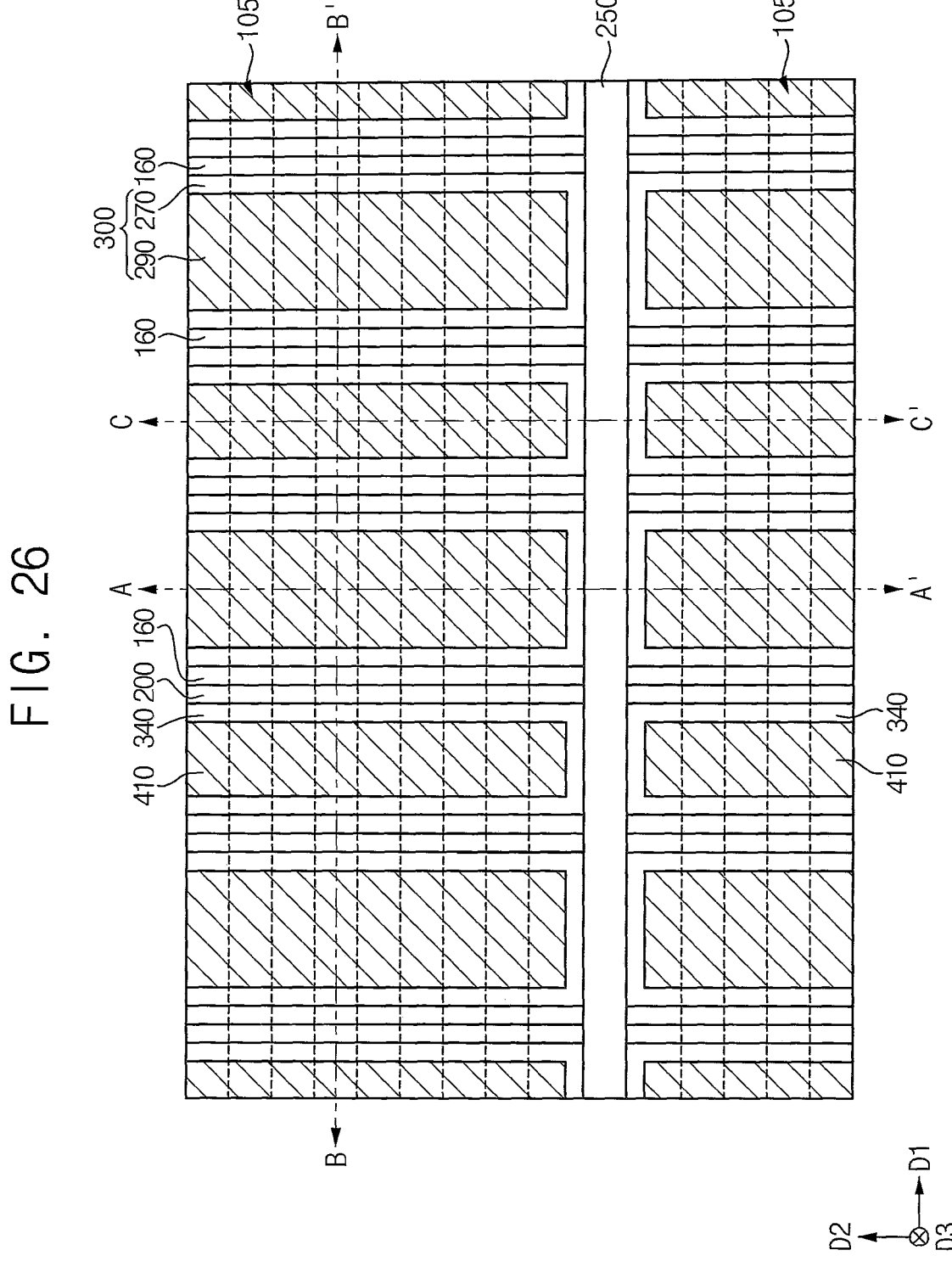
Figure 27:
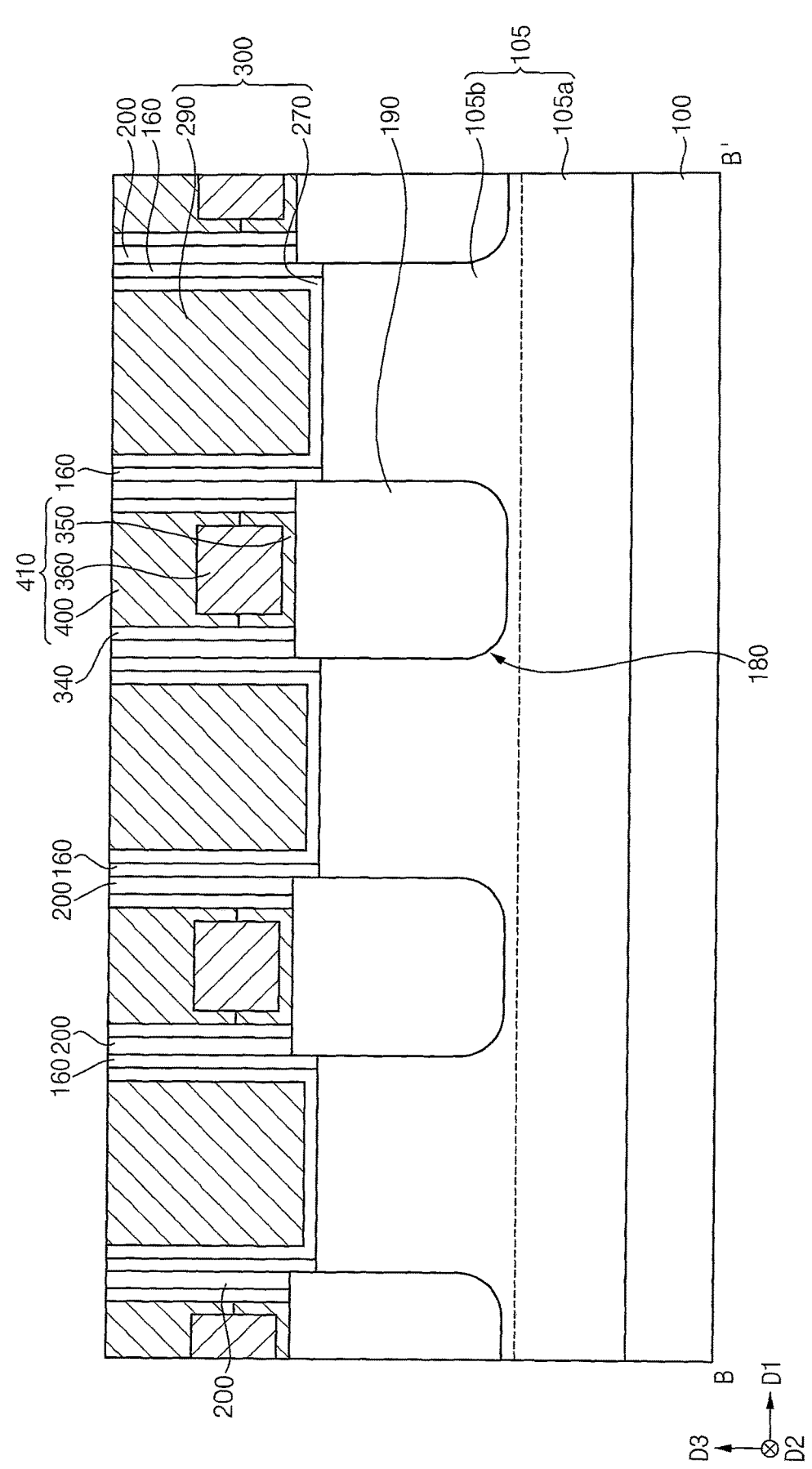
FIGS. 27 and 28 are cross-sectional views taken along lines B-B' and C-C' of FIG. 26, respectively.
Figure 28:
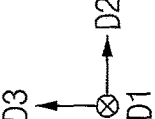

Referring to FIGS. 26 to 28, a fourth conductive pattern 400 may be formed to fill the third and fourth recesses 380 and 390.

The fourth conductive pattern 400 may be formed by forming a fourth conductive layer on the first gate structure 300, the first gate spacer 160 and the first insulating interlayer 200 to fill the third and fourth recesses 380 and 390, and planarizing the fourth conductive layer until an upper surface of the first gate structure 300 is exposed.

Thus, a fourth conductive pattern 400 contacting upper surfaces of the third conductive pattern 360 and the second barrier pattern 350 may be formed, and the third and fourth conductive patterns 360 and 400 and the second barrier pattern 350 may form a second contact plug structure 410.

Referring to FIGS. 29 to 32, a second etching mask 420 may be formed to partially cover the first gate structure 300 and the second contact plug structure 410, and an etching process may be performed using the second etching mask 420 on the first gate structure 300 and the second contact plug structure 410.

The second etching mask 420 may also cover portions of the first gate spacer 160, the first insulating interlayer 200, the first plug spacer 340 and the first division pattern 250 adjacent to the first gate structure 300 and the second contact plug structure 410.

In example embodiments, the etching process may not be performed using an etching gas or etching solution having high etching selectivity between an insulating material and a conductive material, and thus the first gate spacer 160, the first insulating interlayer 200, the first plug spacer 340, the first division pattern 250 and the first gate insulation pattern 270 including insulating materials as well as the first gate electrode 290 and the second contact plug structure 410 including conductive materials may be etched during the etching process.

By the etching process, the fourth conductive pattern 400 included in the second contact plug structure 410 may be removed to expose an upper surface of the third conductive pattern 360, and an upper portion of the third conductive pattern 360 may also be partially removed. Thus, an upper surface of a portion of the third conductive pattern 360 at a portion of the second contact plug structure 410 not covered by the second etching mask 420 may be lower than an upper surface of a portion of the third conductive pattern 360 at a portion of the second contact plug structure 410 covered by the second etching mask 420.

During the etching process, an upper portion of the first gate electrode 290 may also be removed, and an upper surface of the first gate electrode 290 may be substantially coplanar with the upper surface of the portion of the third conductive pattern 360 at the portion of the second contact plug structure 410 not covered by the second etching mask 420.

By the etching process, upper portions of the first gate spacer 160, the first insulating interlayer 200, the first plug spacer 340, the first division pattern 250 and the first gate insulation pattern 270 including insulating materials may also be removed so that upper surfaces of the first gate spacer 160, the first insulating interlayer 200, the first plug spacer 340, the first division pattern 250 and the first gate insulation pattern 270 may be substantially coplanar with the upper surface of the portion of the third conductive pattern 360 at the portion of the second contact plug structure 410 not covered by the second etching mask 420, that is, the upper surface of the third conductive pattern 360 of the first contact plug structure 370.

Thus, the portion of the second contact plug structure 410 not covered by the second etching mask 420 may be transformed into the first contact plug structure 370 including the third conductive pattern 360 and the second barrier pattern 350, and the fourth recess 390 may be formed again. Additionally, a portion of the first gate structure 300 not covered by the second etching mask 420 may be transformed into a second gate structure 305 including a second gate electrode 295 and a second gate insulation pattern 275.

Figure 30:
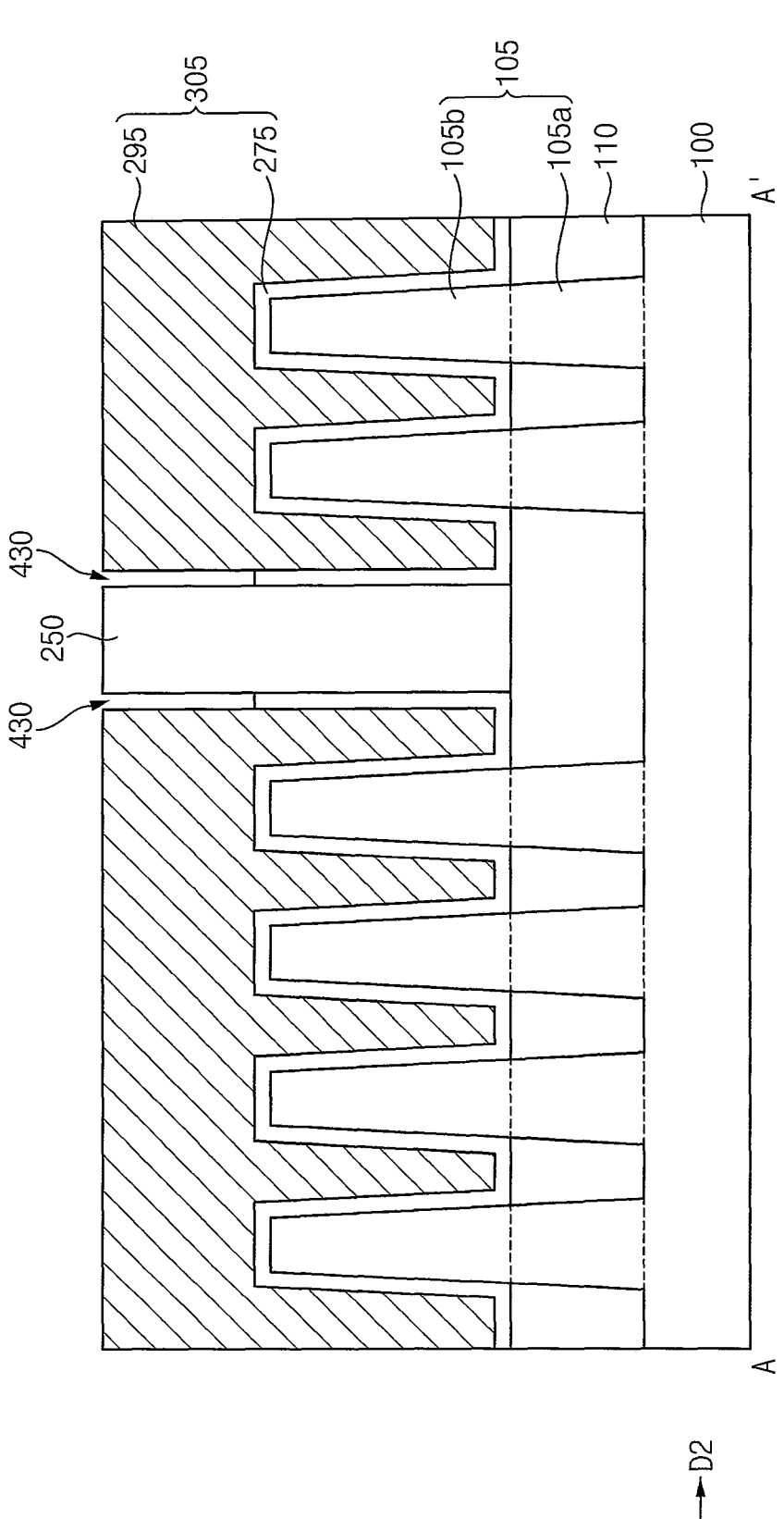
Figure 31:
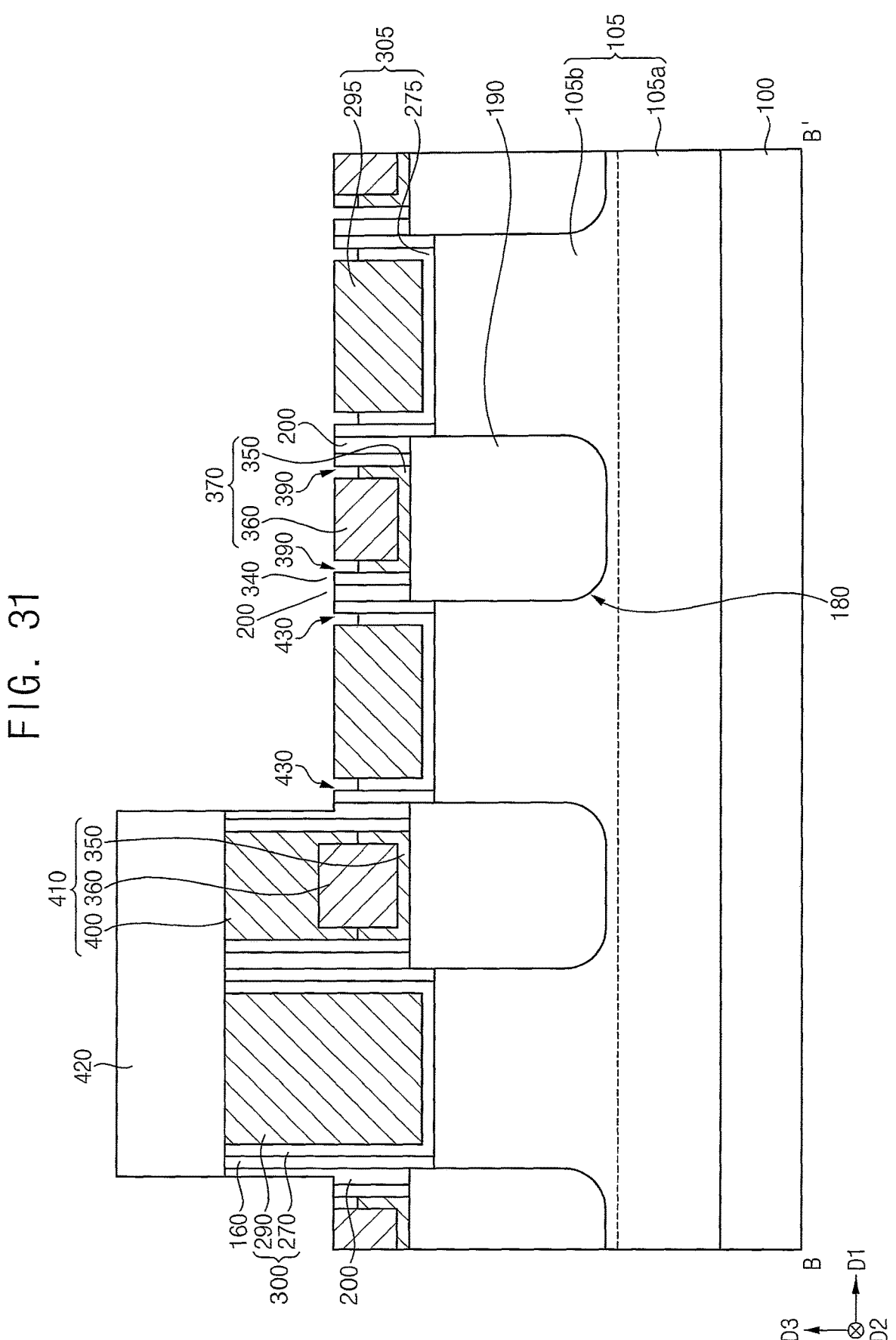

An etching process may be further performed on the second gate insulation pattern 275 to form a fifth recess 430, and thus an upper surface of the second gate insulation pattern 275 may be lower than an upper surface of the second gate electrode 295. For example, the second gate insulation pattern 275 between the second gate electrode 295 and the first division pattern 250 may be partially etched to form the fifth recess 430 as shown in FIG. 30.

Referring to FIGS. 1 to 4, after removing the second etching mask 420, a third insulating interlayer 440 may be formed on the first and second gate structures 300 and 305, the first and second contact plug structures 370 and 410, the first gate spacer 160, the first insulating interlayer 200, the first plug spacer 340 and the first division pattern 250, and may be planarized until the upper surface of the first gate structure 300 is exposed.

A fourth insulating interlayer 450 may be formed on the third insulating interlayer 440, and a first wiring 462 extending through the fourth insulating interlayer 450 to contact the upper surface of the first gate structure 300 and second and third wirings 464 and 466 extending through the fourth insulating interlayer 450 to contact the upper surface of the second contact plug structure 410 may be formed.

In an example embodiment, each of the first and second wirings 462 and 464 may extend in the second direction D2, and the third wiring 466 may extend in the first direction D1.

By the above processes, the semiconductor device may be manufactured.

Figure 33:
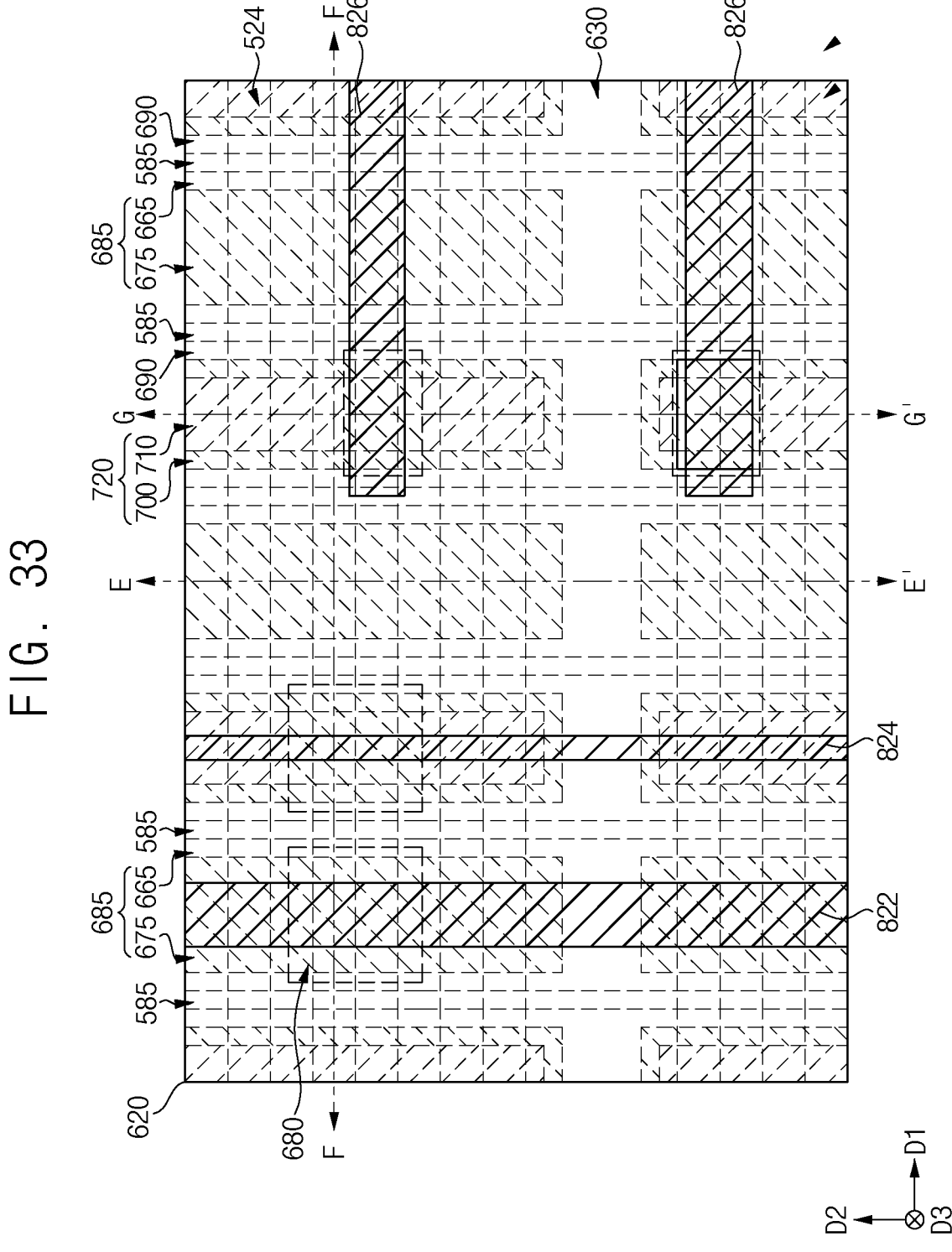
FIG. 33 is a plan view illustrating a semiconductor device in accordance with example embodiments.
Figure 34:
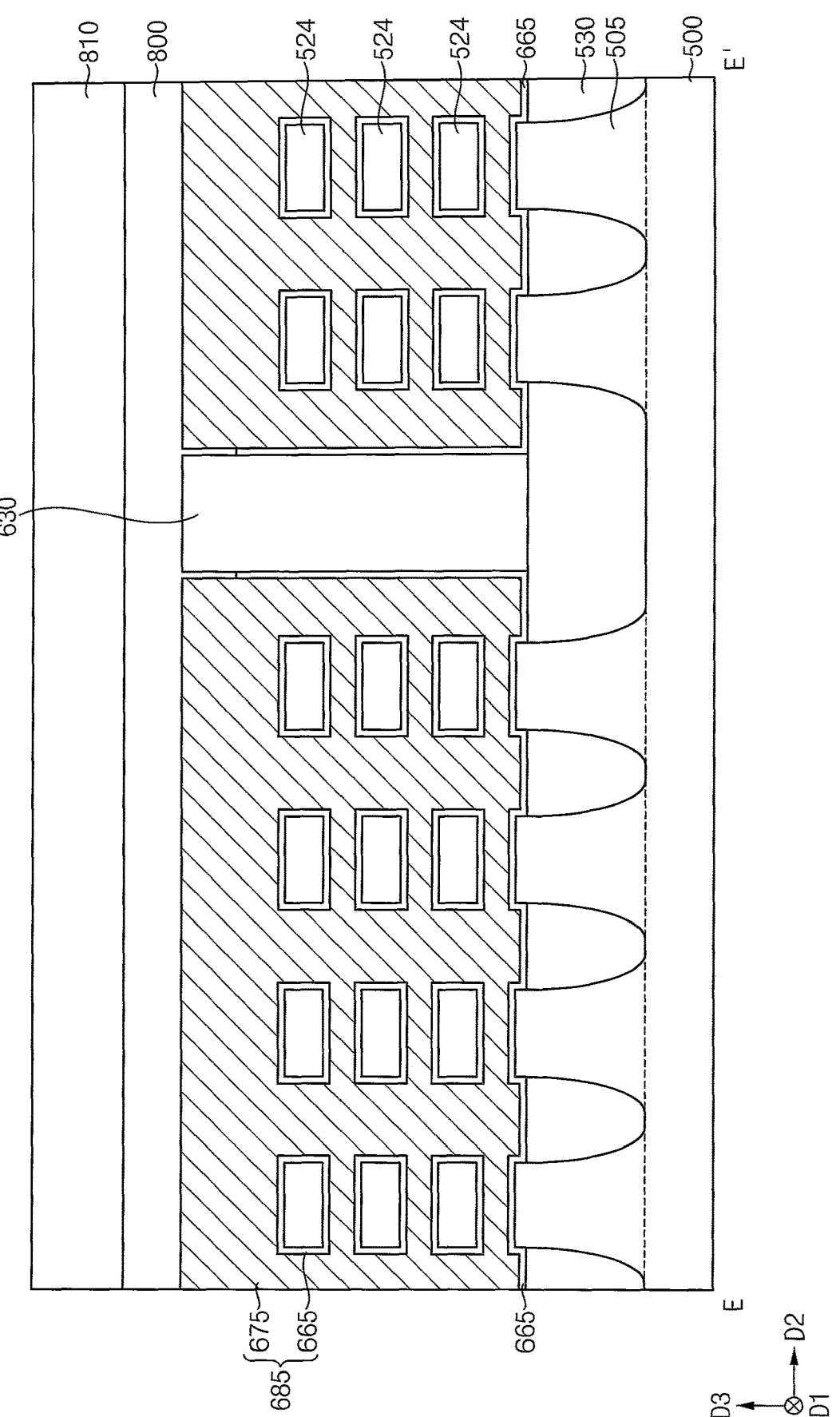
FIG. 34 is a cross-sectional view taken along line E-E' of FIG. 33.
Figure 35:
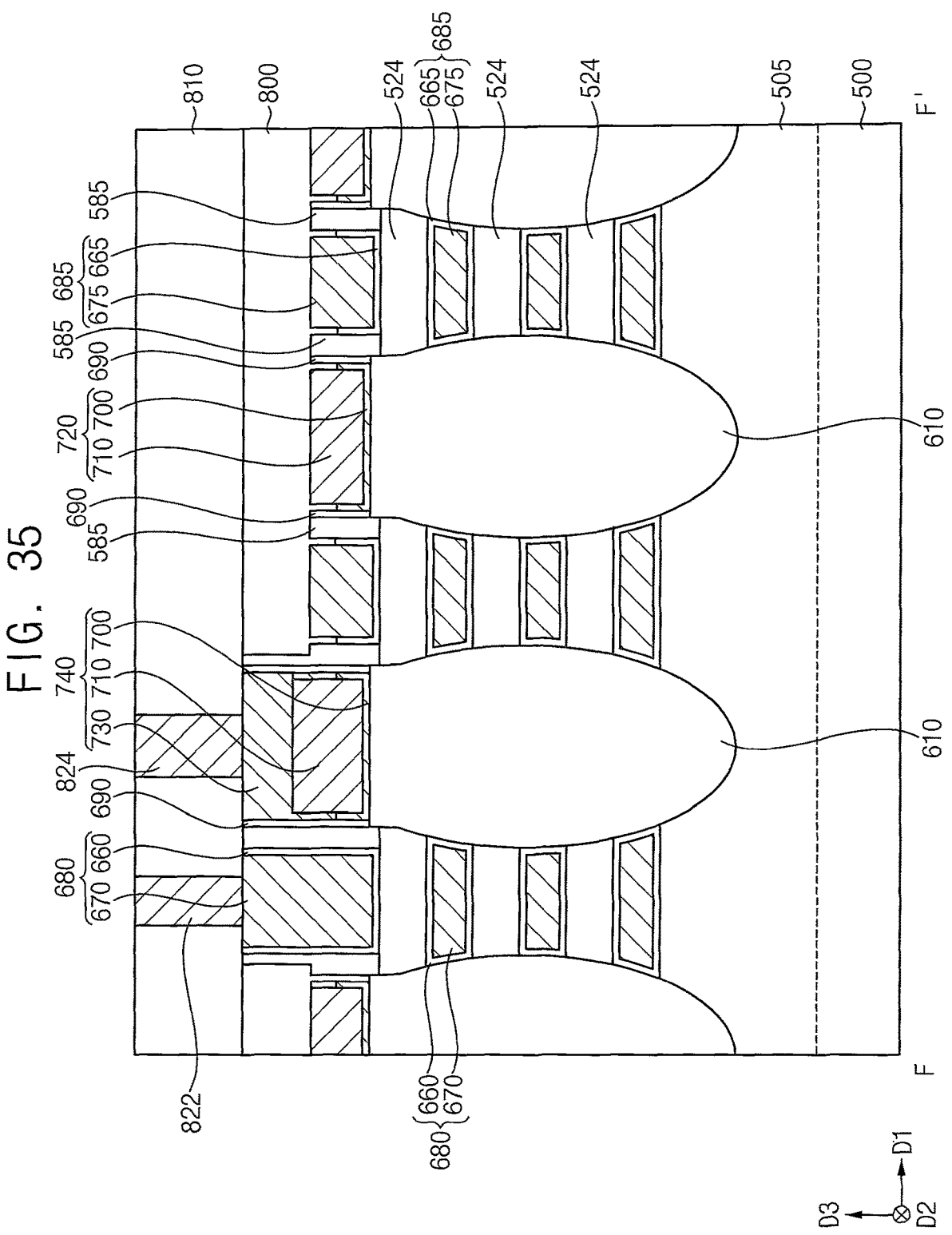
FIG. 35 is a cross-sectional view taken along line F-F' of FIG. 33.
Figure 36:
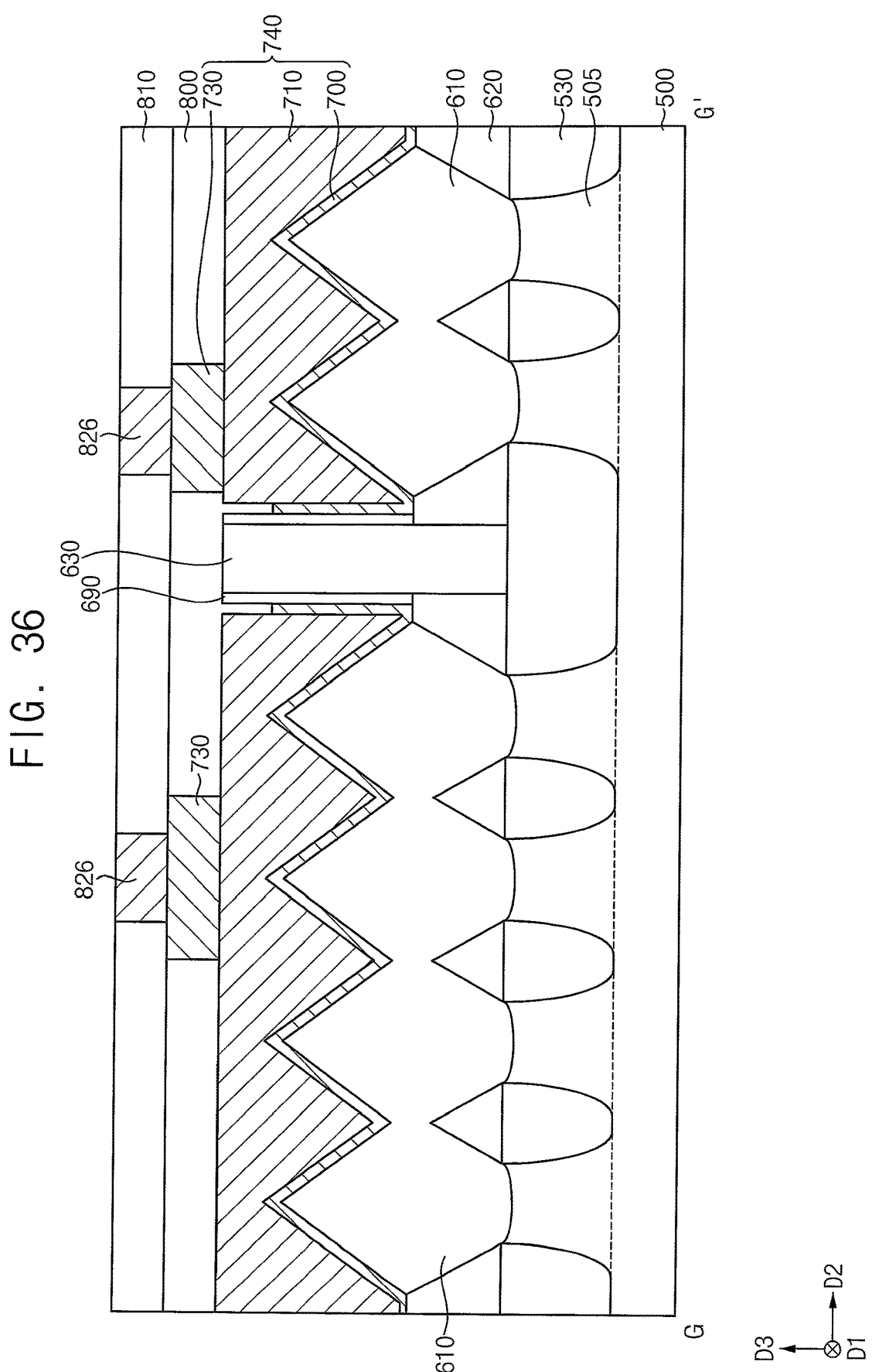
FIG. 36 is a cross-sectional view taken along line G-G' of FIG. 33.

FIGS. 33 to 36 are a plan view and cross-sectional views illustrating a semiconductor device in accordance with example embodiments. Particularly, FIG. 33 is the plan view, FIG. 34 is a cross-sectional view taken along line E-E' of FIG. 33, FIG. 35 is a cross-sectional view taken along line F-F' of FIG. 33, and FIG. 36 is a cross-sectional view taken along line G-G' of FIG. 33.

This semiconductor device may include constituent elements substantially the same as or similar to those of the semiconductor device illustrated with reference to FIGS. 1 to 4, and repeated explanation thereof are omitted herein. As illustrated below, the semiconductor device may be a multi-bridge channel field effect transistor (MBCFET) including semiconductor patterns 524 spaced apart from each other in the third direction D3 and serving as channels, respectively. Thus, other elements except for the semiconductor patterns 524 may have similar functions and structures to corresponding elements included in the finFET of FIGS. 1 to 4.

Referring to FIGS. 33 to 36, the semiconductor device may include a second active pattern 505, a second isolation pattern 530, third and fourth gate structures 680 and 685, the semiconductor patterns 524, a second source/drain layer 610, a second gate spacer 585, third and fourth contact plug structures 720 and 740, a second plug spacer 690, a second division pattern 630, fifth to seventh insulating interlayers 620, 800 and 810, and fourth to sixth wirings 822, 824 and 826 on the substrate 100.

The second active pattern 505 and the second isolation pattern 530 may correspond to the first active pattern 105 and the first isolation pattern 110, respectively, of FIGS. 1 to 4.

In example embodiments, a plurality of semiconductor patterns 524 may be formed at a plurality of levels, respectively, and may be spaced apart from each other in the third direction D3. Each of the plurality of semiconductor patterns 524 may extend in the first direction D1. FIGS. 34 and 35 show three semiconductor patterns 524 at three levels, however, the inventive concept may not be limited thereto. Additionally, FIG. 35 shows three semiconductor patterns 524 spaced apart from each other in the first direction D1 on each second active pattern 505 extending in the first direction D1, however, the inventive concept may not be limited thereto.

In example embodiments, the semiconductor pattern 524 may be a nano-sheet or nano-wire including a semiconductor material, e.g., silicon, germanium, etc. In example embodiments, the semiconductor pattern 524 may serve as a channel in a transistor, and thus may also be referred to as a channel.

The third and fourth gate structures 680 and 685 may correspond to the first and second gate structures 300 and 305, respectively, of FIGS. 1 to 4. Thus, the third gate structure 680 may include a third gate electrode 670 and a third gate insulation pattern 660, and the fourth gate structure 685 may include a fourth gate electrode 675 and a fourth gate insulation pattern 665. An upper surface of the third gate structure 680 may be higher than an upper surface of the fourth gate structure 685. That is, an upper surface of the third gate electrode 670 may be higher than an upper surface of the fourth gate electrode 675, and an uppermost surface of the third gate insulation pattern 660 may be higher than an uppermost surface of the fourth gate insulation pattern 665. Additionally, the uppermost surface of the third gate insulation pattern 660 may be substantially coplanar with an uppermost surface of the third gate electrode 670.

Each of the third and fourth gate structures 680 and 685 may surround a central portion in the first direction D1 of each of the semiconductor patterns 524, and may cover lower and upper surfaces and opposite sidewalls in the second direction D2 of each of the semiconductor patterns 524.

Each of the third and fourth gate insulation patterns 660 and 665 may be formed on a surface of each semiconductor pattern 524, an upper surface of the second active pattern 505, a sidewall of the second source/drain layer 610 and an inner sidewall of the second gate spacer 585, and each of the third and fourth gate electrodes 670 and 675 may fill a space between the semiconductor patterns 524 spaced apart from each other in the third direction D3, a space between the second active pattern 505 and a lowermost one of the semiconductor pattern 524, and a space between the second gate spacers 585 on an uppermost one of the semiconductor patterns 524.

The second gate spacer 585 may be formed on each of opposite sidewalls in the first direction D1 of a portion of each of the third and fourth gate structures 680 and 685 on the uppermost one of the semiconductor patterns 524. An upper surface of a portion of the second gate spacer 585 on a sidewall of the fourth gate structure 685 may be substantially coplanar with an upper surface of the fourth gate electrode 675, and an upper surface of a portion of the second gate spacer 585 on a sidewall of the third gate structure 680 may be substantially coplanar with an upper surface of the third gate electrode 670 or the fourth gate electrode 675.

The fourth gate structure 685 extending in the second direction D2 may be divided, in the second direction D2, into individualized fourth gate structures by the second division pattern 630. An upper portion of a sidewall in the second direction D2 of the fourth gate electrode 675 at an end portion in the second direction D2 of the fourth gate structure 685 may not be covered by the fourth gate insulation pattern 665, and the fourth gate insulation pattern 665 may cover a lower portion of a sidewall in the second direction D2 of the fourth gate electrode 675. In this case, the fourth gate insulation pattern 665 may be interposed between a lower portion of the second division pattern 630 and a lower portion of the fourth gate electrode 675, and the sixth insulating interlayer 800 may be interposed between an upper portion of the second division pattern 630 and an upper portion of the fourth gate electrode 675.

The second source/drain layer 610 may be formed on a portion of the second active pattern 505 adjacent to each of the third and fourth gate structures 680 and 685, and may contact sidewalls of the semiconductor patterns 524 at a plurality of levels, respectively, to be connected thereto. An upper portion of the second source/drain layer 610 may contact an outer sidewall of the second gate spacer 585.

In an example embodiment, the second source/drain layer 610 may include or may be formed of single crystalline silicon-germanium doped with p-type impurities. In an embodiment, the second source/drain layer 610 may include or may be formed of single crystalline silicon doped with n-type impurities or single crystalline silicon carbide doped with n-type impurities.

The fifth insulating interlayer 620 may be formed on the second active pattern 505 and the second isolation pattern 530 to cover the second source/drain layer 610.

The third and fourth contact plug structures 720 and 740 may correspond to the first and second contact plug structures 370 and 410, respectively, of FIGS. 1 to 4. Thus, may extend through the fifth insulating interlayer 620 to contact an upper surface of the second source/drain layer 610, and the second plug spacer 690 may be formed on a sidewall of each of the third and fourth contact plug structures 720 and 740.

In an example embodiment, the second plug spacer 690 may extend through the fifth insulating interlayer 620 to contact an outer sidewall of the second gate spacer 585. In an embodiment, the second plug spacer 690 may extend through the fifth insulating interlayer 620, but not contact the outer sidewall of the second gate spacer 585. FIG. 35 shows that the second plug spacer 690 contacts the outer sidewall of the second gate spacer 585.

The third contact plug structure 720 may include a fifth conductive pattern 710 on the second source/drain layer 610 and the fifth insulating interlayer 620, and a third barrier pattern 700 covering a lower surface and a lower sidewall of the fifth conductive pattern 710. Additionally, the fourth contact plug structure 740 may further include a sixth conductive pattern 730 contacting upper surfaces of the fifth conductive pattern 710 and the third barrier pattern 700 in addition to the fifth conductive pattern 710 and the third barrier pattern 700. Thus, an upper surface of the fourth contact plug structure 740 may be higher than an upper surface of the third contact plug structure 720. An upper surface of the fifth conductive pattern 710 included in the fourth contact plug structure 740 may be slightly higher than an upper surface of the fifth conductive pattern 710 included in the third contact plug structure 720.

The second division pattern 630 may be formed between the third contact plug structures 720 each of which may extend in the second direction D2. An upper portion of a sidewall in the second direction D2 of the fifth conductive pattern 710 at an end portion of the third contact plug structure 720 in the second direction D2 may not be covered by the third barrier pattern 700, and the third barrier pattern 700 may cover a lower portion of the sidewall in the second direction D2 of the fifth conductive pattern 710. In this case, the third barrier pattern 700 may be interposed between a lower portion of the second plug spacer 690 and a lower portion of the fifth conductive pattern 710, and the sixth insulating interlayer 600 may be interposed between an upper portion of the second plug spacer 690 and an upper portion of the fifth conductive pattern 710.

An uppermost surface of a portion of the second plug spacer 690 on each of opposite sidewalls in the first direction D1 of the fourth contact plug structure 740 may be substantially coplanar with an upper surface of the fourth contact plug structure 740. In an embodiment, the uppermost surface of the portion of the second plug spacer 690 on each of opposite sidewalls in the first direction D1 of the fourth contact plug structure 740 may be substantially coplanar with the upper surface of the third contact plug structure 720, like the upper surface of the portion of the second plug spacer 690 on each of opposite sidewalls in the first direction D1 of the third contact plug structure 720.

The sixth insulating interlayer 800 may be formed on the fifth insulating interlayer 620 to contact upper surfaces of the fourth gate structure 685, the third contact plug structure 720, the second gate spacer 585 and the second plug spacer 690, and the seventh insulating interlayer 810 may be formed on the sixth insulating interlayer 800, the third gate structure 680, the fourth contact plug structure 740, the second gate spacer 585 and the second plug spacer 690.

Each of the fourth to sixth wirings 822, 824 and 826 may extend through the seventh insulating interlayer 810. The fourth wiring 822 may contact an upper surface of the third gate structure 680, and each of the fifth and sixth wirings 824 and 826 may contact an upper surface of the fourth contact plug structure 740.

FIGS. 37 to 64 are plan views and cross-sectional views illustrating a semiconductor device in accordance with example embodiments. Particularly, FIGS. 37, 39, 42, 47, 52, 55, 58 and 61 are the plan views, FIGS. 38, 40-41, 43-46, 48-51, 53-54, 56-57, 59-60 and 62-64 are the cross-sectional views.

FIGS. 38, 40, 48, 50, 53 and 62 are cross-sectional views taken along lines E-E' of corresponding plan views, respectively, FIGS. 41, 43, 45, 51, 54, 56 and 59 are cross-sectional views taken along lines F-F' of corresponding plan views, respectively, and FIGS. 44, 46, 49, 57 and 60 are cross-sectional views taken along lines G-G' of corresponding plan views, respectively.

This method may include processes substantially the same as or similar to those illustrated with reference to FIGS. 5 to 32 and FIGS. 1 to 4, and thus repeated explanations thereof are omitted herein.

Figure 37:
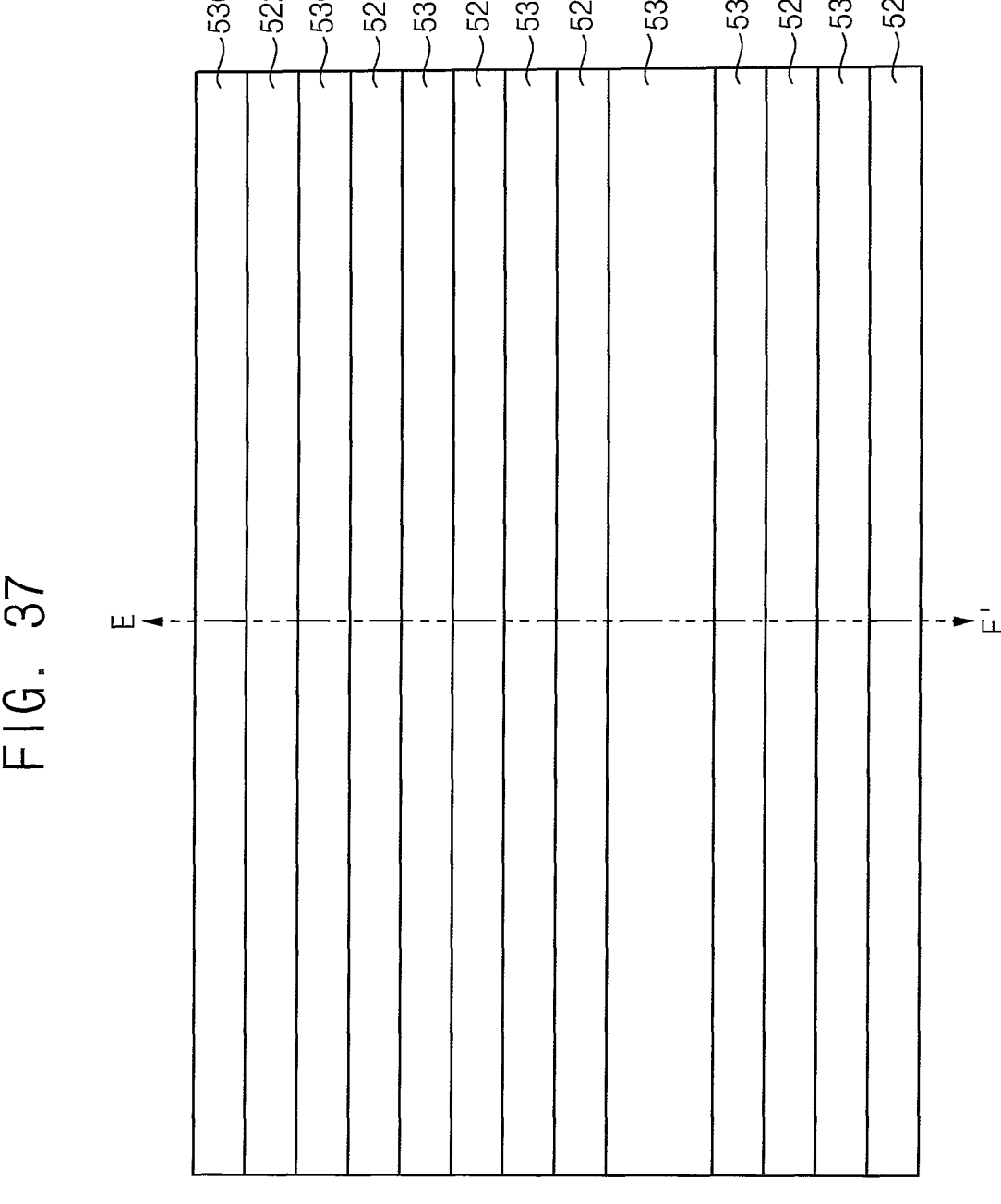
Figure 38:
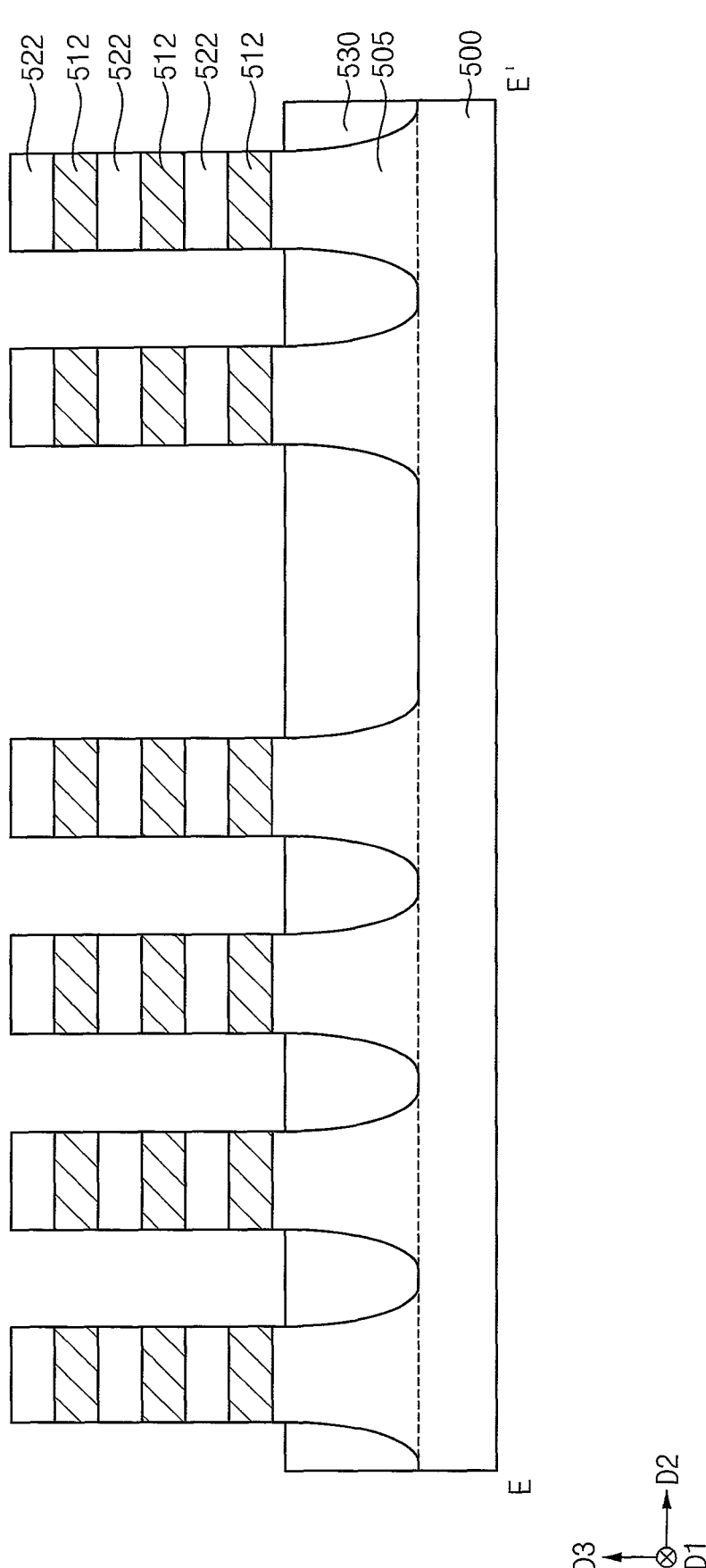
FIG. 38 is a cross-sectional view taken along line E-E' of FIG. 37.

Referring to FIGS. 37 and 38, a sacrificial layer and a semiconductor layer may be alternately and repeatedly stacked on a substrate 500, a third etching extending in the first direction D1 mask may be formed on an uppermost one of the semiconductor layers, and the semiconductor layers, the sacrificial layers and an upper portion of the substrate 500 may be etched using the third etching mask.

Thus, a second active pattern 505 extending in the first direction D1 may be formed on the substrate 500, and a fin structure including sacrificial lines 512 and semiconductor lines 522 alternately and repeatedly stacked in the third direction D3 may be formed on the second active pattern 505. In example embodiments, a plurality of fin structures may be spaced apart from each other in the second direction D2 on the substrate 500.

FIG. 38 shows three sacrificial lines 512 and three semiconductor lines 522 at three levels, respectively, however, the inventive concept may not be limited thereto. The sacrificial lines 512 may include or may be formed of a material having etching selectivity with respect to the substrate 500 and the semiconductor lines 522, e.g., silicon-germanium.

A second isolation pattern 530 may be formed on the substrate 500 to cover a sidewall of the second active pattern 505.

Figure 39:
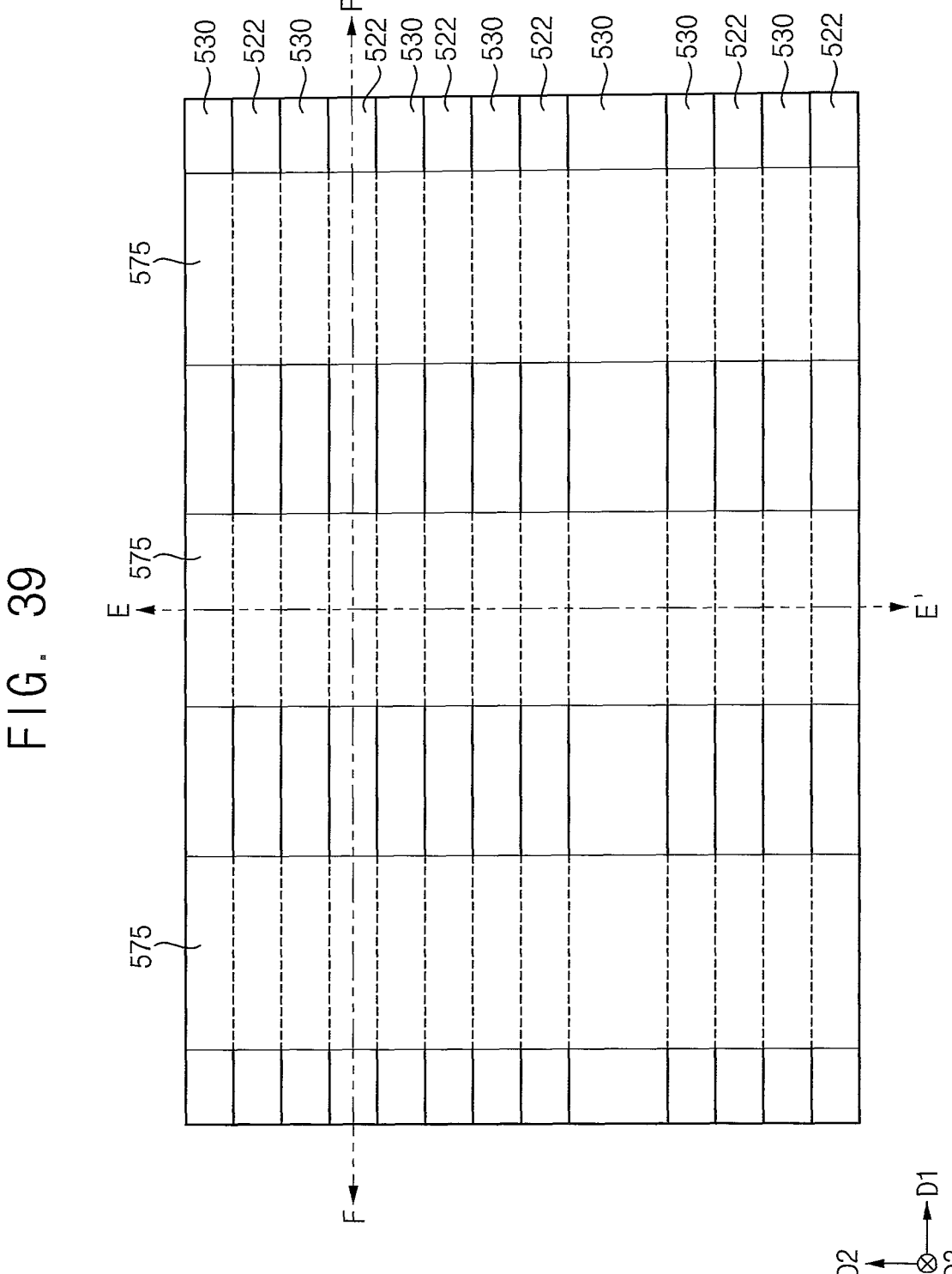
Figure 40:
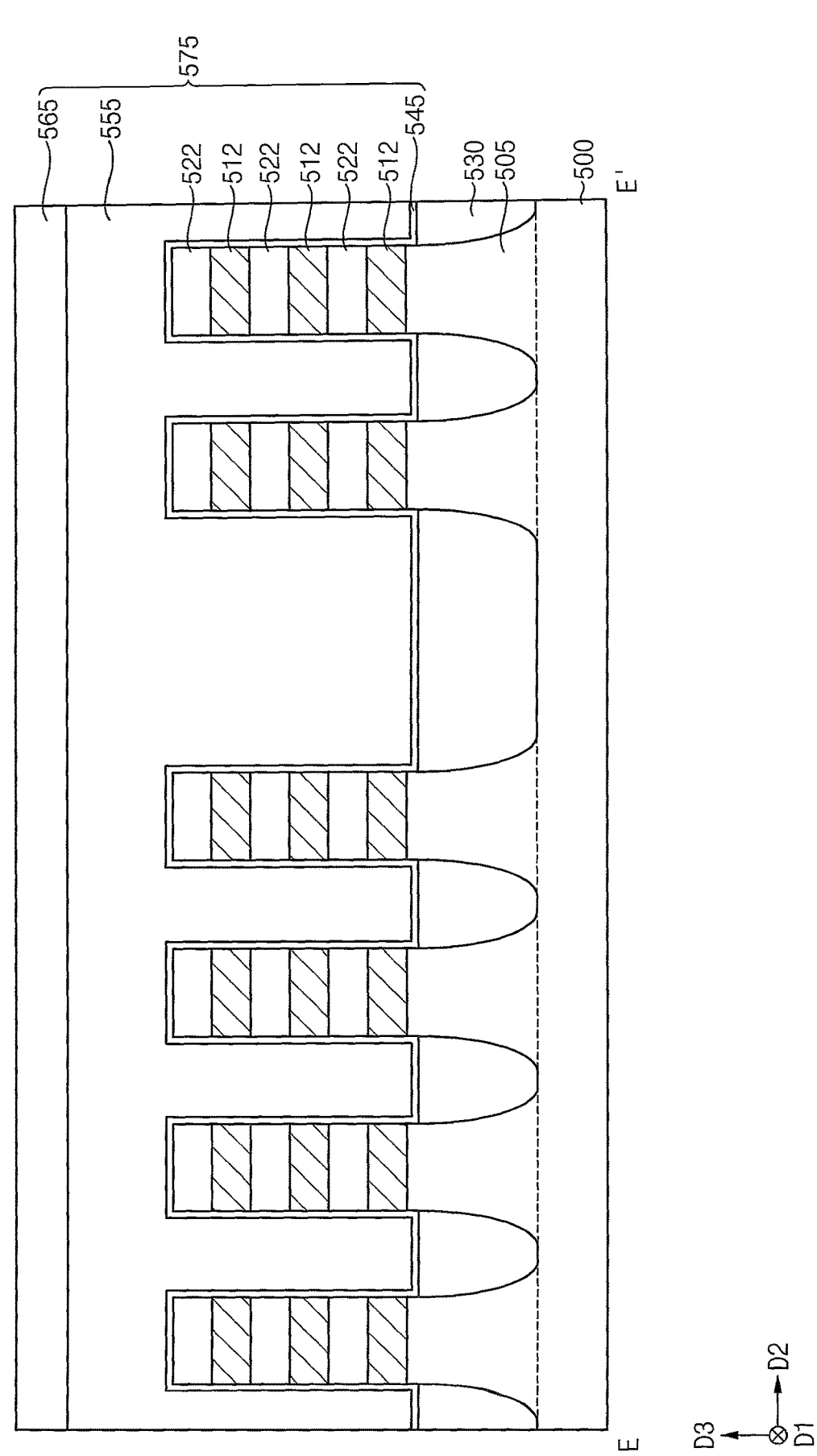
FIGS. 40 and 41 are cross-sectional views taken along lines E-E' and F-F' of FIG. 39, respectively.
Figure 41:
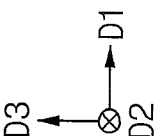

Referring to FIGS. 39 to 41, a second dummy gate structure 575 may be formed on the substrate 500 to partially cover the fin structure and the second isolation pattern 530.

Particularly, a second dummy gate insulation layer, a second dummy gate electrode layer and a second dummy gate mask layer may be sequentially formed on the substrate 500 having the fin structure and the second isolation pattern 530 thereon, a fourth etching mask extending in the second direction D2 may be formed on the second dummy gate mask layer, and the second dummy gate mask layer may be etched using the fourth etching mask to form a second dummy gate mask 565.

The second dummy gate electrode layer and the second dummy gate insulation layer may be etched using the second dummy gate mask 565 as an etching mask to form a second dummy gate electrode 555 and a second dummy gate insulation pattern 545, respectively, on the substrate 500.

The second dummy gate insulation pattern 545, the second dummy gate electrode 555 and the second dummy gate mask 565 sequentially stacked in the third direction D3 on the second active pattern 505 and a portion of the second isolation pattern 530 adjacent thereto may form a second dummy gate structure 575. In example embodiments, the second dummy gate structure 575 may extend in the second direction D2 on the fin structure and the second isolation pattern 530, and may cover an upper surface and opposite sidewalls in the second direction D2 of the fin structure.

Figure 42:
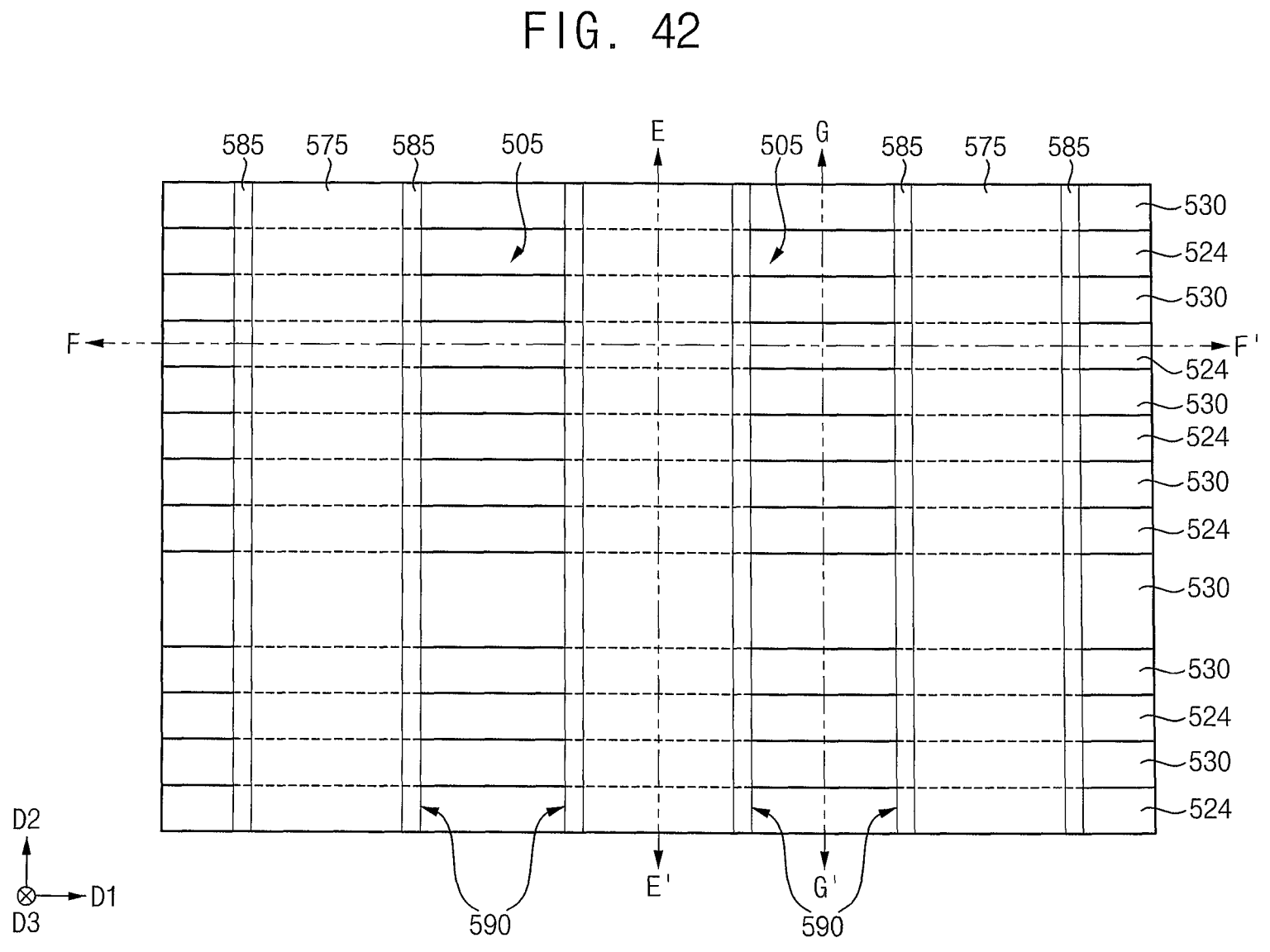
Figure 43:
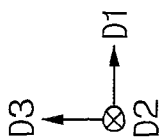
FIGS. 43 and 45 are cross-sectional views taken along line F-F' of FIG. 42, and FIGS. 44 and 46 are cross-sectional views taken along line G-G' of FIG. 42.
Figure 44:
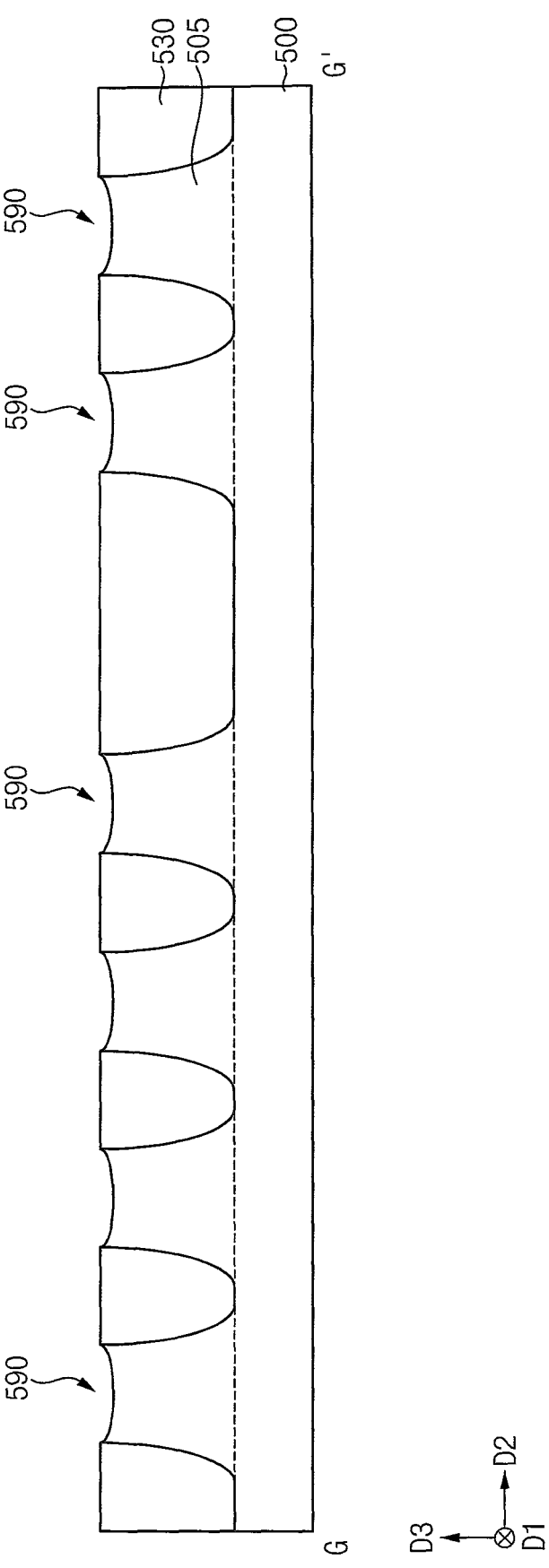

Referring to FIGS. 42 to 44, a second gate spacer 585 may be formed on a sidewall of the second dummy gate structure 575.

Particularly, a second spacer may be formed on the substrate 500 having the fin structure, the second isolation pattern 530 and the second dummy gate structure 575 thereon, and may be anisotropically etched to form the second gate spacer 585 covering each of opposite sidewalls in the first direction D1 of the second dummy gate structure 575.

The fin structure and an upper portion of the second active pattern 505 may be etched using the second dummy gate structure 575 and the second gate spacer 585 as an etching mask to form a fourth opening 590.

Thus, the sacrificial lines 512 and the semiconductor lines 522 under the second dummy gate structure 575 and the second gate spacer 585 may be transformed into sacrificial patterns 514 and semiconductor patterns 524, respectively, and the fin structure extending in the first direction D1 may be divided into a plurality of parts spaced apart from each other in the first direction D1.

Hereinafter, the second dummy gate structure 575, the second gate spacer 585 on each of opposite sidewalls of the second dummy gate structure 575 and the fin structure may be referred to as a stack structure. In example embodiments, the stack structure may extend in the second direction, and a plurality of stack structures may be spaced apart from each other in the first direction D1.

In an example embodiment, the fourth opening 590 may have a large volume. Thus, a sidewall of the fourth opening 590 may have a convex curve shape. A sidewall in the first direction D1 of each of the semiconductor patterns 524 may not be perpendicular to an upper surface of the substrate 500, but may have a varying slope, and a length in the first direction D1 of each of the semiconductor patterns 524 may not be constant in the third direction D3.

In an embodiment, the sidewall of the fourth opening 590 may have a linear shape extending in the third direction D3. Thus, the sidewall in the first direction D1 of each of the semiconductor patterns 524 may be substantially perpendicular to the upper surface of the substrate 500, and the length in the first direction D1 of each of the semiconductor patterns 524 may be constant in the third direction D3.

In some embodiments, a portion of each of the sacrificial patterns 514 adjacent to the fourth opening 590 may be removed to form a gap, and an inner spacer (not shown) may be formed in the gap.

Figure 45:
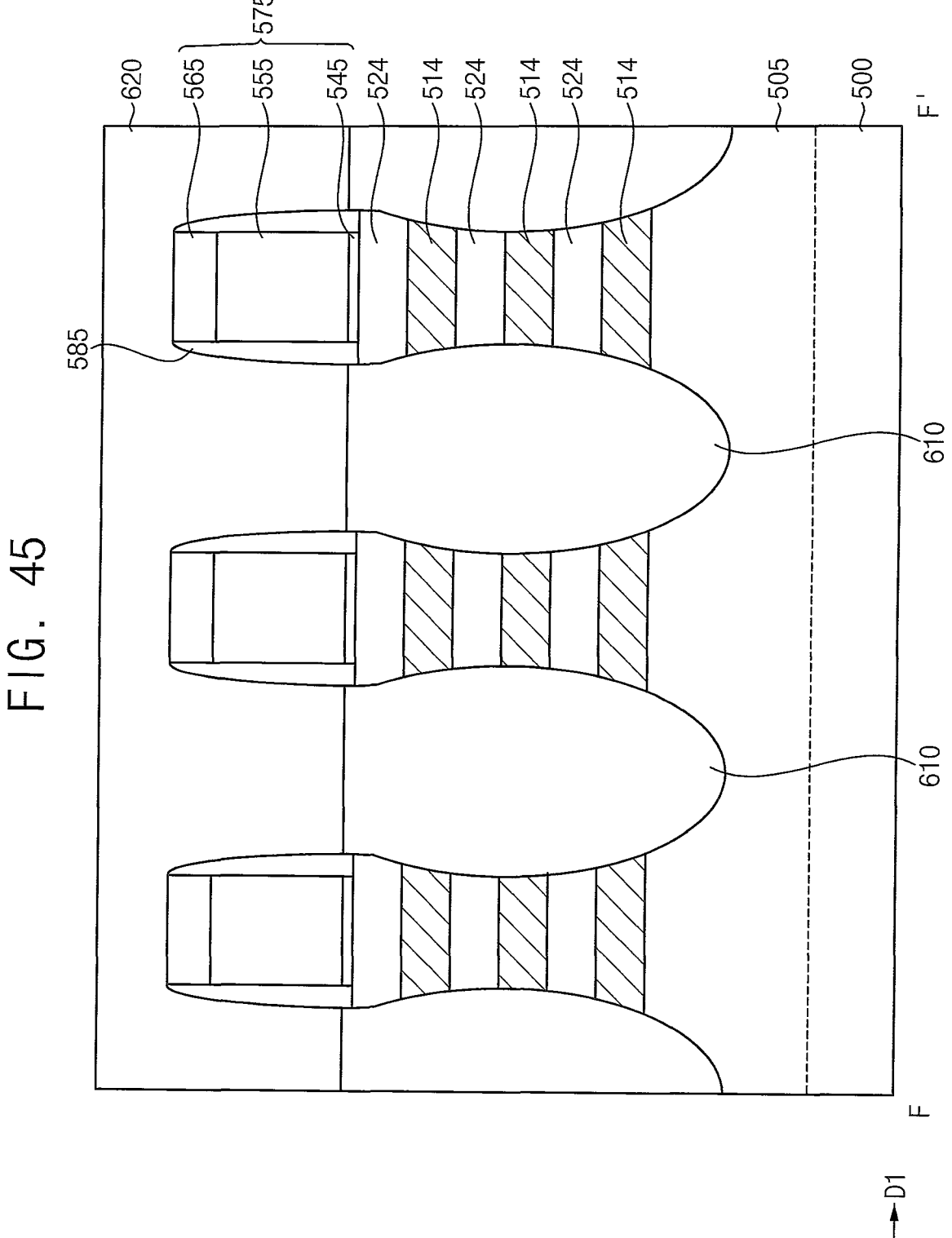
Figure 46:
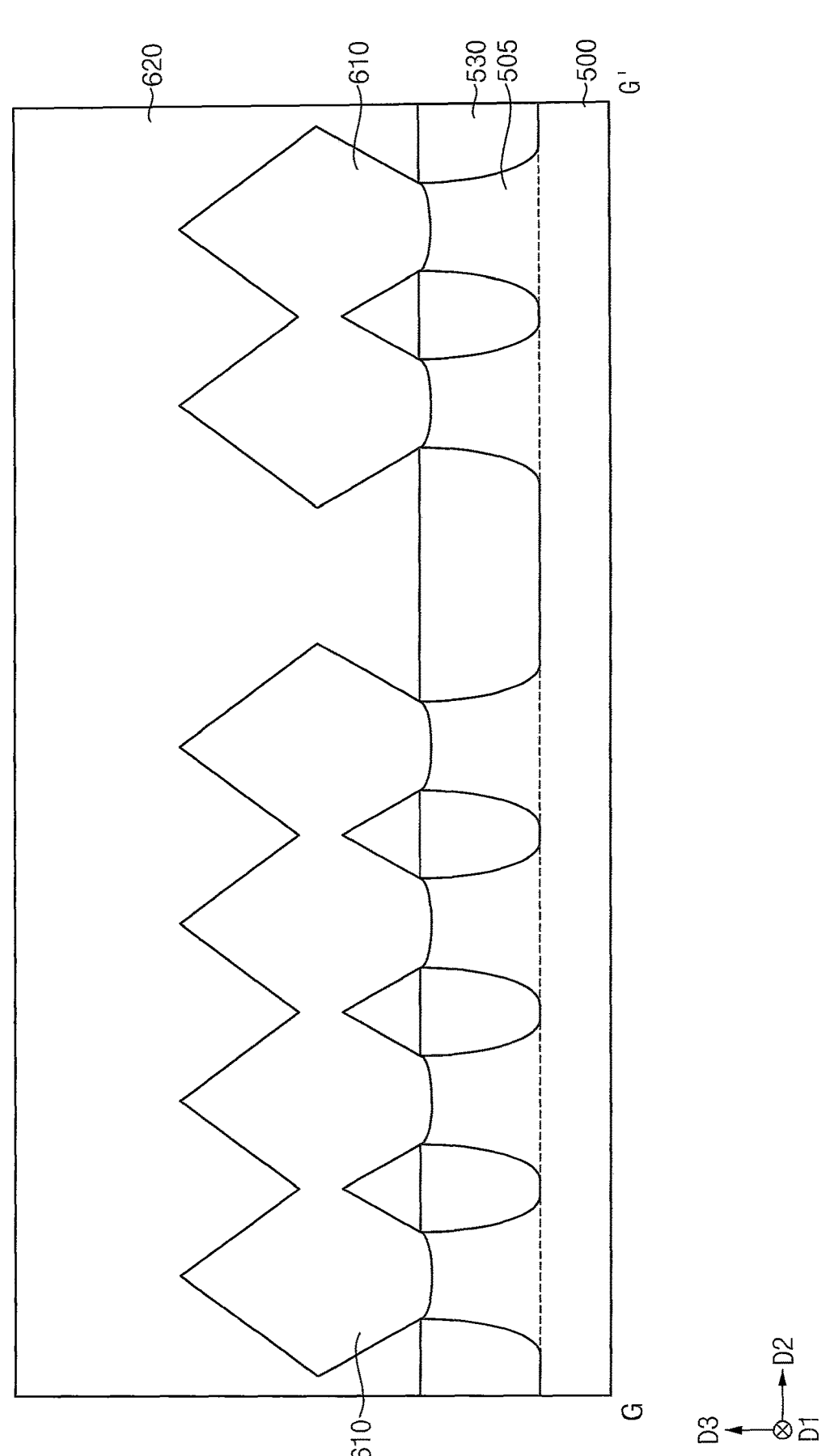

Referring to FIGS. 45 and 46, a selective epitaxial growth (SEG) process may be performed using the upper surface of the second active pattern 505 and the sidewalls of the semiconductor patterns 524 and the sacrificial patterns 514 exposed by the fourth opening 590 as a seed to form a second source/drain layer 610 on an inner wall of the fourth opening 590.

In an example embodiment, a single crystalline silicon-germanium layer doped with p-type impurities may be formed as the second source/drain layer 610. In an embodiment, a single crystalline silicon layer doped with n-type impurities or a single crystalline silicon carbide layer doped with n-type impurities may be formed as the second source/drain layer 610.

A fifth insulating interlayer 620 may be formed on the substrate 500 to cover the stack structure and the second source/drain layer 610.

Figure 47:
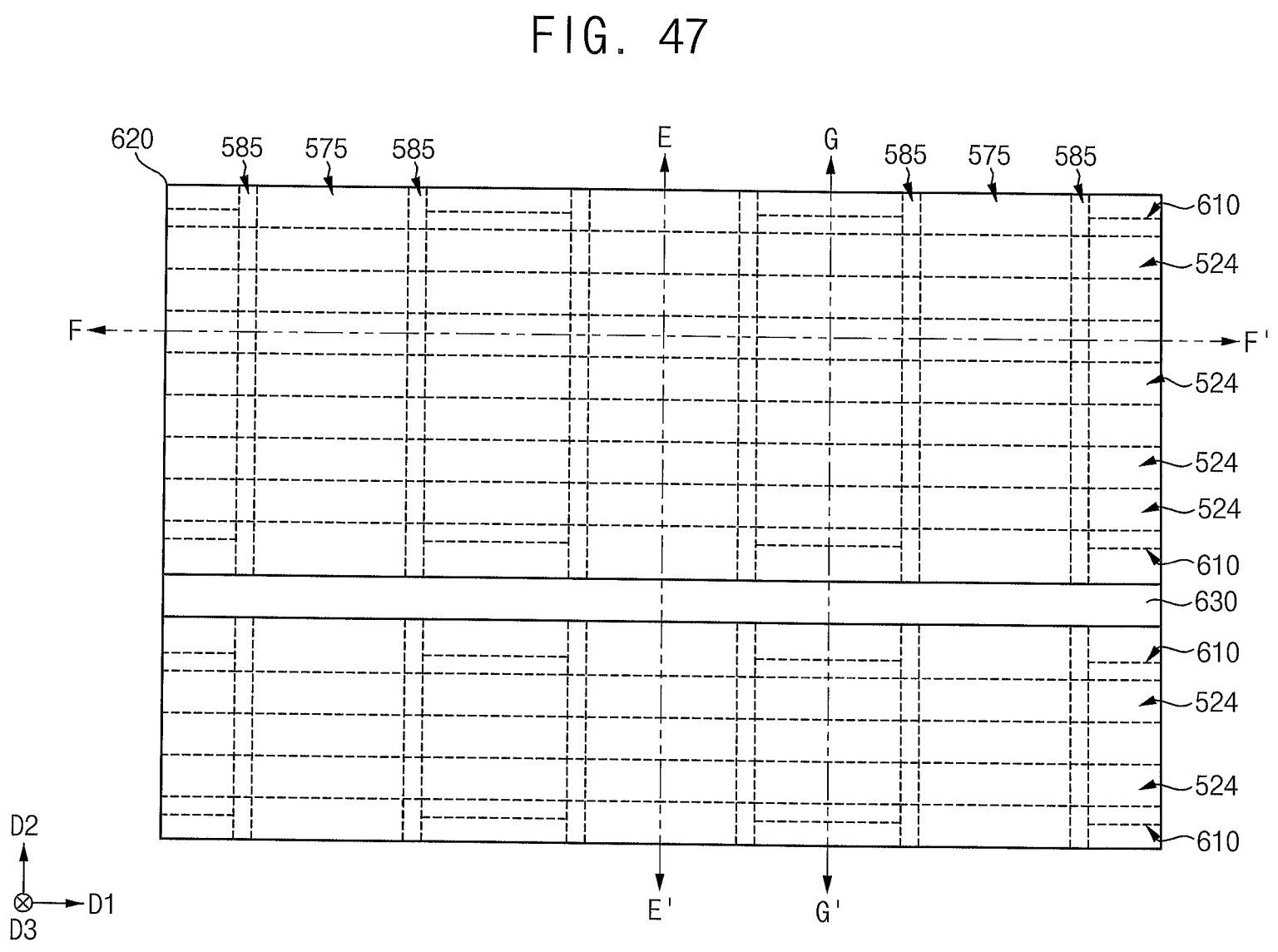
Figure 48:
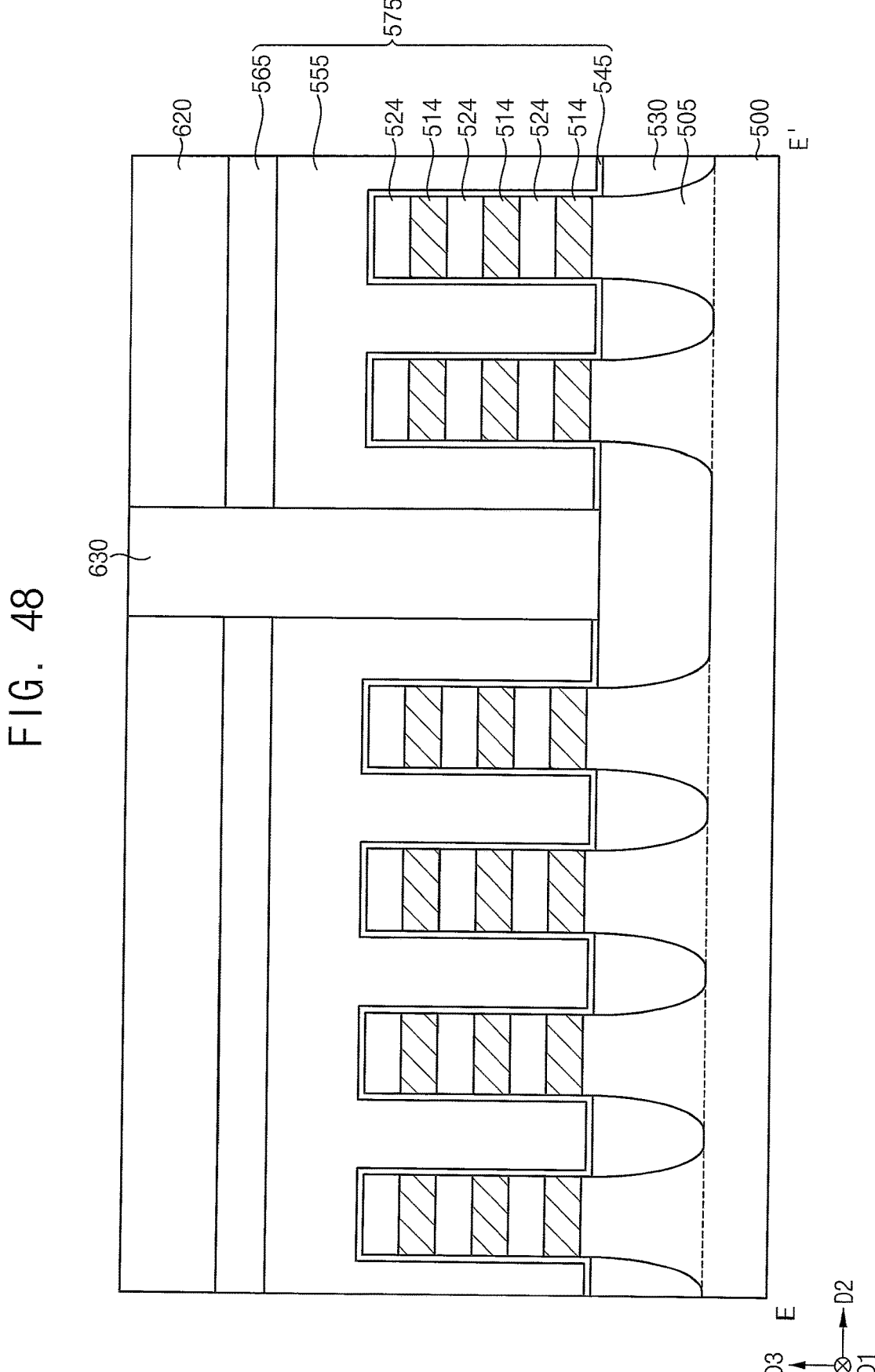
Figure 49:
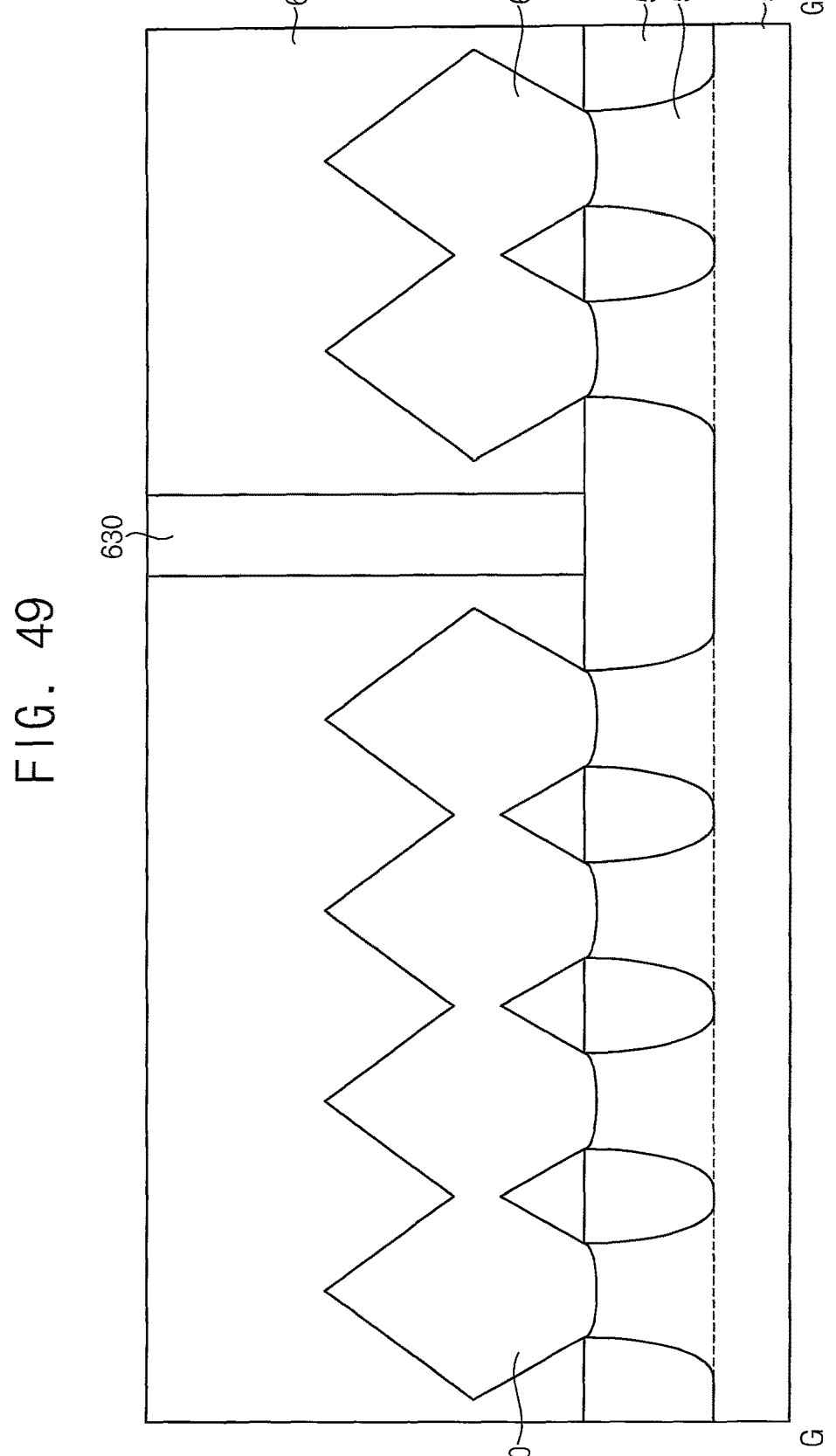

Referring to FIGS. 47 to 49, processes substantially the same as or similar to those illustrated with reference to FIGS. 11 to 13 may be performed.

Thus, a second division pattern 630 may be formed through the fifth insulating interlayer 620 and the second dummy gate structure 575 to extend in the first direction D1, and the second dummy gate structure 575 extending in the second direction D2 may be divided, in the second direction D2, into individualized second dummy gate structures.

Figure 51:
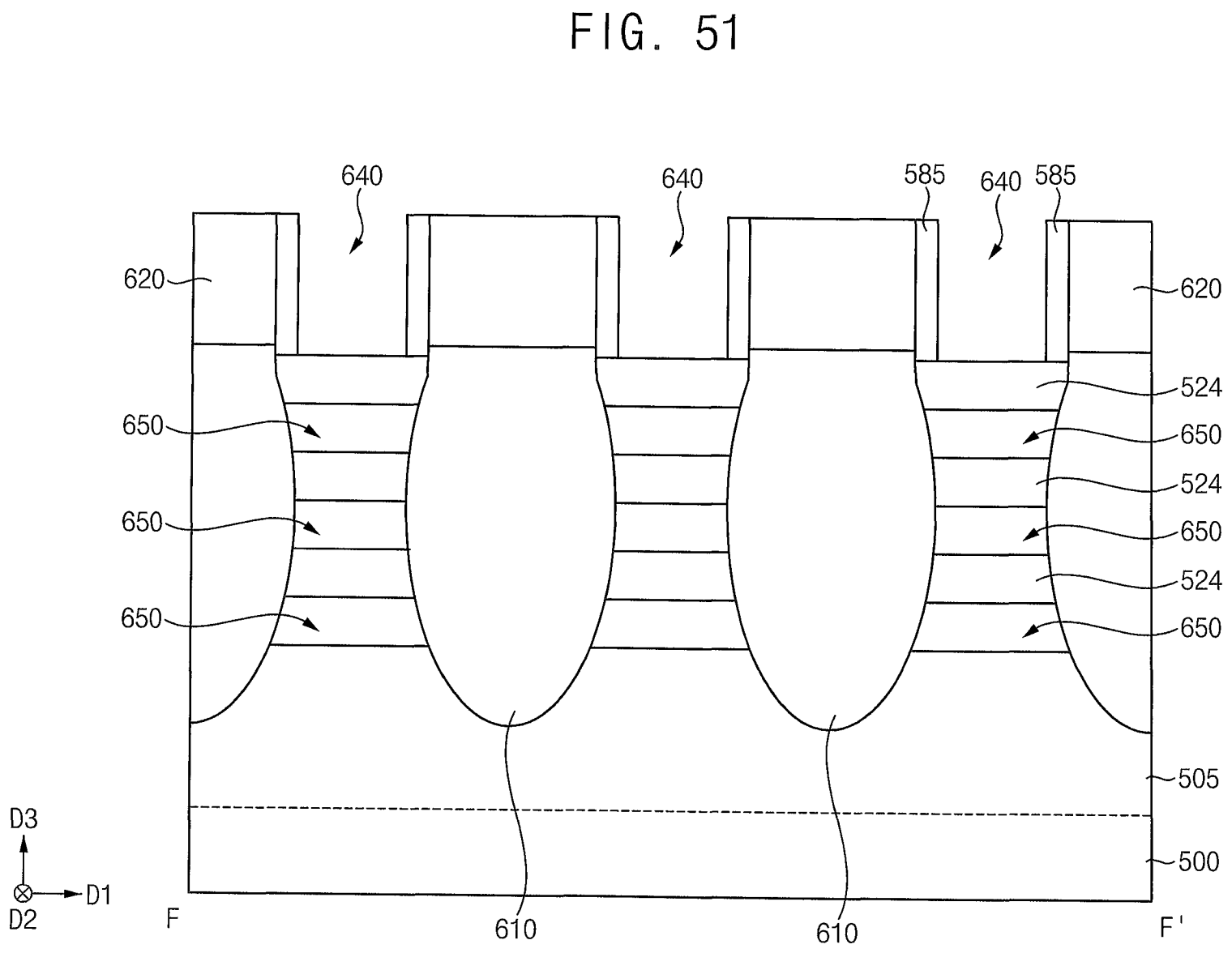

Referring to FIGS. 50 and 51, processes substantially the same as or similar to some of the processes illustrated with reference to FIGS. 14 and 15 may be performed.

Thus, a planarization process may be performed to expose an upper surface of the second dummy gate electrode 555 included in the stack structure by removing an upper portion of the fifth insulating interlayer 620 and the second dummy gate mask 565 included in the second dummy gate structure 575. In the planarization process, an upper portion of the second division pattern 630 and an upper portion of the second gate spacer 585 may also be removed.

The second dummy gate electrode 555, the second dummy gate insulation pattern 545 and the sacrificial patterns 514 may be removed by, e.g., a wet etching process and/or a dry etching process to form a fifth opening 640 exposing an inner sidewall of the second gate spacer 585 and an upper surface of an uppermost one of the semiconductor patterns 524, and to form a sixth opening 650 exposing a sidewall of the second source/drain layer 610, surfaces of the semiconductor patterns 524 and the upper surface of the second active pattern 505.

Figure 52:
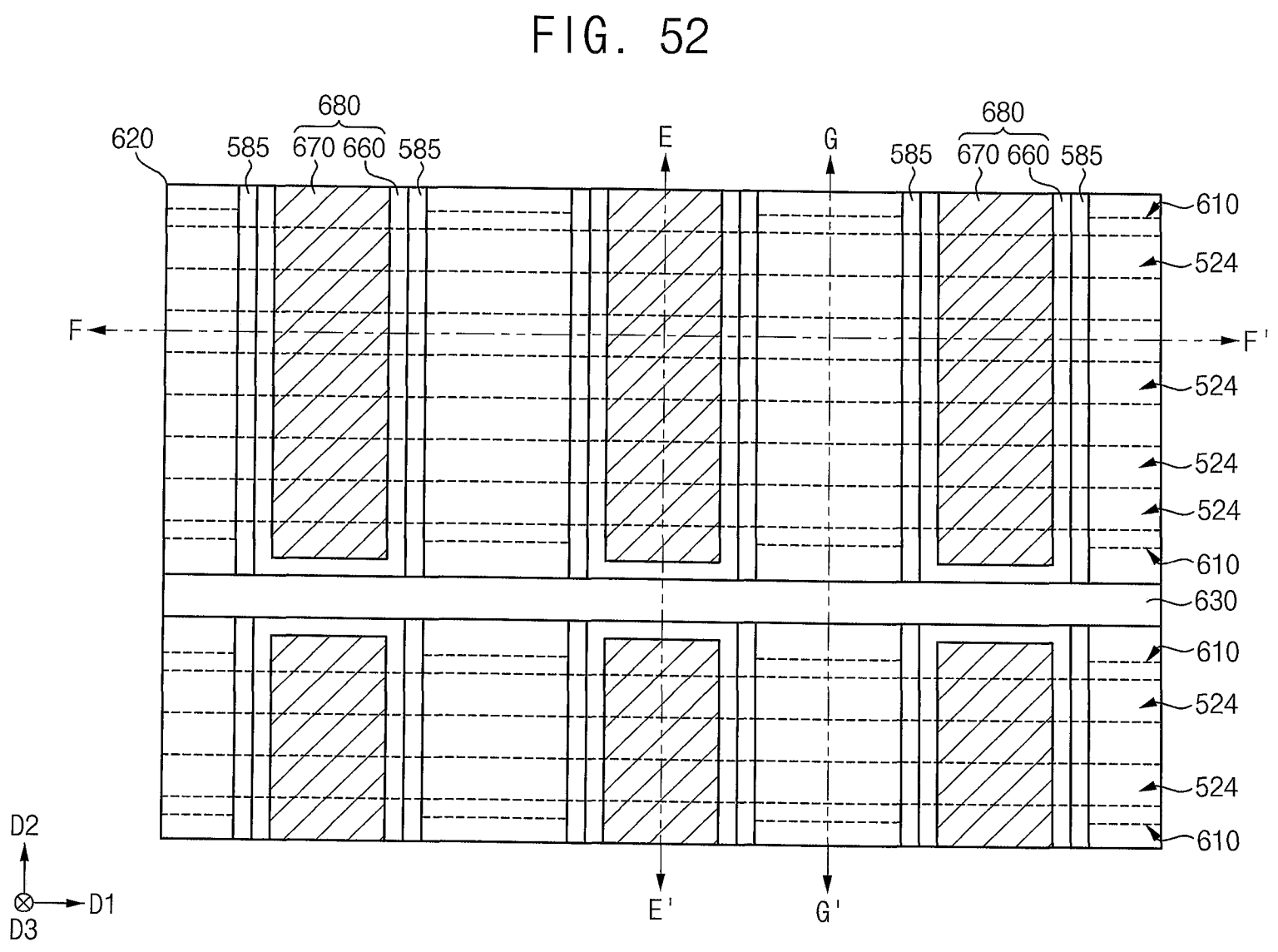
Figure 53:
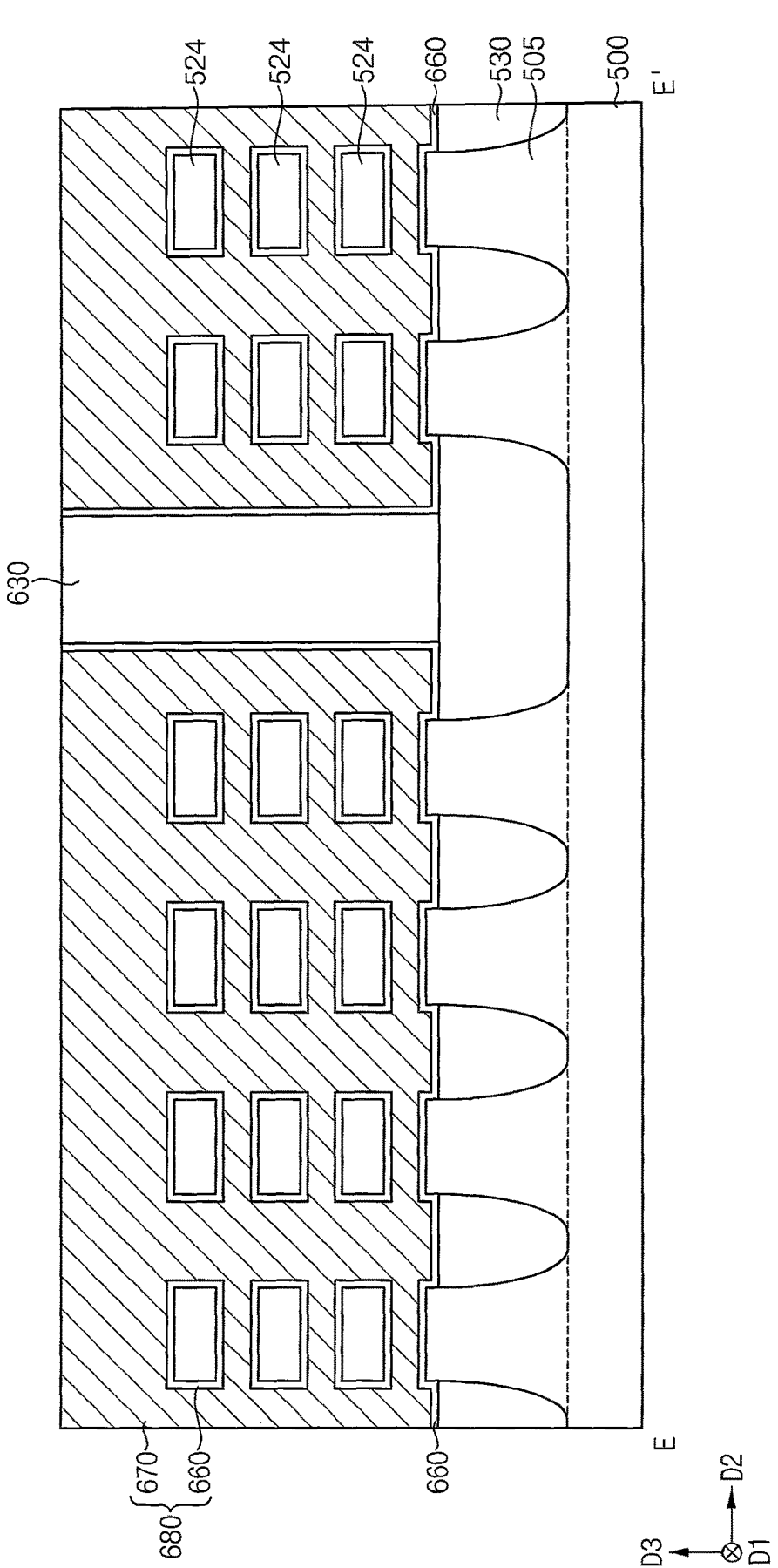
FIGS. 53 and 54 are cross-sectional views taken along lines E-E' and F-F' of FIG. 52, respectively.
Figure 54:
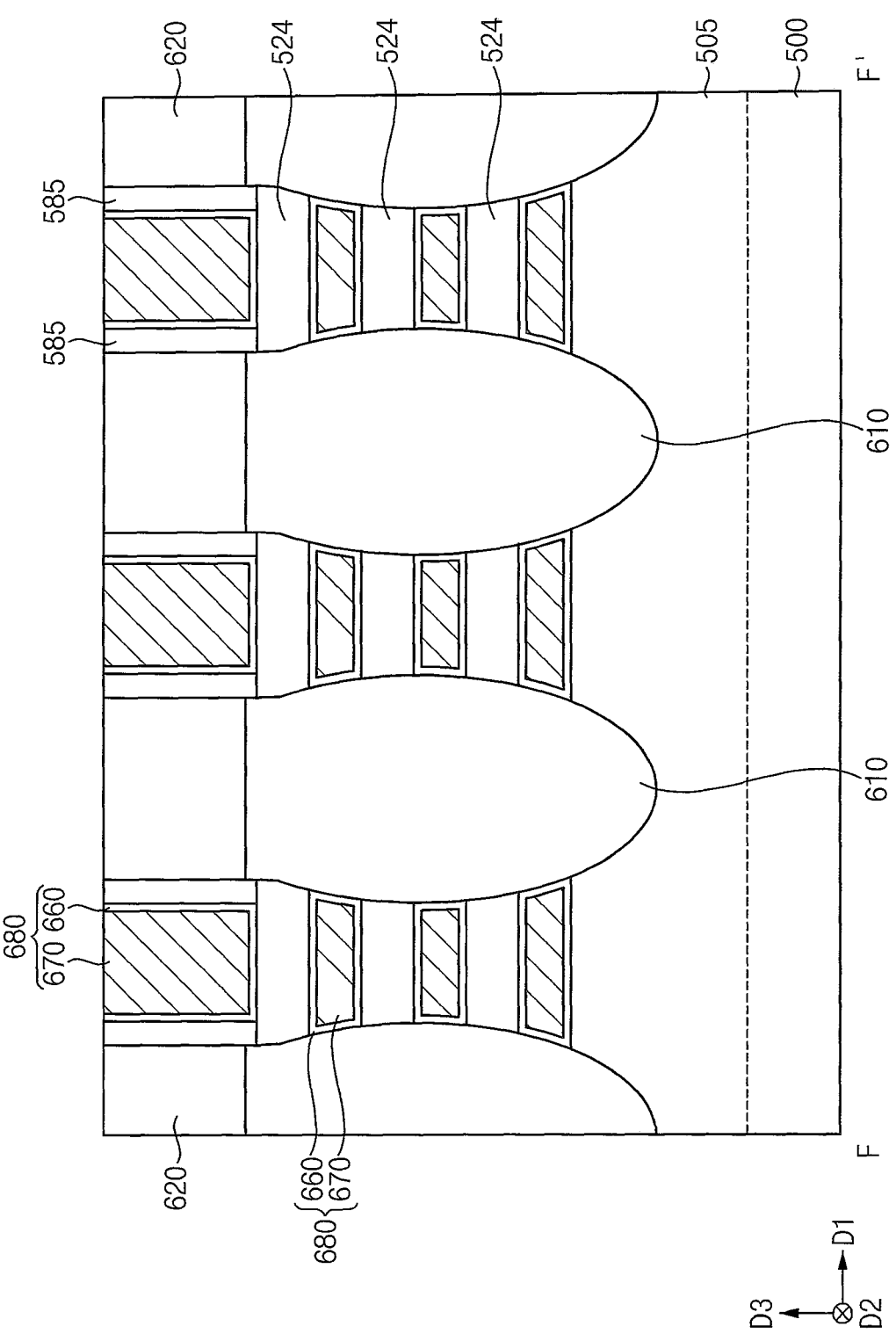

Referring to FIGS. 52 to 54, processes substantially the same as or similar to others of the processes illustrated with reference to FIGS. 14 and 15 may be performed.

Thus, a third gate structure 680 may be formed on the substrate 500 to fill the fifth and sixth openings 640 and 650. The third gate structure 680 may include a third gate insulation pattern 660 on the upper surface of the second active pattern 505, the upper surface of the second isolation pattern 530, the sidewall of the second source/drain layer 610, the surfaces of the semiconductor patterns 524, the inner sidewall of the second gate spacer 585 and the sidewall of the second division pattern 630 exposed by the fifth and sixth openings 640 and 650, and a third gate electrode 670 on the third gate insulation pattern 660 and filling the fifth and sixth openings 640 and 650.

In an example embodiment, an interface pattern (not shown) including, e.g., silicon oxide may be further formed on the upper surface of the second active pattern 505 and the surfaces of the semiconductor patterns 524.

Figure 55:
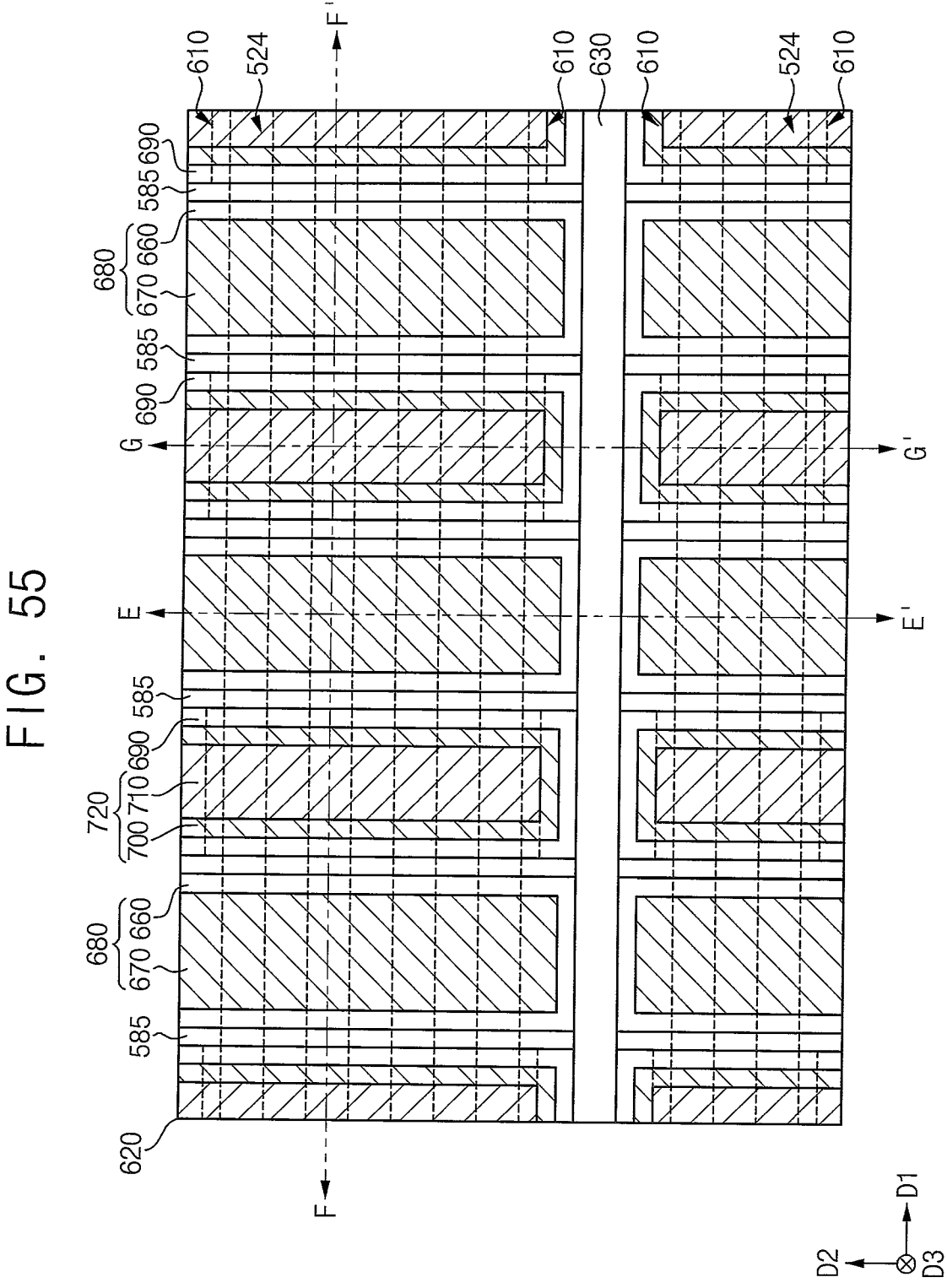
Figure 56:
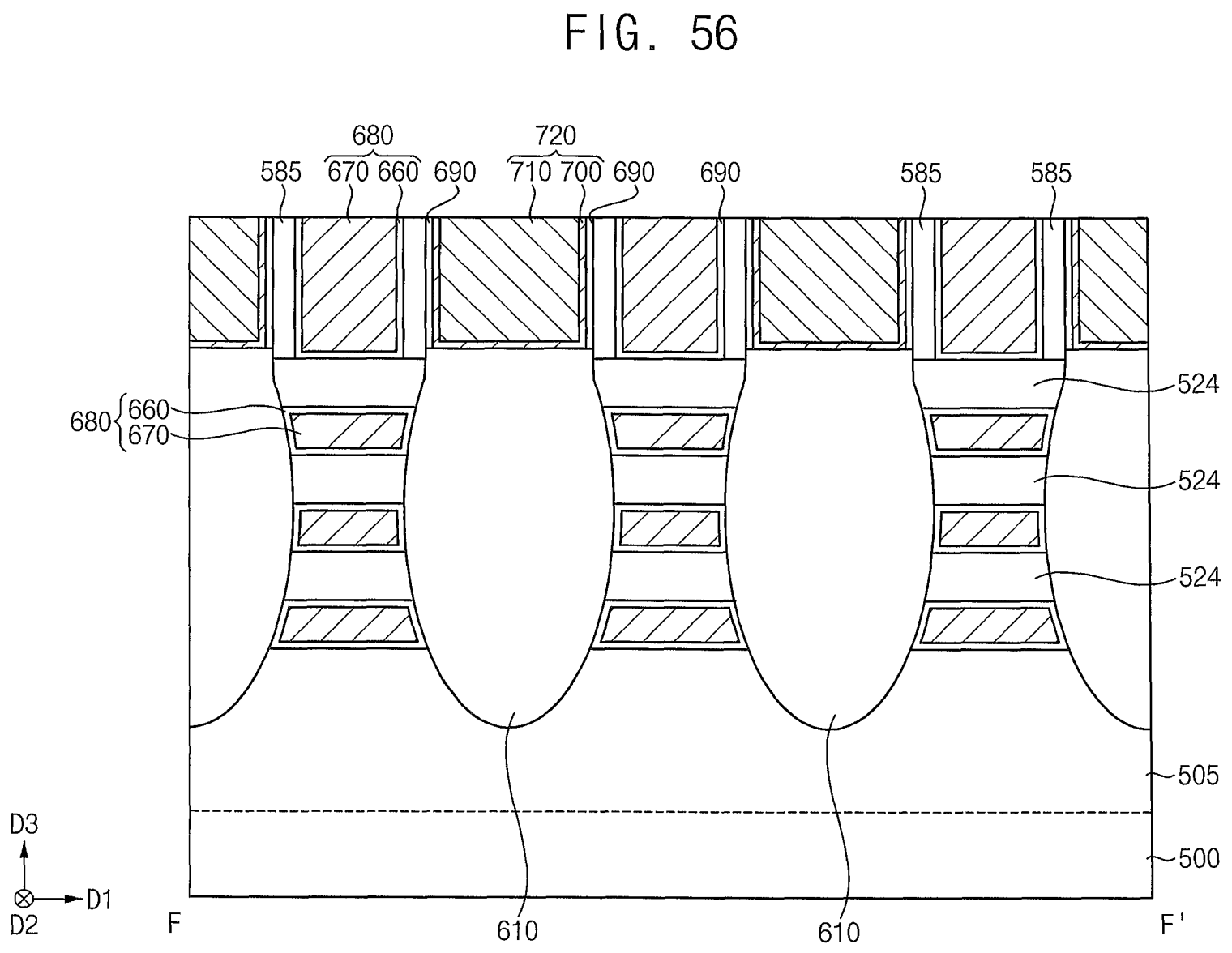
Figure 57:
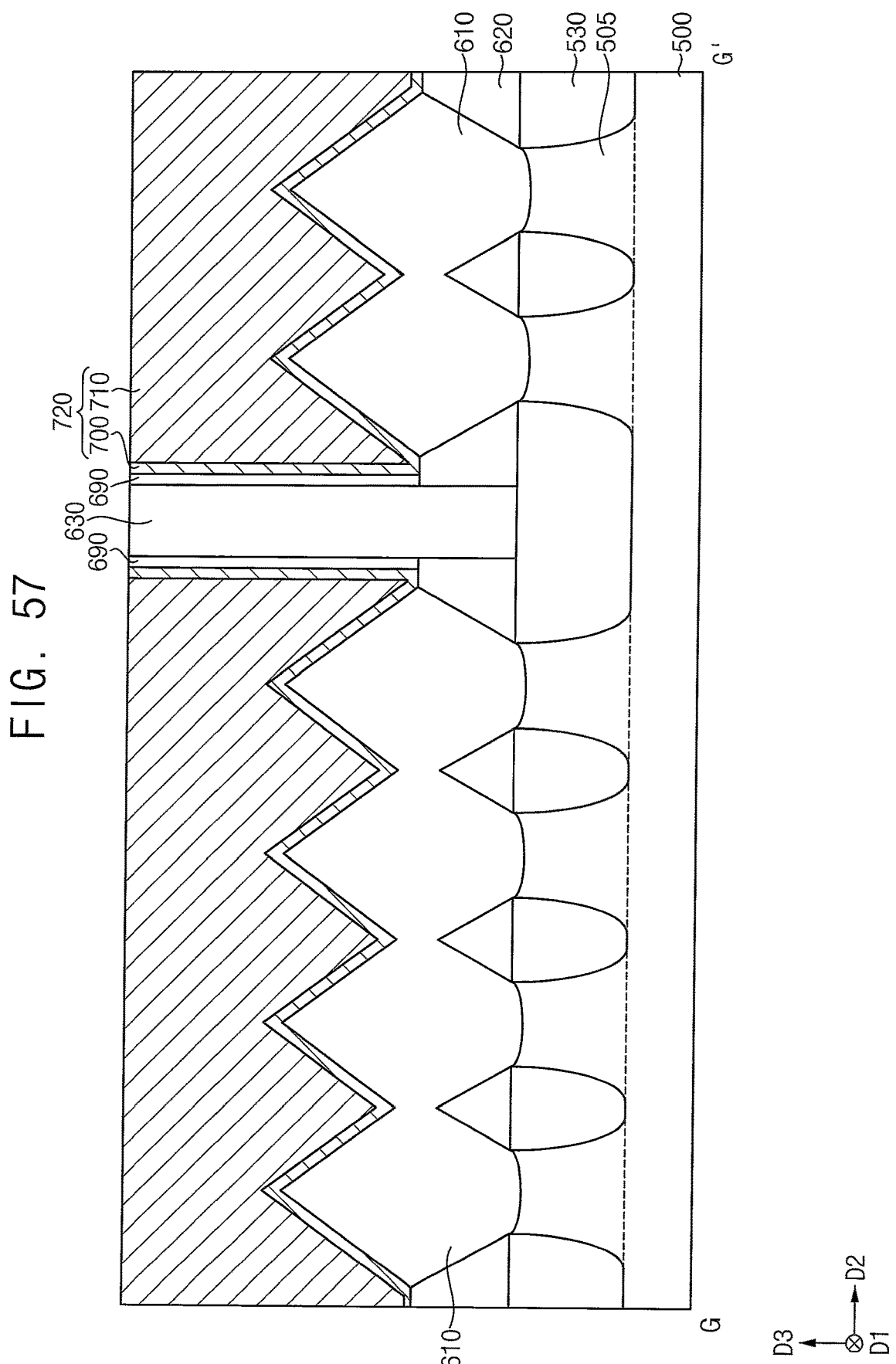

Referring to FIGS. 55 to 57, processes substantially the same as or similar to those illustrated with reference to FIGS. 17 to 23 may be performed.

Thus, a seventh opening may be formed through the fifth insulating interlayer 620 to expose an upper surface of the second source/drain layer 610, and a second plug spacer 690 and a third contact plug structure 720 may be formed in the seventh opening. The third contact plug structure 720 may include a fifth conductive pattern 710 and a third barrier pattern 700 covering a lower surface and a sidewall of the fifth conductive pattern 710.

Unlike that of FIGS. 18 to 20, the seventh opening may expose an outer sidewall of the second gate spacer 585, however, the inventive concept may not be limited thereto.

Figure 58:
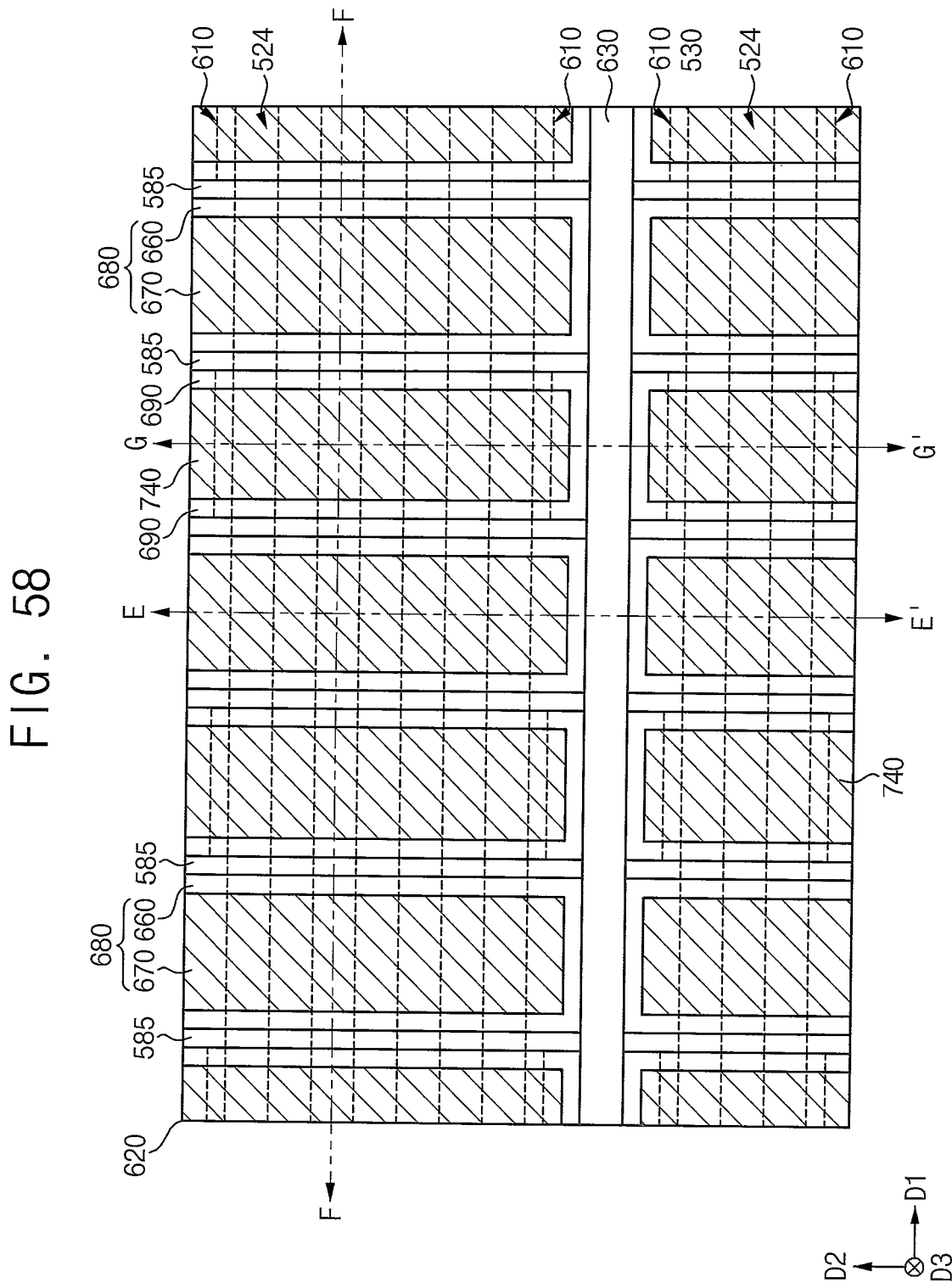
Figure 59:
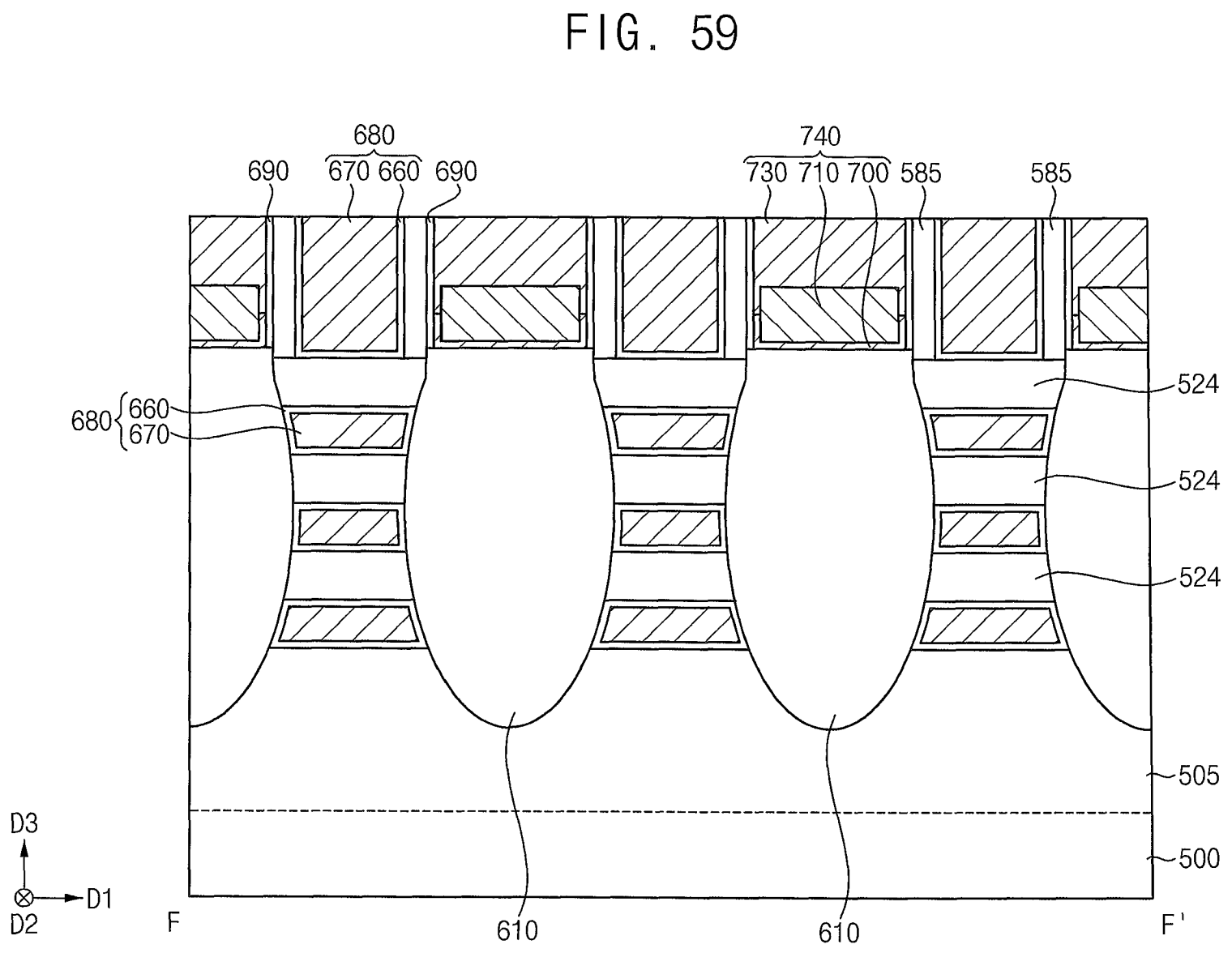
Figure 60:
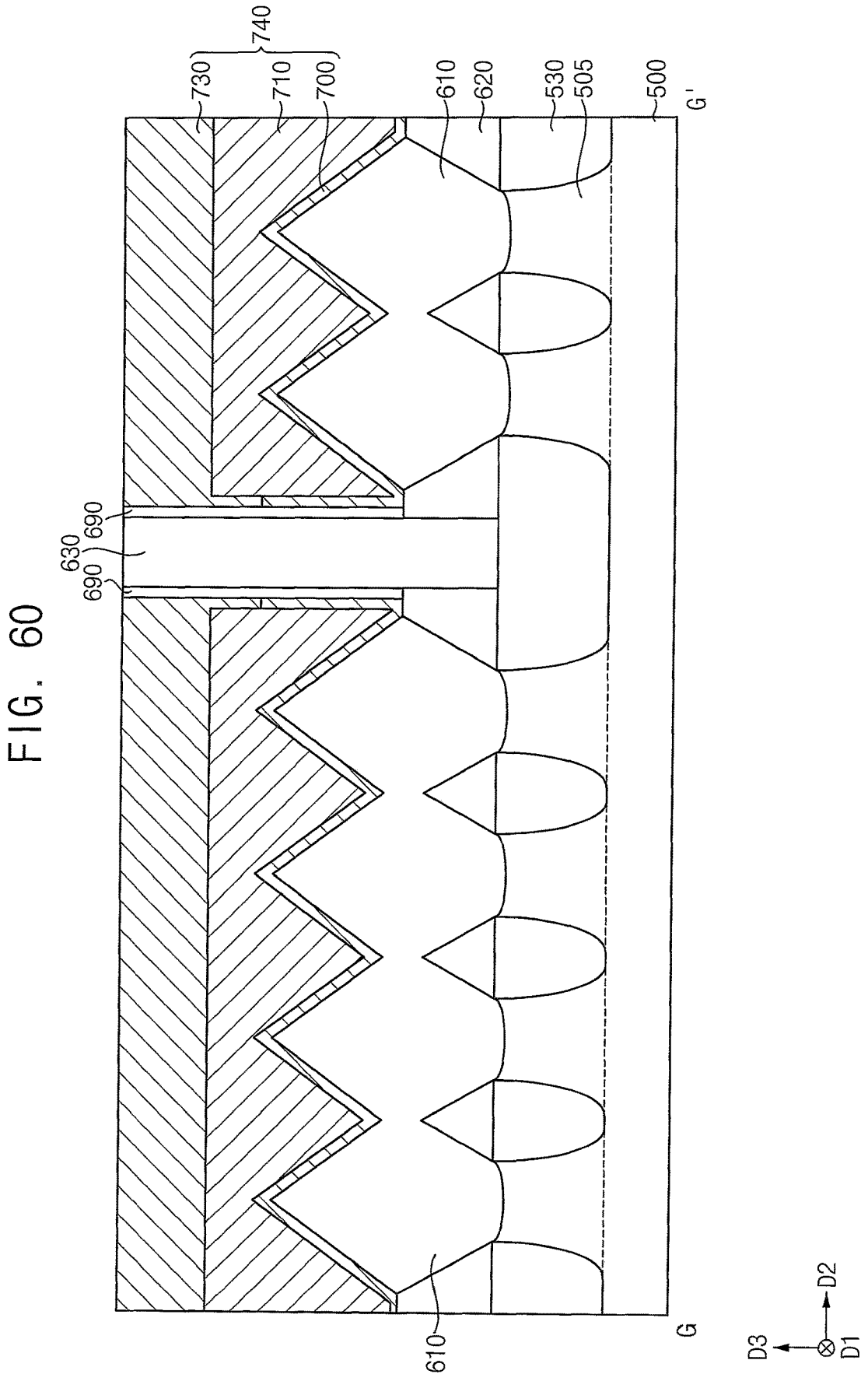
Figure 62:
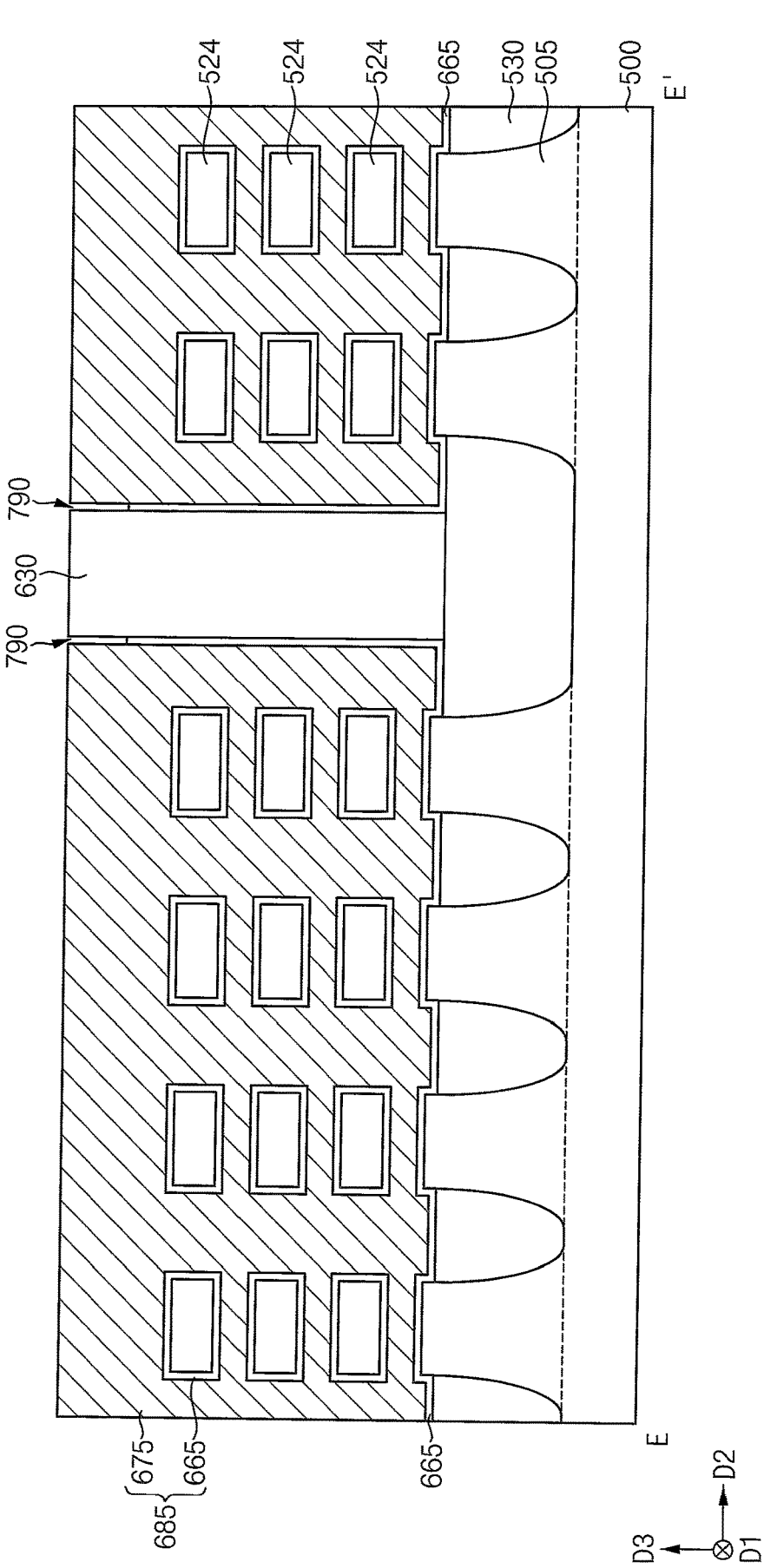
FIGS. 62, 63, and 64 are cross-sectional views taken along lines E-E' F-F', and G-G' of FIG. 61, respectively.
Figure 63:
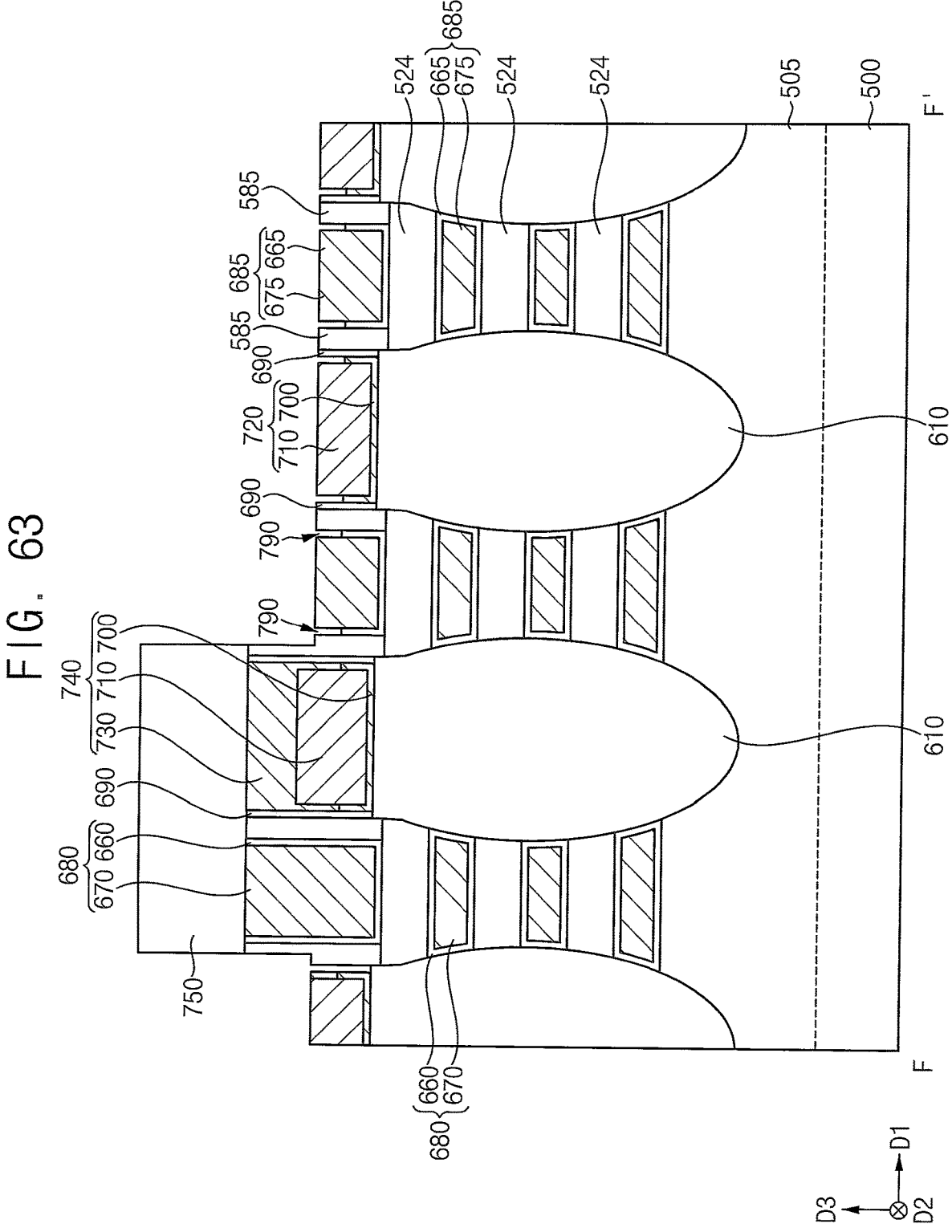
Figure 64:
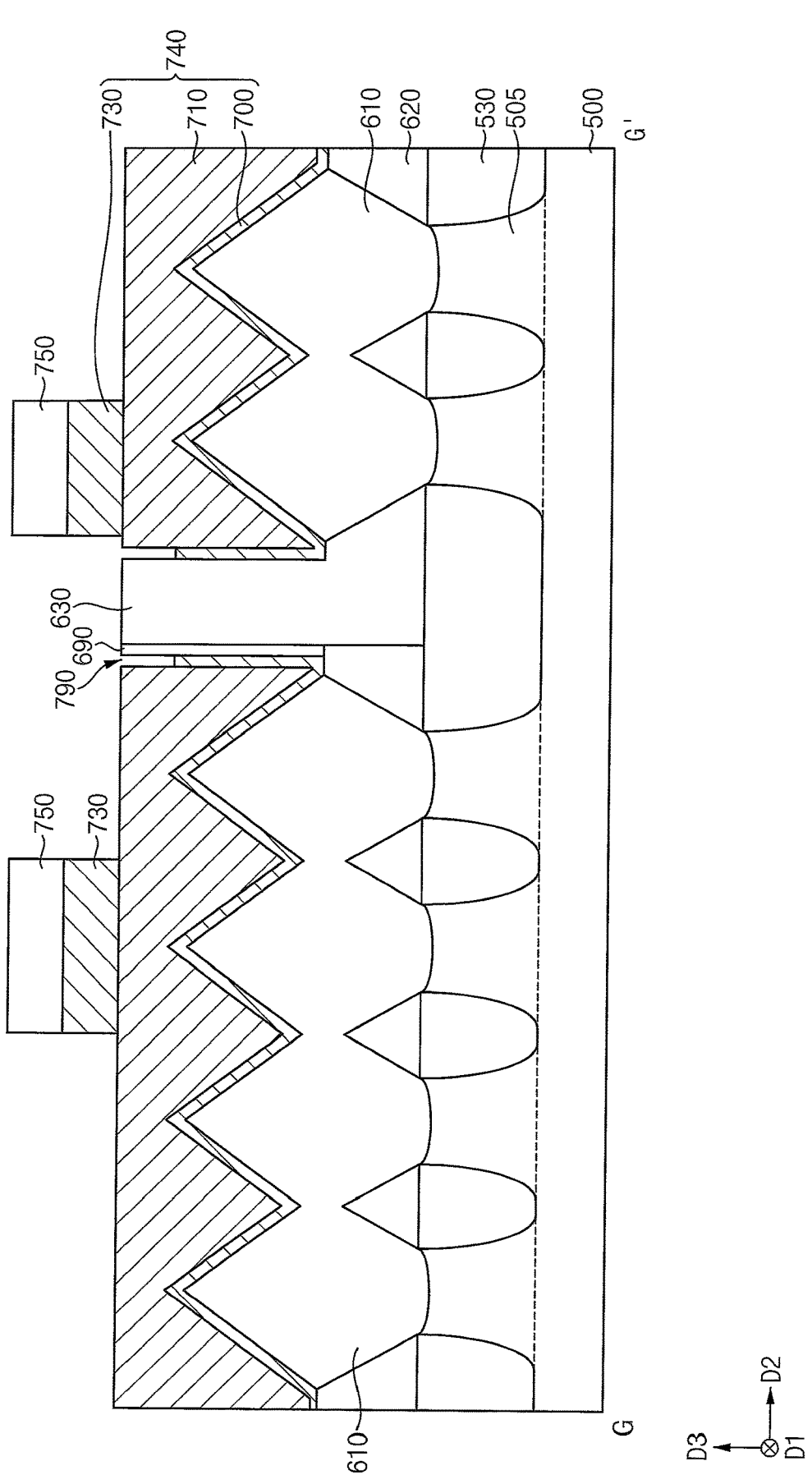

Referring to FIGS. 58 to 60, processes substantially the same as or similar to those illustrated with reference to FIGS. 24 to 28 may be performed.

Thus, an upper portion of the fifth conductive pattern 710 may be removed to form a sixth recess, an upper portion of the third barrier pattern 700 may be removed to form a seventh recess 770 (refer to FIG. 63), and a sixth conductive pattern 730 may be formed to fill the sixth and seventh recesses.

Thus, the fifth and sixth conductive patterns 710 and 730 and the third barrier pattern 700 may form a fourth contact plug structure 740.

Referring to FIGS. 61 to 64, processes substantially the same as or similar to those illustrated with reference to FIGS. 29 to 32 may be performed.

Thus, a fifth etching mask 750 may be formed to partially cover the third gate structure 680 and the fourth contact plug structure 740, and the third gate structure 680 and the fourth contact plug structure 740 may be etched using the fifth etching mask 750.

The fifth etching mask 750 may also cover portions of the second gate spacer 585, the second plug spacer 690 and the second division pattern 630 adjacent to the third gate structure 680 and the fourth contact plug structure 740.

In example embodiments, the etching process may not be performed using an etching gas or etching solution having high etching selectivity between an insulating material and a conductive material, and thus not only the third gate electrode 670 and the fourth contact plug structure 740 including conductive materials, but also the second gate spacer 585, the second plug spacer 690, the second division pattern 630 and the third gate insulation pattern 660 including insulating materials may be etched.

By the etching process, the sixth conductive pattern 730 included in the fourth contact plug structure 740 may be removed to expose an upper surface of the fifth conductive pattern 710, and an upper portion of the third gate electrode 670 may be removed so that an upper surface of the third gate electrode 670 may be substantially coplanar with an upper surface of the fifth conductive pattern 710.

By the etching process, upper portions of the second gate spacer 585, the second plug spacer 690, the second division pattern 630 and the third gate insulation pattern 660 including insulating materials may also be etched so that upper surfaces of the second gate spacer 585, the second plug spacer 690, the second division pattern 630 and the third gate insulation pattern 660 may be substantially coplanar with the upper surface of the fifth conductive pattern 710.

Thus, a portion of the fourth contact plug structure 740 not covered by the fifth etching mask 750 may be transformed into a third contact plug structure 720 including the fifth conductive pattern 710 and the third barrier pattern 700, and the seventh recess 770 may be formed again. Additionally, a portion of the third gate structure 680 not covered by the fifth etching mask 750 may be transformed into a fourth gate structure 685 including a fourth gate electrode 675 and a fourth gate insulation pattern 665.

The fourth gate insulation pattern 665 may be further etched to form an eighth recess 790, and thus an upper surface of the fourth gate insulation pattern 665 may be lower than an upper surface of the fourth gate electrode 675.

Referring to FIGS. 33 to 36, processes substantially the same as or similar to those illustrated with reference to FIGS. 1 to 4 may be performed.

Thus, after removing the fifth etching mask 750, sixth and seventh insulating interlayers 800 and 810 may be formed, and a fourth wiring 822 extending through the seventh insulating interlayer 810 to contact an upper surface of the third gate structure 680, and fifth and sixth wirings 824 and 826 extending through the seventh insulating interlayer 810 to contact an upper surface of the fourth contact plug structure 740 may be formed.

In an example embodiment, each of the fourth and fifth wirings 822 and 824 may extend in the second direction D2, and the sixth wiring 826 may extend in the first direction D1.

By the above processes, the semiconductor device may be manufactured.

The semiconductor device may be used in various types of memory devices and/or systems including contact plugs. For example, the semiconductor device may be applied to a logic device such as a central processing unit (CPU), an application processor (AP), etc. In an embodiment, the semiconductor device may be applied to a volatile memory device such as a dynamic random access memory (DRAM) device, a static random access memory (SRAM) device, etc., or to a non-volatile memory device such as a flash memory device, a phase-change random access memory (PRAM) device, a magnetoresistive random access memory (MRAM) device, a resistive random access memory (RRAM) device, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
first and second gate structures on a substrate;
first and second source/drain layers on portions of the substrate adjacent to the first and second gate structures, respectively;
first and second contact plug structures on the first and second source/drain layers, respectively; and
a first wiring contacting an upper surface of the first gate structure,
wherein the first gate structure includes:
a first gate electrode; and a first gate insulation pattern on a lower surface and a sidewall of the first gate electrode,
wherein the second gate structure includes:
a second gate electrode; and
a second gate insulation pattern on a lower surface and a sidewall of the second gate electrode, and
wherein the second gate electrode has a smaller vertical dimension than the first gate electrode.

2. The semiconductor device as claimed in claim 1, wherein an uppermost surface of the second gate insulation pattern is lower than an upper surface of the second gate electrode.

3. The semiconductor device as claimed in claim 1, wherein an uppermost surface of the first gate insulation pattern is substantially coplanar with an upper surface of the first gate electrode.

4. The semiconductor device as claimed in claim 1, further comprising:
a gate spacer on a sidewall of the second gate structure,
wherein an uppermost surface of the gate spacer is substantially coplanar with an upper surface of the second gate electrode.

5. The semiconductor device as claimed in claim 1, wherein the second contact plug structure includes:
a first conductive pattern including a first metal; and
a first barrier pattern on a lower surface and a sidewall of the first conductive pattern, and
wherein an uppermost surface of the first barrier pattern is lower than an upper surface of the first conductive pattern.

6. The semiconductor device as claimed in claim 5, further comprising:
a plug spacer on a sidewall of the second contact plug structure,
wherein an uppermost surface of the plug spacer is substantially coplanar with the upper surface of the first conductive pattern.

7. The semiconductor device as claimed in claim 5, wherein the first contact plug structure includes:
a second conductive pattern including the first metal;
a second barrier pattern on a lower surface and a sidewall of the second conductive pattern; and
a third conductive pattern contacting an upper surface of the second conductive pattern and an upper surface of the second barrier pattern, the third conductive pattern including a second metal different from the first metal, and
wherein an uppermost surface of the second barrier pattern is lower than the upper surface of the second conductive pattern.

8. The semiconductor device as claimed in claim 7, wherein the upper surface of the first conductive pattern is lower than the upper surface of the second conductive pattern.

9. The semiconductor device as claimed in claim 7, further comprising:
a second wiring contacting an upper surface of the first contact plug structure.

10. The semiconductor device as claimed in claim 1, further comprising:
an isolation pattern covering a lower sidewall of an active pattern provided at an upper surface of the substrate, wherein the active pattern extends in a first direction substantially parallel to the upper surface of the substrate and protrudes past the upper surface of the substrate in a third direction substantially perpendicular to the upper surface of the substrate, wherein each of the first and second gate structures is disposed on the active pattern and the isolation pattern.

11. The semiconductor device as claimed in claim 10, wherein:

the active pattern is one of a plurality of active patterns spaced apart from each other in a second direction substantially parallel to the upper surface of the substrate and crossing the first direction, the second gate structure extends in the second direction and is divided, in the second direction, into individual gate structures by a division pattern, the second gate insulation pattern is disposed on surfaces of the plurality of active patterns, an upper surface of the isolation pattern and a sidewall of the division pattern, the second gate electrode is disposed on the second gate insulation pattern, and an uppermost surface of the second gate insulation pattern is lower than an upper surface of the division pattern.

12. The semiconductor device as claimed in claim 10, wherein:

the active pattern is one of a plurality of active patterns spaced apart from each other in a second direction substantially parallel to the upper surface of the substrate and crossing the first direction, the second source/drain layer is one of a plurality of second source/drain layers, each second source/drain layer of the plurality of second source/drain layers is disposed on a corresponding active pattern of the plurality of active patterns, the semiconductor device further comprises a division pattern between neighboring second source/drain layers, in the second direction, of the plurality of second source/drain layers, the second contact plug structure on the second source/drain layers includes:

a conductive pattern including metal; and a barrier pattern on a lower surface and a sidewall of the conductive pattern, and an uppermost surface of the barrier pattern is lower than an upper surface of the division pattern.

13. The semiconductor device as claimed in claim 10, further comprising:

a plurality of first channels spaced apart from each other in the third direction on the active pattern, each first channel of the plurality of first channels extending in the first direction; and a plurality of second channels spaced apart from each other in the third direction on the active pattern, each second channel of the plurality of second channels extending in the first direction, wherein the first gate structure covers lower and upper surfaces and each of opposite sidewalls in a second direction of each first channel of the plurality of first channels, the second direction substantially parallel to the upper surface of the substrate and crossing the first direction, and wherein the second gate structure covers lower and upper surfaces and each of opposite sidewalls in the second direction of each second channel of the plurality of second channels.

14. A semiconductor device, comprising:

a gate structure on a substrate;

first and second source/drain layers on portions of the substrate adjacent to the gate structure;

first and second contact plug structures directly on the first and second source/drain layers, respectively;

a first wiring contacting an upper surface of the first contact plug structure; and an insulation pattern contacting an uppermost surface of the second contact plug structure, wherein the uppermost surface of the second contact plug structure is lower than an uppermost surface of the first contact plug structure.

15. The semiconductor device as claimed in claim 14, wherein the first contact plug structure includes:

a first conductive pattern including a first metal;

a first barrier pattern on a lower surface and a sidewall of the first conductive pattern; and a second conductive pattern contacting an upper surface of the first conductive pattern and an upper surface of the first barrier pattern, wherein the second contact plug structure includes:

a third conductive pattern including the first metal; and a second barrier pattern on a lower surface and a sidewall of the third conductive pattern, wherein an uppermost surface of the first barrier pattern is lower than an upper surface of the first conductive pattern, and wherein an uppermost surface of the second barrier pattern is lower than an upper surface of the third conductive pattern.

16. The semiconductor device as claimed in claim 15, wherein the upper surface of the third conductive pattern is lower than the upper surface of the first conductive pattern.

17. The semiconductor device as claimed in claim 15, further comprising:

a plug spacer on a sidewall of the second contact plug structure, wherein an uppermost surface of the plug spacer is substantially coplanar with the upper surface of the third conductive pattern.

18. A semiconductor device, comprising:

first and second gate structures on a substrate;

first and second source/drain layers on portions of the substrate adjacent to the first and second gate structures, respectively;

first and second contact plug structures on the first and second source/drain layers, respectively;

a first wiring contacting an upper surface of the first gate structure;

a second wiring contacting an upper surface of the first contact plug structure; and an insulation pattern contacting an upper surface of the second gate structure and an upper surface of the second contact plug structure, wherein the upper surface of the second gate structure is lower than the upper surface of the first gate structure, and wherein the upper surface of the second contact plug structure is lower than the upper surface of the first contact plug structure.

19. The semiconductor device as claimed in claim 18, further comprising:

a gate spacer on a sidewall of the second gate structure, wherein the second gate structure includes:

a gate electrode; and a gate insulation pattern on a lower surface and a sidewall of the gate electrode, and wherein an uppermost surface of the gate spacer is higher than an upper surface of the gate insulation pattern.

20. The semiconductor device as claimed in claim 18, further comprising:

a plug spacer on a sidewall of the second contact plug structure, wherein the second contact plug structure includes:

a conductive pattern including metal; and a barrier pattern on a lower surface and a sidewall of the conductive pattern, and wherein an uppermost surface of the plug spacer is higher than an upper surface of the barrier pattern.

* * * * *